US012704782B2

(12) United States Patent
Uemura et al.

(10) Patent No.: US 12,704,782 B2
(45) Date of Patent: Aug. 11, 2026

(54) ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD FOR MANUFACTURING ELECTRONIC DEVICE, AND COMPOUND

(71) Applicant: FUJIFILM Corporation, Tokyo (JP)

(72) Inventors: Minoru Uemura, Haibara-gun (JP); Takeshi Kawabata, Haibara-gun (JP); Toshiaki Fukuhara, Haibara-gun (JP); Akinori Shibuya, Haibara-gun (JP); Kei Yamamoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 636 days.

(21) Appl. No.: 18/158,892

(22) Filed: Jan. 24, 2023

(65) Prior Publication Data

US 2023/0161249 A1 May 25, 2023

Related U.S. Application Data

(63) Continuation of application No. PCT/JP2021/027053, filed on Jul. 19, 2021.

(30) Foreign Application Priority Data

Jul. 27, 2020 (JP) ................................ 2020-126854

(51) Int. Cl.
*G03F 7/038* (2006.01)
*G03F 7/039* (2006.01)

(52) U.S. Cl.
CPC .............. *G03F 7/038* (2013.01); *G03F 7/039* (2013.01)

(58) Field of Classification Search
None
See application file for complete search history.

(56) References Cited

U.S. PATENT DOCUMENTS

| | | | | |
|---|---|---|---|---|
| 8,580,486 | B2 | 11/2013 | Nagamori et al. | |
| 9,052,590 | B2 | 6/2015 | Takahashi et al. | |
| 2003/0192859 | A1* | 10/2003 | Uematsu | H10D 30/0321 216/13 |
| 2007/0065752 | A1 | 3/2007 | Yamamoto et al. | |
| 2007/0087288 | A1* | 4/2007 | Nishiyama | G03F 7/0046 430/270.1 |
| 2011/0070544 | A1 | 3/2011 | Nagamori et al. | |
| 2012/0156618 | A1 | 6/2012 | Takahashi et al. | |
| 2015/0331314 | A1* | 11/2015 | Yamaguchi | G03F 7/0397 430/311 |
| 2021/0364917 | A1 | 11/2021 | Uemura et al. | |

FOREIGN PATENT DOCUMENTS

| | | | | |
|---|---|---|---|---|
| CN | 101970400 | A | 9/2011 | |
| JP | 2007-86166 | A | 4/2007 | |
| JP | 2009-242391 | A | 10/2009 | |
| JP | 2010-77103 | A | 4/2010 | |
| JP | 2010-138158 | A | 6/2010 | |
| JP | 2011-53364 | A | 3/2011 | |
| JP | 2014149409 | A * | 8/2014 | G03F 7/0397 |
| KR | 10-2010-0126802 | A | 12/2010 | |
| KR | 10-2012-0083296 | A | 7/2012 | |
| TW | 200725181 | A | 7/2007 | |
| TW | 201730674 | A | 9/2017 | |
| WO | 2015/174215 | A1 | 11/2015 | |
| WO | 2020/158337 | A1 | 8/2020 | |

OTHER PUBLICATIONS

Machine translation of JP2010-138518 A, published on Jun. 24, 2010 (Year: 2010).*

Office Action issued Sep. 27, 2024 by the Korean Intellectual Property Office in Korean Patent Application No. 10-2023-7000659.

Office Action issued Jan. 23, 2024 by the Japanese Patent Office in Japanese Patent Application No. 2022-540210.

Murmann, Patrick et al., "Electrochemical and Thermal Investigations and Al Current Collector Dissolution Studies of Three Di-Lithium Salts in Comparison to LiPF6 Containing Electrolytes", Journal of The Electrochemical Society, Jan. 28, 2013, vol. 160, No. 4, pp. A535-A541.

International Search Report (PCT/ISA/210) issued Sep. 21, 2021 by the International Searching Authority in counterpart International Patent Application No. PCT/JP2021/027053.

Written Opinion (PCT/ISA/237) issued Sep. 21, 2021 by the International Searching Authority in counterpart International Patent Application No. PCT/JP2021/027053.

Office Action dated Nov. 4, 2024, issued by Taiwanese Patent Office in counterpart Taiwanese Patent Application No. 110127327.

* cited by examiner

*Primary Examiner* — Anca Eoff
(74) *Attorney, Agent, or Firm* — Sughrue Mion, PLLC

(57) ABSTRACT

An actinic ray-sensitive or radiation-sensitive resin composition contains a compound represented by General Formula (I). In General Formula (I), $R_a$ and $R_b$ each independently represent a hydrogen atom or a substituent, provided that $R_a$ and $R_b$ satisfy the following requirement (1) or (2): (1) at least one of $R_a$ or $R_b$ represents a secondary alkyl group, a tertiary alkyl group, a cycloalkyl group, or a perfluoroalkyl group, and $R_a$ and $R_b$ may be bonded to each other to form a ring, and (2) $R_a$ and $R_b$ are bonded to each other to form a ring, $R_c$ represents a substituent, $L_0$ represents a single bond or a divalent linking group, $L_1$ represents a single bond or a divalent linking group, $L_2$ represents a single bond or a divalent linking group, $nM^+$ represents an organic cationic moiety, and n represents an integer of 1 or more.

12 Claims, No Drawings

ACTINIC RAY-SENSITIVE OR RADIATION-SENSITIVE RESIN COMPOSITION, ACTINIC RAY-SENSITIVE OR RADIATION-SENSITIVE FILM, PATTERN FORMING METHOD, METHOD FOR MANUFACTURING ELECTRONIC DEVICE, AND COMPOUND

CROSS REFERENCE TO RELATED APPLICATION

This is a continuation of International Application No. PCT/JP2021/027053 filed on Jul. 19, 2021, and claims priority from Japanese Patent Application No. 2020-126854 filed on Jul. 27, 2020, the entire disclosures of which are incorporated herein by reference.

BACKGROUND OF THE INVENTION

1. Field of the Invention

The present invention relates to an actinic ray-sensitive or radiation-sensitive resin composition, an actinic ray-sensitive or radiation-sensitive film, a pattern forming method, a method for manufacturing an electronic device, and a compound.

2. Description of the Related Art

Since the advent of a resist for KrF excimer laser (248 nm), a pattern forming method utilizing chemical amplification has been used in order to compensate for a decrease in sensitivity due to light absorption. For example, in a positive tone chemical amplification method, first, a photoacid generator included in the exposed portion decomposes upon irradiation with light to generate an acid. Then, in a post-exposure baking (PEB) step and the like, a solubility in a developer changes by, for example, changing an alkali-insoluble group contained in a resin included in an actinic ray-sensitive or radiation-sensitive resin composition to an alkali-soluble group by the catalytic action of an acid thus generated. Thereafter, development is performed using a basic aqueous solution, for example. As a result, the exposed portion is removed to obtain a desired pattern.

For miniaturization of semiconductor elements, the wavelength of an exposure light source has been shortened and a projection lens with a high numerical aperture (high NA) has been advanced, and currently, an exposure machine using an ArF excimer laser having a wavelength of 193 nm as a light source is under development.

Under these circumstances, various configurations have been proposed as actinic ray-sensitive or radiation-sensitive resin compositions.

For example, an actinic ray-sensitive or radiation-sensitive resin composition containing a photoacid generator and a resin is disclosed in WO2015/174215A.

SUMMARY OF THE INVENTION

In the background of improvement of pattern miniaturization, there is a demand for forming an ultrafine pattern with a resist composition even in a case where the resist composition is stored with a lapse of time.

It is desirable that the resist composition maintains the performance before and after storage with a lapse of time, but with regard to the roughness performance of a pattern formed from the resist composition, the present inventors have found that there is a tendency that the roughness performance of a pattern obtained from the resist composition after storage with a lapse of time is inferior to the roughness performance of a pattern obtained from the resist composition before storage, and there is room for further improvement.

Therefore, an object of the present invention is to provide an actinic ray-sensitive or radiation-sensitive resin composition by which a pattern having excellent roughness performance after a lapse of time can obtained.

In addition, another object of the present invention is to provide an actinic ray-sensitive or radiation-sensitive film, a pattern forming method, a method for manufacturing an electronic device, and a compound, each relating to the actinic ray-sensitive or radiation-sensitive resin composition.

The present inventors have conducted intensive studies to accomplish the objects, and as a result, they have found that the objects can be accomplished by the following configurations.

[1] An actinic ray-sensitive or radiation-sensitive resin composition comprising a compound represented by General Formula (I).

(I)

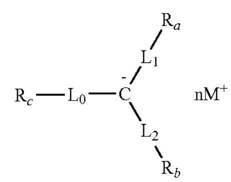

In General Formula (I), $R_a$ and $R_b$ each independently represent a hydrogen atom or a substituent.

It should be noted that $R_a$ and $R_b$ satisfy the following requirement (1) or (2).

(1) At least one of $R_a$ or $R_b$ represents a secondary alkyl group, a tertiary alkyl group, a cycloalkyl group, or a perfluoroalkyl group, and $R_a$ and $R_b$ may be bonded to each other to form a ring.

(2) $R_a$ and $R_b$ are bonded to each other to form a ring.

$R_c$ represents a substituent.

$L_0$ represents a single bond or a divalent linking group.

$L_1$ represents a single bond or a divalent linking group.

$L_2$ represents a single bond or a divalent linking group.

$nM^+$ represents an organic cationic moiety. n represents an integer of 1 or more.

[2] The actinic ray-sensitive or radiation-sensitive resin composition as described in [1], in which the compound represented by General Formula (I) is a compound represented by General Formula (I-1).

(I-1)

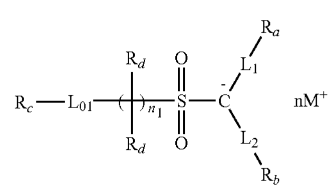

In General Formula (I-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$R_d$'s each independently represent a hydrogen atom, a fluorine atom, or an alkyl fluoride group.

$n_1$ represents an integer of 1 to 5.

$L_{01}$ represents a single bond or a divalent linking group.

[3] The actinic ray-sensitive or radiation-sensitive resin composition as described in [2], in which the compound represented by General Formula (I-1) has at least one fluorine atom.

[4] The actinic ray-sensitive or radiation-sensitive resin composition as described in [2] or [3], in which the compound represented by General Formula (I-1) is a compound represented by General Formula (I-1-1).

(I-1-1)

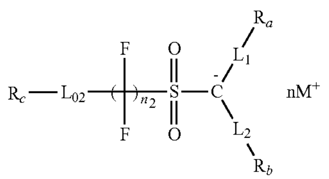

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

[5] The actinic ray-sensitive or radiation-sensitive resin composition as described in any one of [1] to [4], in which a carbon anion group represented by Formula (A) in a compound represented by General Formula (I), (I-1), or (I-1-1) is a group represented by any of General Formulae (a-1) to (a-9).

(A)

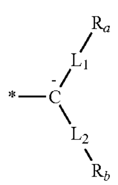

In Formula (A), * represents a bonding position.

(a-1)

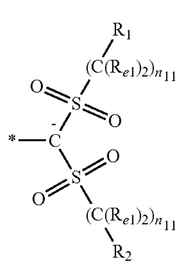

-continued (a-2)

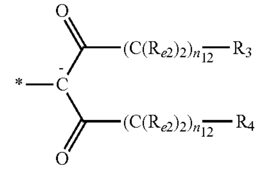

(a-3)

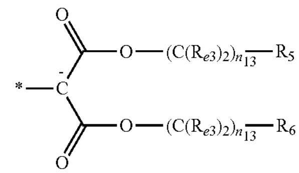

(a-4)

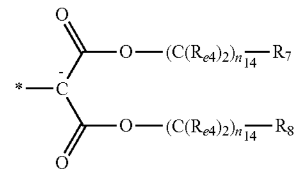

(a-5)

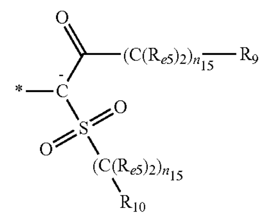

(a-6)

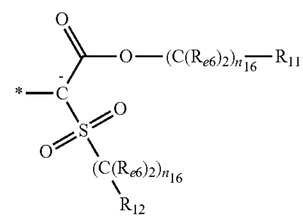

(a-7)

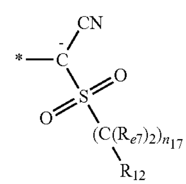

(a-8)

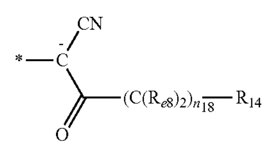

(a-9)

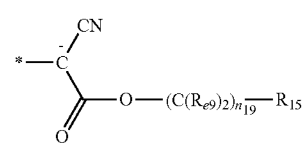

In General Formula (a-1), $R_1$ and $R_2$ each independently represent a hydrogen atom or a substituent.

It should be noted that $R_1$ and $R_2$ satisfy the following requirement (1A) or (1B).

(1A) At least one of $R_1$ or $R_2$ represents a secondary alkyl group, a tertiary alkyl group, a cycloalkyl group, or a perfluoroalkyl group, and $R_1$ and $R_2$ may be bonded to each other to form a ring.

(1B) $R_1$ and $R_2$ are bonded to each other to form a ring.

$R_{e1}$'s each independently represent a hydrogen atom, a fluorine atom, or an alkyl fluoride group.

$n_{11}$'s each independently represent 0, 1, or 2.

In General Formula (a-2), $R_3$ and $R_4$ each independently represent a hydrogen atom or a substituent.

It should be noted that $R_3$ and $R_4$ satisfy the following requirement (2A) or (2B).

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring.

(2B) $R_3$ and $R_4$ are bonded to each other to form a ring.

$R_{e2}$'s each independently represent a hydrogen atom, a fluorine atom, or an alkyl fluoride group.

$n_{12}$'s each independently represent 0, 1, or 2.

In General Formula (a-3), $R_5$ and $R_6$ each independently represent a hydrogen atom or a substituent.

It should be noted that $R_5$ and $R_6$ satisfy the following requirement (3A) or (3B).

(3A) At least one of $R_5$ or $R_6$ represents a secondary alkyl group, a tertiary alkyl group, a cycloalkyl group, or a perfluoroalkyl group, and $R_5$ and $R_6$ may be bonded to each other to form a ring.

(3B) $R_5$ and $R_6$ are bonded to each other to form a ring.

$R_{e3}$'s each independently represent a hydrogen atom, a fluorine atom, or an alkyl fluoride group.

$n_{13}$'s each independently represent 0, 1, or 2.

In General Formula (a-4), $R_7$ and $R_8$ each independently represent a hydrogen atom or a substituent.

It should be noted that $R_7$ and $R_8$ satisfy the following requirement (4A) or (4B).

(4A) At least one of $R_7$ or $R_8$ represents a secondary alkyl group, a tertiary alkyl group, a cycloalkyl group, or a perfluoroalkyl group, and $R_7$ and $R_5$ may be bonded to each other to form a ring.

(4B) $R_7$ and $R_8$ are bonded to each other to form a ring.

$R_{e4}$'s each independently represent a hydrogen atom, a fluorine atom, or an alkyl fluoride group.

$n_{14}$'s each independently represent 0, 1, or 2.

In General Formula (a-5), $R_9$ and $R_{10}$ each independently represent a hydrogen atom or a substituent.

It should be noted that $R_9$ and $R_{10}$ satisfy the following requirement (5A) or (5B).

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring.

(5B) $R_9$ and $R_{10}$ are bonded to each other to form a ring.

$R_{e5}$'s each independently represent a hydrogen atom, a fluorine atom, or an alkyl fluoride group.

$n_{15}$'s each independently represent 0, 1, or 2.

In General Formula (a-6), $R_{11}$ and $R_{12}$ each independently represent a hydrogen atom or a substituent.

It should be noted that $R_{11}$ and $R_{12}$ satisfy the following requirement (6A) or (6B).

(6A) At least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring.

(6B) $R_{11}$ and $R_{12}$ are bonded to each other to form a ring.

$R_{e6}$'s each independently represent a hydrogen atom, a fluorine atom, or an alkyl fluoride group.

$n_{16}$'s each independently represent 0, 1, or 2.

In General Formula (a-7), $R_{13}$ represents a secondary alkyl group, a tertiary alkyl group, a cycloalkyl group, or a perfluoroalkyl group.

$R_{e7}$'s each independently represent a hydrogen atom, a fluorine atom, or an alkyl fluoride group.

$n_{17}$ represents 0, 1, or 2.

In General Formula (a-8), $R_{14}$ represents a secondary alkyl group, a tertiary alkyl group, a cycloalkyl group, or a perfluoroalkyl group.

$R_{e8}$'s each independently represent a hydrogen atom, a fluorine atom, or an alkyl fluoride group.

$n_{18}$ represents 0, 1, or 2.

In General Formula (a-9), $R_{15}$ represents a secondary alkyl group, a tertiary alkyl group, a cycloalkyl group, or a perfluoroalkyl group.

$R_{e9}$'s each independently represent a hydrogen atom, a fluorine atom, or an alkyl fluoride group;

$n_{19}$ represents 0, 1, or 2.

In General Formulae (a-1) to (a-9),

* represents a bonding position.

It should be noted that in a case where the carbon anion group represented by Formula (A) in the compound represented by General Formula (I), General Formula (I-1), or General Formula (I-1-1) is a group represented by General Formula (B), in General Formula (I), a case where $L_0$ represents —$SO_2$— and $R_c$ represents a perfluoroalkyl group is excluded.

In General Formula (I-1) or General Formula (I-1-1), a case where $L_{01}$ or Lot is a single bond, and $R_c$ represents a perfluoroalkyl group or a fluorine atom is excluded.

(I-1-1)

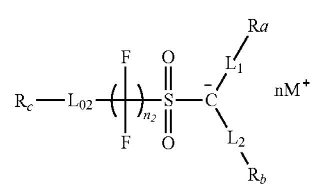

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

(B)

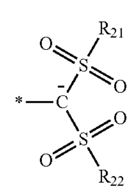

In General Formula (B), $R_{21}$ and $R_{22}$ each independently represent a perfluoroalkyl group.

[6] The actinic ray-sensitive or radiation-sensitive resin composition as described in [5], in which in General Formula (a-1), $n_{11}$'s each independently represent 0 or 1, in General Formula (a-2), $n_{12}$'s each independently represent 0 or 1, in General Formula (a-3), $n_{13}$'s each independently represent 0 or 1, in General Formula (a-4), $n_{14}$'s each independently represent 0 or 1, in General Formula (a-5), $n_{15}$'s each independently represent 0 or 1, in General Formula (a-6), $n_{16}$'s each independently represent 0 or 1, in General Formula (a-7), $n_{17}$'s each independently represent 0 or 1, in General Formula (a-8), $n_{18}$'s each independently represent 0 or 1, and in General Formula (a-9), $n_{19}$'s each independently represent 0 or 1.

[7] The actinic ray-sensitive or radiation-sensitive resin composition as described in [5] or [6], in which in (1A) in General Formula (a-1), $R_1$ and $R_2$ each independently represent a secondary alkyl group, a tertiary alkyl group, a cycloalkyl group, or a perfluoroalkyl group, and $R_1$ and $R_2$ may be bonded to each other to form a ring, in (2A) in General Formula (a-2), $R_3$ and $R_4$ each independently represent a secondary alkyl group, a tertiary alkyl group, a cycloalkyl group, or a perfluoroalkyl group, and $R_3$ and $R_4$ may be bonded to each other to form a ring, in (3A) in General Formula (a-3), $R_5$ and $R_6$ each independently represent a secondary alkyl group, a tertiary alkyl group, a cycloalkyl group, or a perfluoroalkyl group, and $R_5$ and $R_6$ may be bonded to each other to form a ring, in (4A) in General Formula (a-4), $R_7$ and $R_8$ each independently represent a secondary alkyl group, a tertiary alkyl group, a cycloalkyl group, or a perfluoroalkyl group, and $R_7$ and $R_8$ may be bonded to each other to form a ring, in (5A) in General Formula (a-5), $R_9$ and $R_{10}$ each independently represent a secondary alkyl group, a tertiary alkyl group, a cycloalkyl group, or a perfluoroalkyl group, and $R_9$ and $R_{10}$ may be bonded to each other to form a ring, and in (6A) in General Formula (a-6), $R_{11}$ and $R_{12}$ each independently represent a secondary alkyl group, a tertiary alkyl group, a cycloalkyl group, or a perfluoroalkyl group, and $R_{11}$ and $R_{12}$ may be bonded to each other to form a ring.

[8] The actinic ray-sensitive or radiation-sensitive resin composition as described in any one of [5] to [7], in which the carbon anion group represented by Formula (A) in the compound represented by General Formula (I), (I-1), or (I-1-1) is the group represented by any of General Formulae (a-1), (a-2), and (a-5) to (a-9).

[9] The actinic ray-sensitive or radiation-sensitive resin composition as described in any one of [5] to [8], in which the carbon anion group represented by Formula (A) in the compound represented by General Formula (I), (I-1), or (I-1-1) is the group represented by General Formula (a-1) or (a-2).

[10] The actinic ray-sensitive or radiation-sensitive resin composition as described in any one of [1] to [9], in which $R_c$ in a compound represented by General Formula (I), (I-1), or (I-1-1) represents an anion group.

It should be noted that in a case where a carbon anion group represented by Formula (A) in a compound represented by General Formula (I-1-1) is a group represented by General Formula (B), the anion group of $R_c$ is not a group represented by General Formula (a-x).

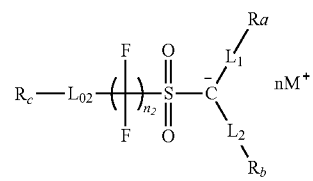

(I-1-1)

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

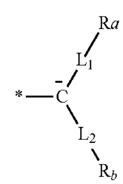

(A)

In Formula (A), * represents a bonding position.

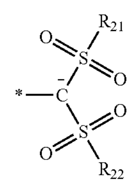

(B)

In General Formula (B), $R_{21}$ and $R_{22}$ each independently represent a perfluoroalkyl group.

* represents a bonding position.

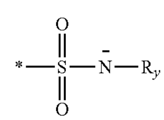

(a-x)

In General Formula (a-x), $R_y$ represents an alkyl group.

* represents a bonding position.

[11] The actinic ray-sensitive or radiation-sensitive resin composition as described in [10], in which the anion group of $R_c$ is a group represented by any of General Formulae (b-1) to (b-9).

(b-1)

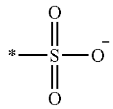

(b-2)

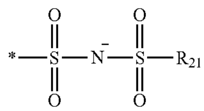

(b-3)

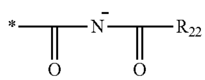

(b-4)

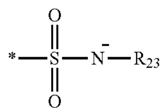

(b-5)

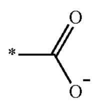

(b-6)

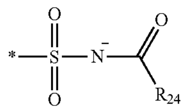

(b-7)

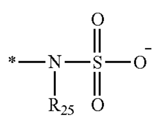

(b-8)

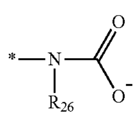

(b-9)

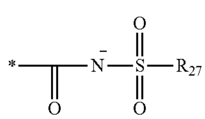

In General Formula (b-2), $R_{21}$ represents a substituent.

In General Formula (b-3), $R_{22}$ represents a substituent.

In General Formula (b-4), $R_{23}$ represents a substituent.

In General Formula (b-6), $R_{24}$ represents a substituent.

In General Formula (b-7), $R_{25}$ represents a substituent.

In General Formula (b-8), $R_{26}$ represents a substituent.

In General Formula (b-9), $R_{27}$ represents a substituent.

In General Formulae (b-1) to (b-9),

* represents a bonding position.

[12] The actinic ray-sensitive or radiation-sensitive resin composition as described in any one of [4] to [9], in which $R_c$ in the compound represented by General Formula (I-1-1) represents an alkyl group, a cycloalkyl group, an aryl group, or a fluorine atom.

[13] The actinic ray-sensitive or radiation-sensitive resin composition as described in any one of [4] to [12], in which $L_{02}$ in the compound represented by General Formula (I-1-1) represents a single bond, a cycloalkylene group, —COO—, —O—, —CO—, —S—, —SO—, —$SO_2$—, —CS—, —$NR_{31}$—, or a group consisting of a combination thereof.

$R_{31}$ represents a hydrogen atom or an alkyl group. $R_{31}$ and $R_c$ may be bonded to each other to form a ring.

[14] An actinic ray-sensitive or radiation-sensitive film formed of the actinic ray-sensitive or radiation-sensitive resin composition as described in any one of [1] to [13].

[15] A pattern forming method comprising:

a step of forming an actinic ray-sensitive or radiation-sensitive film on a support, using the actinic ray-sensitive or radiation-sensitive resin composition as described in any one of [1] to [13];

a step of exposing the actinic ray-sensitive or radiation-sensitive film; and a step of developing the exposed actinic ray-sensitive or radiation-sensitive film, using a developer.

[16] A method for manufacturing an electronic device, comprising the pattern forming method as described in [15].

[17] A compound represented by General Formula (IA), in which a carbon anion group represented by Formula (A) is a group represented by any of General Formulae (a-1), (a-2), and (a-5) to (a-9).

(IA)

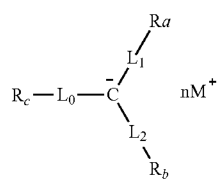

In General Formula (IA), $R_a$ and $R_b$ each independently represent a hydrogen atom or a substituent.

It should be noted that $R_a$ and $R_b$ satisfy the following requirement (1) or (2).

(1) At least one of $R_a$ or $R_b$ represents a secondary alkyl group, a tertiary alkyl group, a cycloalkyl group, or a perfluoroalkyl group, and $R_a$ and $R_b$ may be bonded to each other to form a ring.

(2) $R_a$ and $R_b$ are bonded to each other to form a ring.

$R_c$ represents a substituent.

$L_0$ represents a single bond or a divalent linking group.

$L_1$ represents a single bond or a divalent linking group.

$L_2$ represents a single bond or a divalent linking group.

$nM^+$ represents an organic cationic moiety. n represents an integer of 1 or more.

(A)

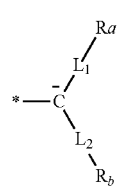

In Formula (A),

* represents a bonding position.

(a-1)

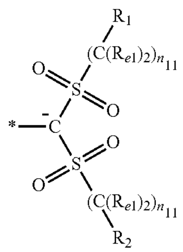

(a-2)

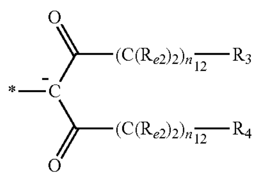

(a-5)

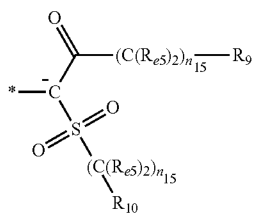

(a-6)

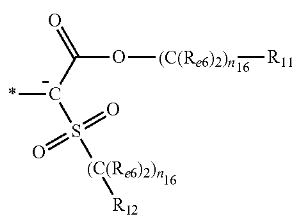

(a-7)

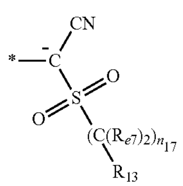

(a-8)

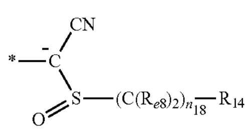

(a-9)

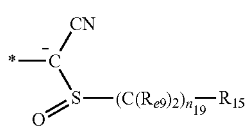

In General Formula (a-1), $R_1$ and $R_2$ each independently represent a hydrogen atom or a substituent.

It should be noted that $R_1$ and $R_2$ satisfy the following requirement (1A) or (1B).

(1A) At least one of $R_1$ or $R_2$ represents a secondary alkyl group, a tertiary alkyl group, a cycloalkyl group, or a perfluoroalkyl group, and $R_1$ and $R_2$ may be bonded to each other to form a ring.

(1B) $R_1$ and $R_2$ are bonded to each other to form a ring.

$R_{e1}$'s each independently represent a hydrogen atom, a fluorine atom, or an alkyl fluoride group.

$n_{11}$'s each independently represent 0, 1, or 2.

In General Formula (a-2), $R_3$ and $R_4$ each independently represent a hydrogen atom or a substituent.

It should be noted that $R_3$ and $R_4$ satisfy the following requirement (2A) or (2B).

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring.

(2B) $R_3$ and $R_4$ are bonded to each other to form a ring.

$R_{e2}$ 's each independently represent a hydrogen atom, a fluorine atom, or an alkyl fluoride group.

$n_{12}$'s each independently represent 0, 1, or 2.

In General Formula (a-5), $R_9$ and $R_{10}$ each independently represent a hydrogen atom or a substituent.

It should be noted that $R_9$ and $R_{10}$ satisfy the following requirement (5A) or (5B).

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring.

(5B) $R_9$ and $R_{10}$ are bonded to each other to form a ring.

$R_{e5}$'s each independently represent a hydrogen atom, a fluorine atom, or an alkyl fluoride group.

$n_{15}$'s each independently represent 0, 1, or 2.

In General Formula (a-6), $R_{11}$ and $R_{12}$ each independently represent a hydrogen atom or a substituent.

It should be noted that $R_{11}$ and $R_{12}$ satisfy the following requirement (6A) or (6B).

(6A) At least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring.

(6B) $R_{11}$ and $R_{12}$ are bonded to each other to form a ring.

$R_{e6}$'s each independently represent a hydrogen atom, a fluorine atom, or an alkyl fluoride group.

$n_{16}$'s each independently represent 0, 1, or 2.

In General Formula (a-7), $R_{13}$ represents a secondary alkyl group, a tertiary alkyl group, a cycloalkyl group, or a perfluoroalkyl group.

$R_{e7}$'s each independently represent a hydrogen atom, a fluorine atom, or an alkyl fluoride group.

$n_{17}$ represents 0, 1, or 2.

In General Formula (a-8), $R_{14}$ represents a secondary alkyl group, a tertiary alkyl group, a cycloalkyl group, or a perfluoroalkyl group.

$R_{e8}$'s each independently represent a hydrogen atom, a fluorine atom, or an alkyl fluoride group.

$n_{18}$ represents 0, 1, or 2.

In General Formula (a-9), $R_{15}$ represents a secondary alkyl group, a tertiary alkyl group, a cycloalkyl group, or a perfluoroalkyl group.

$R_{e9}$'s each independently represent a hydrogen atom, a fluorine atom, or an alkyl fluoride group.

$n_{19}$ represents 0, 1, or 2.

In General Formulae (a-1) to (a-9),

* represents a bonding position.

[18] The compound as described in [17], in which the compound is a compound represented by General Formula (IA-1).

(IA-1)

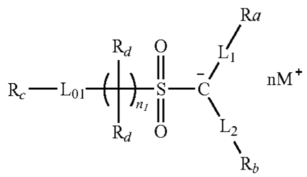

In General Formula (IA-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (IA), respectively.

$R_d$'s each independently represent a hydrogen atom, a fluorine atom, or an alkyl fluoride group.

$n_1$ represents an integer of 1 to 5.

$L_{01}$ represents a single bond or a divalent linking group.

[19] The compound as described in [17] or [18], in which the compound is a compound represented by General Formula (IA-1-1).

It should be noted that in a case where the carbon anion group represented by Formula (A) in the compound represented by General Formula (IA), General Formula (IA-1), or General Formula (IA-1-1) is a group represented by General Formula (B), in General Formula (IA), a case where $L_0$ represents —$SO_2$— and $R_c$ represents a perfluoroalkyl group is excluded.

In General Formula (IA-1) or General Formula (IA-1-1), a case where $L_{01}$ or $L_{02}$ is a single bond, and $R_c$ represents a perfluoroalkyl group or a fluorine atom is excluded.

(IA-1-1)

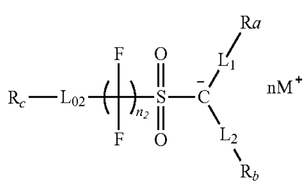

In General Formula (IA-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (IA), respectively.

$n_2$ represents an integer of 1 to 5.

$L_{02}$ represents a single bond or a divalent linking group.

(B)

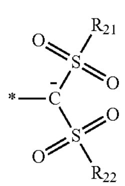

In General Formula (B), $R_{21}$ and $R_{22}$ each independently represent a perfluoroalkyl group.

[20] The compound as described in any one of [17] to [19], in which $R_c$ in the compound represents an anion group, and the anion group is a group represented by any of General Formulae (b-1) to (b-9).

It should be noted that in a case where the carbon anion group represented by Formula (A) in the compound represented by General Formula (IA-1-1) is a group represented by General Formula (B), the anionic group of $R_c$ is not a group represented by General Formula (a-x).

(b-1)

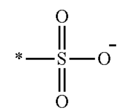

(b-2)

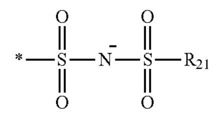

(b-3)

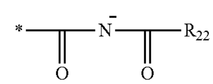

(b-4)

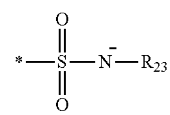

(b-5)

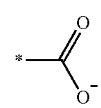

(b-6)

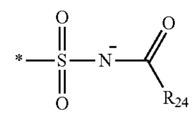

(b-7)

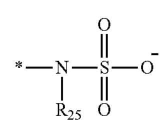

(b-8)

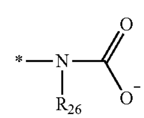

(b-9)

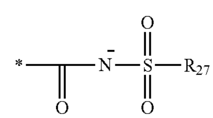

In General Formula (b-2), $R_{21}$ represents a substituent.

In General Formula (b-3), $R_{22}$ represents a substituent.

In General Formula (b-4), $R_{23}$ represents a substituent.

In General Formula (b-6), $R_{24}$ represents a substituent.

In General Formula (b-7), $R_{25}$ represents a substituent.

In General Formula (b-8), $R_{26}$ represents a substituent.

In General Formula (b-9), $R_{27}$ represents a substituent.

In General Formulae (b-1) to (b-9),

* represents a bonding position.

(IA-1-1)

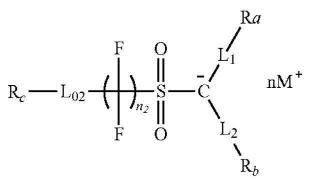

In General Formula (IA-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (IA), respectively.

$n_2$ represents an integer of 1 to 5.

$L_{02}$ represents a single bond or a divalent linking group.

(A)

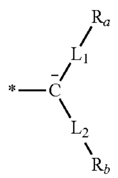

In Formula (A),

* represents a bonding position.

(B)

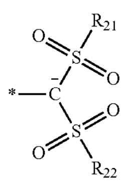

In General Formula (B), $R_{21}$ and $R_{22}$ each independently represent a perfluoroalkyl group.

* represents a bonding position.

(a-x)

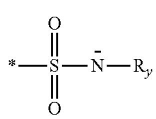

In General Formula (a-x), $R_y$ represents an alkyl group.

* represents a bonding position.

[21] The compound as described in any one of [17] to [19], in which $R_c$ in the compound represents an alkyl group, a cycloalkyl group, an aryl group, or a fluorine atom.

According to the present invention, it is possible to provide an actinic ray-sensitive or radiation-sensitive resin composition by which a pattern having excellent LWR performance after a lapse of time can be obtained.

In addition, according to the present invention, it is possible to provide an actinic ray-sensitive or radiation-sensitive film, a pattern forming method, a method for manufacturing an electronic device, and a compound, each relating to the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

In notations for a group (atomic group) in the present specification, in a case where the group is noted without specifying whether it is substituted or unsubstituted, the group includes both a group having no substituent and a group having a substituent as long as this does not impair the spirit of the present invention. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, the types of substituents, the positions of substituents, and the number of substituents in a case where it is described that "a substituent may be contained" are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; alkyl groups; cycloalkyl groups; aryl groups; heteroaryl groups; a hydroxyl group; a carboxy group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; a formyl group; and a combination thereof.

"Actinic rays" or "radiation" in the present specification means, for example, a bright line spectrum of a mercury lamp, far ultraviolet rays typified by an excimer laser, extreme ultraviolet rays (EUV light), X-rays, an electron beam (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups noted in the present specification is not limited unless otherwise specified. For example, in a case where Y is —COO— in a compound represented by General Formula "X—Y—Z", the compound may be either of "X—O—CO—Z" and "X—CO—O—Z".

In the present specification, (meth)acrylate represents acrylate and methacrylate, and (meth)acryl represents acryl and methacryl.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, the acid dissociation constant pKa (pKa) represents an acid dissociation constant pKa in an aqueous solution, and is defined, for example, in Chemical Handbook (II) (Revised 4th Edition, 1993, compiled by the Chemical Society of Japan, Maruzen Company, Ltd.). The lower the value of the acid dissociation constant pKa, the higher the acid strength. The value of the pKa is determined using the following software package 1 by computation from a value based on a Hammett substituent constant and the database of publicly known literature values. Any of the pKa values described in the present specification indicate values determined by computation using the software package.

Software Package 1: Advanced Chemistry Development (ACD/Labs) Software V 8.14 for Solaris (1994-2007 ACD/Labs).

In the present specification, examples of the halogen atom include a fluorine atom, a chlorine atom, a bromine atom, and an iodine atom.

In the present specification, in a case where a plurality of substances corresponding to each component are present in a composition, the amount of each component in the composition means a total amount of the plurality of the corresponding substances which are present in the composition unless otherwise specified.

In the present specification, a "total solid content" refers to the total mass of components excluding a solvent from the total composition of a composition. In addition, a "solid content" is a component excluding the solvent as mentioned above, and may be either a solid or a liquid at 25° C., for example.

In addition, in the present specification, a combination of two or more preferred aspects is a more preferable aspect.

[Actinic Ray-Sensitive or Radiation-Sensitive Resin Composition]

The actinic ray-sensitive or radiation-sensitive resin composition of an embodiment of the present invention (hereinafter also simply referred to as the "composition" or the "composition of the embodiment of the present invention") will be described.

The composition of the embodiment of the present invention is preferably a so-called resist composition, and may be either a positive tone resist composition or a negative tone resist composition. In addition, the resist composition may be either a resist composition for alkali development or a resist composition for organic solvent development.

It is preferable that the composition of the embodiment of the present invention is typically a chemically amplified resist composition.

The composition of the embodiment of the present invention is an actinic ray-sensitive or radiation-sensitive resin composition containing a compound represented by General Formula (I).

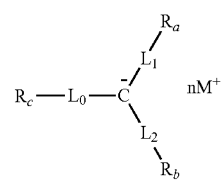

(I)

In General Formula (I), $R_a$ and $R_b$ each independently represent a hydrogen atom or a substituent.

It should be noted that $R_a$ and $R_b$ satisfy the following requirement (1) or (2).

(1) At least one of $R_a$ or $R_b$ represents a secondary alkyl group, a tertiary alkyl group, a cycloalkyl group, or a perfluoroalkyl group, and $R_a$ and $R_b$ may be bonded to each other to form a ring.

(2) $R_a$ and $R_b$ are bonded to each other to form a ring.

$R_c$ represents a substituent.

$L_0$ represents a single bond or a divalent linking group.

$L_1$ represents a single bond or a divalent linking group.

$L_2$ represents a single bond or a divalent linking group.

$nM^+$ represents an organic cationic moiety. n represents an integer of 1 or more.

According to the present invention, it is possible to achieve a pattern having excellent roughness performance after a lapse of time by adopting the configuration.

A reason therefor is not clear, but is presumed as follows.

First, the compound represented by General Formula (I) functions as a photoacid generator or an acid diffusion control agent as described in detail later, but has at least one of $R_a$ or $R_b$ represented by a specific group, or a ring formed by mutual bonding of $R_a$ and $R_b$, which can function as a steric hindrance in the vicinity of a methide anion by satisfying that "at least one of $R_a$ or $R_b$ represents a secondary alkyl group, a tertiary alkyl group, a cycloalkyl group, or a perfluoroalkyl group, and $R_a$ and $R_b$ may be bonded to each other to form a ring" or "$R_a$ and $R_b$ are bonded to each other to form a ring".

As a result, a group capable of functioning as a steric hindrance in the vicinity of a methide anion is present in the compound represented by General Formula (I). Therefore, the resin in the actinic ray-sensitive or radiation-sensitive resin composition is less likely to decompose by being attacked by the methide anion even in a case where the actinic ray-sensitive or radiation-sensitive resin composition is stored with a lapse of time, as compared with a compound not satisfying General Formula (I) (for example, at least one of $R_a$ or $R_b$ represents a linear alkyl group such as a methyl group).

As a result, it is considered that the structure of the compound represented by General Formula (I) is easily maintained without being modified in the actinic ray-sensitive or radiation-sensitive resin composition, and the structure of the resin included in the actinic ray-sensitive or radiation-sensitive resin composition is also easily maintained without being modified.

As a result, it is presumed that a pattern having excellent roughness performance after a lapse of time can be formed by the actinic ray-sensitive or radiation-sensitive resin composition of the embodiment of the present invention.

<Compound Represented by General Formula (I)>

The composition of the embodiment of the present invention contains the compound represented by General Formula (I) (hereinafter also referred to as a "specific compound" or a "compound P").

A substituent as each of $R_a$ and $R_b$ is not particularly limited, but examples thereof include an alkyl group, a cycloalkyl group, a perfluoroalkyl group, a cyano group, and a halogen atom.

The alkyl group is not particularly limited, but may be linear or branched, examples thereof include an alkyl group having 1 to 20 carbon atoms, and the alkyl group is preferably an alkyl group having 1 to 15 carbon atoms, and more preferably an alkyl group having 1 to 10 carbon atoms.

In addition, preferred examples of the branched alkyl group also include a secondary alkyl group and a tertiary alkyl group, which will be described below.

The cycloalkyl group may be either a monocycle or a polycycle, and is not particularly limited, but is preferably a cycloalkyl group having 3 to 20 carbon atoms. Specific examples of the cycloalkyl group include a cyclopropyl group, a cyclopentyl group, a cyclohexyl group, a cycloheptyl group, a cyclooctyl group, and a decahydronaphthalenyl group.

As the cycloalkyl group, a cycloalkyl group having 3 to 15 carbon atoms is more preferable, and a cycloalkyl group having 3 to 10 carbon atoms is still more preferable.

The alkyl group in the perfluoroalkyl group is not particularly limited, but may be linear or branched, examples thereof include an alkyl group having 1 to 15 carbon atoms, and the alkyl group is preferably an alkyl group having 1 to 10 carbon atoms, and more preferably an alkyl group having 1 to 5 carbon atoms.

Examples of the halogen atom include a fluorine atom, a chlorine atom, a bromine atom, and an iodine atom.

The alkyl group, the cycloalkyl group, or the perfluoroalkyl group may have a substituent. The substituent is not particularly limited, but examples thereof include the above-mentioned substituent T.

As mentioned above, $R_a$ and $R_b$ satisfy the requirement (1) or (2). The requirement of (1) is also referred to as the requirement (1), and the requirement of (2) is also referred to as the "requirement (2)". (Hereinafter, the same applies even in a case where the numbers of (1) and (2) are changed.)

The secondary alkyl group is not particularly limited, but examples thereof include a group represented by General Formula (11).

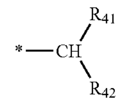

(11)

In General Formula (11), $R_{41}$ and $R_{42}$ each independently represent an alkyl group.

* represents a bonding position.

The alkyl group is not particularly limited, but may be linear or branched, examples thereof include an alkyl group having 1 to 15 carbon atoms, and the alkyl group is preferably an alkyl group having 1 to 12 carbon atoms, and more preferably an alkyl group having 1 to 10 carbon atoms.

The alkyl group may have a substituent. The substituent is not particularly limited, but examples thereof include the above-mentioned substituent T.

The tertiary alkyl group is not particularly limited, but examples thereof include a group represented by General Formula (12).

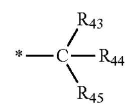

(12)

In General Formula (12), $R_{43}$, $R_{44}$, and $R_{45}$ each independently represent an alkyl group.

* represents a bonding position.

The alkyl group is not particularly limited, but may be linear or branched, examples thereof include an alkyl group having 1 to 15 carbon atoms, and the alkyl group is preferably an alkyl group having 1 to 12 carbon atoms, and more preferably an alkyl group having 1 to 10 carbon atoms.

The alkyl group may have a substituent. The substituent is not particularly limited, but examples thereof include the above-mentioned substituent T.

In the requirement (1), $R_a$ and $R_b$ may be bonded to each other to form a ring, and the formed ring may have a substituent.

In the requirement (2), $R_a$ and $R_b$ are bonded to each other to form a ring, and the formed ring may have a substituent. From the viewpoint of imparting an appropriate steric hindrance, the formed ring is preferably a 4- to 10-membered ring, and more preferably a 4- to 8-membered ring.

The substituent as $R_c$ is not particularly limited, but examples thereof include an alkyl group, a cycloalkyl group, an aryl group, a perfluoroalkyl group, a halogen atom, and an anion group as $R_c$.

The alkyl group is not particularly limited, but may be linear or branched, examples thereof include an alkyl group having 1 to 20 carbon atoms, and the alkyl group is preferably an alkyl group having 1 to 15 carbon atoms, and more preferably an alkyl group having 1 to 10 carbon atoms.

The cycloalkyl group may be either a monocycle or a polycycle, and is not particularly limited, but is preferably a cycloalkyl group having 3 to 20 carbon atoms. Specific examples of the cycloalkyl group include a cyclopropyl group, a cyclopentyl group, a cyclohexyl group, and a decahydronaphthalenyl group.

As the cycloalkyl group, a cycloalkyl group having 3 to 20 carbon atoms is more preferable, and a cycloalkyl group having 3 to 15 carbon atoms is still more preferable.

The aryl group is not particularly limited, but is preferably an aryl group having 6 to 20 carbon atoms, and specific examples thereof include a phenyl group, a naphthyl group, an anthryl group, a phenanthryl group, a pyrenyl group, a naphthacenyl group, and a fluorenyl group.

As the aryl group, an aryl group having 6 to 15 carbon atoms is more preferable, and an aryl group having 6 to 10 carbon atoms is still more preferable.

The alkyl group in the perfluoroalkyl group is not particularly limited, but may be linear or branched, examples thereof include an alkyl group having 1 to 15 carbon atoms, and the alkyl group is preferably an alkyl group having 1 to 10 carbon atoms, and more preferably an alkyl group having 1 to 5 carbon atoms.

Examples of the halogen atom include a fluorine atom, a chlorine atom, a bromine atom, and an iodine atom. Among those, the fluorine atom or the chlorine atom is preferable.

The anion group is not particularly limited as long as it is a group having an anion, but an acid anion is preferable. Examples of the anion group include a group having a methide anion (a group represented by Formula (A) which will be described later, in which $R_a$ and $R_b$ do not satisfy the requirements of (1) and (2)), and a group represented by any of General Formulae (b-1) to (b-9) which will be described later.

The alkyl group, the cycloalkyl group, the aryl group, the perfluoroalkyl group, and the anion group may have a substituent. The substituent is not particularly limited, but examples thereof include the above-mentioned substituent T.

The divalent linking group as $L_0$ is not particularly limited, examples thereof include an alkylene group, a cycloalkylene group, a heterocyclic group, an arylene group, —COO—, —O—, —CO—, —S—, —SO—, $—SO_2—$, —CS—, $—NR_{31}—$, —N═N—, or a group formed by combination of two or more kinds of these groups.

$R_{31}$ represents a hydrogen atom or an alkyl group. $R_{31}$ and $R_c$ may be bonded to each other to form a ring.

Furthermore, in a case where $R_c$ represents an anion group, the divalent linking group as $L_0$ may have an anion group (not corresponding to $R_c$). The anion group is not particularly limited, but examples thereof include a group represented by any of the following groups.

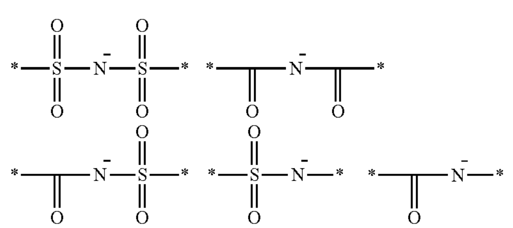

The number of anion groups in the divalent linking group as $L_0$ is not particularly limited, but is preferably 0 to 3, and more preferably 0 to 2. In a case where the divalent linking group as $L_0$ has a plurality of anion groups, the plurality of anion groups may be the same as or different from the each other.

The alkylene group as $L_0$ is not particularly limited, but may be linear or branched, examples thereof include an alkylene group having 1 to 15 carbon atoms, an alkylene group having 1 to 10 carbon atoms is preferable, and an alkylene group having 1 to 5 carbon atoms is more preferable.

The cycloalkylene group as $L_0$ may be either a monocycle or a polycycle, and is not particularly limited, but is preferably a cycloalkylene group having 3 to 20 carbon atoms, more preferably a cycloalkylene group having 3 to 15 carbon atoms, and still more preferably a cycloalkylene group having 3 to 10 carbon atoms.

The heterocyclic group as $L_0$ is not particularly limited, but is preferably a heterocyclic group including a nitrogen atom. Examples of the ring include a 3- to 10-membered ring, and the ring is preferably a 4- to 8-membered ring, and more preferably a 5- or 6-membered ring.

Specific examples of the heterocyclic ring constituting the heterocyclic group include piperidine, piperidone, pyrrolidine, and pyrrolidone.

The arylene group as $L_0$ is not particularly limited, but is preferably an arylene group having 6 to 20 carbon atoms, and more preferably an arylene group having 6 to 10 carbon atoms. Specific examples of the arylene group include a phenylene group.

The alkyl group as $R_{31}$ is not particularly limited, but may be linear or branched, examples thereof include an alkyl group having 1 to 20 carbon atoms, and the alkyl group is preferably an alkyl group having 1 to 15 carbon atoms, and more preferably an alkyl group having 1 to 10 carbon atoms.

The alkylene group, the cycloalkylene group, the heterocyclic group, the arylene group, and the alkyl group may have a substituent. The substituent is not particularly limited, but examples thereof include the above-mentioned substituent T, and a fluorine atom is preferable.

$R_{31}$ and $R_c$ may be bonded to each other to form a ring, and the formed ring may have a heteroatom (for example, an oxygen atom) as a ring member.

In the group formed by combination of two or more of the groups, two or more of each of an alkylene group, a cycloalkylene group, a heterocyclic group, an arylene group, —COO—, —O—, —CO—, —S—, —SO—, $—SO_2—$, —CS—, $—NR_{31}—$, or —N═N— may be present. For example, a group formed by combination of $—SO_2—$, an alkylene group, and $—SO_2—$ may be present.

The divalent linking group as $L_1$ and $L_2$ is not particularly limited, but examples thereof include an alkylene group, —COO—, —O—, —CO—, $—SO_2—$, or a group formed by combination of two or more kinds of these groups may be used.

$L_1$ and $L_2$ may be the same as or different from the each other.

The alkylene group is not particularly limited, but may be linear or branched, examples thereof include an alkylene group having 1 to 3 carbon atoms, an alkylene group having 1 or 2 carbon atoms is preferable, and an alkylene group having 1 carbon atom is more preferable.

Here, the valence of the anionic moiety of General Formula (I) is 1 or more. The upper limit value of the valence of the anionic moiety is not particularly limited, but is, for example, 5.

The valence of the anionic moiety is preferably an integer of 1 to 4. Specifically, in a case where $R_c$ in General Formula (I) represents a description other than an anion group, the valence of the anionic moiety of General Formula (I) is 1, and in a case where $R_c$ in General Formula (I) represents an anion group, the valence of the anionic moiety of General Formula (I) is preferably 2 to 4.

The same applies to General Formula (I-1) and General Formula (I-1-1) which will be described later.

In General Formula (I), $nM^+$ represents an organic cationic moiety.

The organic cationic moiety of General Formula (I), that is, n in $nM^+$ represents the valence of the cationic moiety of the compound represented by General Formula (I).

The valence of the anionic moiety and the valence of the cationic moiety are the same number.

The cationic moiety of General Formula (I) may be composed of n kinds of monovalent cations as long as it is n-valent, and may be composed of n-valent cations formed by the bonding of the n kinds of monovalent cations through a single bond or a linking group. For example, in a case where n is 2, $nM^+$ may be two monovalent cations or a divalent cation formed by the bonding of two monovalent cations through a single bond or a linking group. In any case, $nM^+$ as a whole may be n-valent.

n represents an integer of 1 or more. The upper limit value of n is not particularly limited, but is, for example, 5. n is preferably an integer of 1 to 4.

$nM^+$ is not particularly limited, but is preferably a cation represented by $(M^+)n$. That is, it is preferable to have n monovalent cations. At this time, a plurality of $M^+$ 's may be the same as or different from each other.

In addition, as another preferred aspect, it is also preferable that $nM^+$ is a divalent or higher-valent cation formed by the bonding of the plurality of M's through a single bond or a linking group.

The same applies to General Formula (I-1) and General Formula (I-1-1) which will be described later.

The cation as $M^+$ in $(M^+)n$ is not particularly limited as long as it is a monovalent or higher-cation, but is preferably an onium cation, and more preferably a cation represented by General Formula (ZIA) or General Formula (ZIIA).

(ZIA)

(ZIIA)

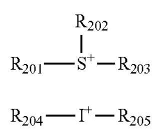

In General Formula (ZIA), $R_{201}$, $R_{202}$, and $R_{203}$ each independently represent a hydrogen atom or a substituent.

As the substituent as each of $R_{201}$, $R_{202}$, and $R_{203}$, an organic group is preferable, and the organic group generally has 1 to 30 carbon atoms, and preferably has 1 to 20 carbon atoms.

In addition, two of $R_{201}$ to $R_{203}$ may be bonded to each other to form a ring (also referred to as a ring structure), and the ring may include an oxygen atom, a sulfur atom, an ester bond, an amide bond, or a carbonyl group. Examples of the group formed by the mutual bonding of two of $R_{201}$ to $R_{203}$ include an alkylene group (for example, a butylene group and a pentylene group) and $—CH_2—CH_2—O—CH_2—CH_2—$.

Suitable aspects of the cation as General Formula (ZIA) include a cation (ZI-11), a cation (ZI-12), a cation represented by General Formula (ZI-13) (cation (ZI-13)), and a cation represented by General Formula (ZI-14) (cation (ZI-14)), each of which will be described later.

The divalent cation in a case where n is 2 may be a cation having two structures represented by General Formula (ZIA). Examples of such the cation include a divalent cation having a structure in which at least one of $R_{201}$, $R_{202}$, or $R_{203}$ of a cation represented by General Formula (ZIA) and at least one of Ran, $R_{202}$, or $R_{203}$ of another cation represented by General Formula (ZIA) are bonded through a single bond or a linking group.

First, the cation (ZI-11) will be described.

The cation (ZI-11) is a cation, that is, an arylsulfonium cation in which at least one of $R_{201}$, . . . , or $R_{203}$ of General Formula (ZIA) is an aryl group.

In the arylsulfonium cation, all of $R_{201}$ to $R_{203}$ may be aryl groups, or some of $R_{201}$ to $R_{203}$ may be an aryl group, and the rest may be an alkyl group or a cycloalkyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, a lactone ring group, or a phenylthio group as a substituent.

Examples of the lactone ring group include groups obtained by removing a hydrogen atom from a structure represented by any of General Formulae (LC1-1) to (LC1-22) which will be described later.

Next, the cation (ZI-12) will be described.

The cation (ZI-12) is a compound in which $R_{201}$ to $R_{203}$ in Formula (ZIA) each independently represent an organic group having no aromatic ring. Here, the aromatic ring also includes an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxyl group, a cyano group, or a nitro group.

Next, the cation (ZI-13) will be described.

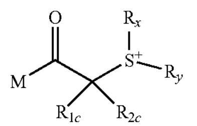

(ZI-13)

In General Formula (ZI-13), M represents an alkyl group, a cycloalkyl group, or an aryl group, and in a case where M has a ring structure, the ring structure may include at least one of an oxygen atom, a sulfur atom, an ester bond, an amide bond, or a carbon-carbon double bond. $R_{1c}$ and $R_{2c}$ each independently represent a hydrogen atom, an alkyl group, a cycloalkyl group, a halogen atom, a cyano group, or an aryl group. $R_{1c}$ and $R_{2c}$ may be bonded to each other to form a ring. $R_x$ and $R_y$ each independently represent an alkyl group, a cycloalkyl group, or an alkenyl group. $R_x$ and $R_y$ may be bonded to each other to form a ring. In addition, at least two selected from M, $R_{1c}$, or $R_{2c}$ may be bonded to each other to form a ring structure, and the ring structure may include a carbon-carbon double bond.

In General Formula (ZI-13), as the alkyl group and the cycloalkyl group represented by M, a linear alkyl group having 1 to 15 carbon atoms (preferably having 1 to 10 carbon atoms), a branched alkyl group having 3 to 15 carbon atoms (preferably having 3 to 10 carbon atoms), or a cycloalkyl group having 3 to 15 carbon atoms (preferably having 1 to 10 carbon atoms) is preferable, and specific examples thereof include a methyl group, an ethyl group, a propyl group, an n-butyl group, a sec-butyl group, a t-butyl group, a cyclopropyl group, a cyclobutyl group, a cyclohexyl group, and a norbornyl group.

The aryl group represented by M is preferably a phenyl group or a naphthyl group, and more preferably the phenyl group. The aryl group may be an aryl group which has a heterocyclic structure having an oxygen atom, a sulfur atom, or the like. Examples of the heterocyclic structure include a furan ring, a thiophene ring, a benzofuran ring, and a benzothiophene ring.

M may further have a substituent. In this aspect, examples of M include a benzyl group.

In addition, in a case where M has a ring structure, the ring structure may include at least one of an oxygen atom, a sulfur atom, an ester bond, an amide bond, or a carbon-carbon double bond.

Examples of the alkyl group, the cycloalkyl group, and the aryl group represented by each of $R_{1c}$ and $R_{2c}$ include the same ones as the groups as M mentioned above, and preferred aspects thereof are also the same. In addition, $R_{1c}$ and $R_{2c}$ may be bonded to each other to form a ring.

Examples of the halogen atom represented by each of $R_{1c}$ and $R_{2c}$ include a fluorine atom, a chlorine atom, a bromine atom, and an iodine atom.

Examples of the alkyl group and the cycloalkyl group represented by each of $R_x$ and $R_y$ include the same ones as the groups as M mentioned above, and preferred aspects thereof are also the same.

As the alkenyl group represented by each of $R_x$ and $R_y$, an allyl group or a vinyl group is preferable.

$R_x$ and $R_y$ may further have a substituent. In this aspect, examples of each of $R_x$ and $R_y$ include a 2-oxoalkyl group or an alkoxycarbonylalkyl group.

Examples of the 2-oxoalkyl group represented by each of $R_x$ and $R_y$ include those having 1 to 15 carbon atoms (preferably having 1 to 10 carbon atoms), and specifically a 2-oxopropyl group and a 2-oxobutyl group.

Examples of the alkoxycarbonylalkyl group represented by each of $R_x$ and $R_y$ include those having 1 to 15 carbon atoms (preferably having 1 to 10 carbon atoms). In addition, $R_x$ and $R_y$ may be bonded to each other to form a ring.

The ring structure formed by the mutual linkage of $R_x$ and $R_y$ may include an oxygen atom, a sulfur atom, an ester bond, an amide bond, or a carbon-carbon double bond.

In General Formula (ZI-13), M and $R_{1c}$ may be bonded to each other to form a ring structure, and the ring structure formed may include a carbon-carbon double bond.

Among those, the cation (ZI-13) is preferably a cation (ZI-13A).

The cation (ZI-13A) is a phenacylsulfonium cation represented by General Formula (ZI-13A).

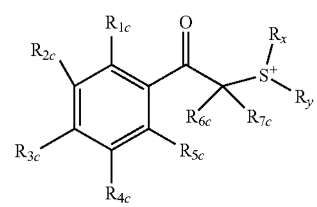

(ZI-13A)

In General Formula (ZI-13A), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ have the same definitions as $R_{1c}$ and $R_{2c}$ in General Formula (ZI-13) as mentioned above, respectively, and preferred aspects thereof are also the same.

$R_x$ and $R_y$ have the same definitions as $R_x$ and $R_y$, respectively, in General Formula (ZI-13) described above, and preferred aspects thereof are also the same.

Any two or more of $R_{1c}$, . . . , or $R_{5c}$, and $R_x$ and $R_y$ may be bonded to each other to form a ring structure, and the ring structure may each independently include an oxygen atom, a sulfur atom, an ester bond, an amide bond, or a carbon-carbon double bond. Furthermore, $R_{5c}$ and $R_{6c}$, or $R_{5c}$ and $R_x$ may be bonded to each other to form a ring structure, and the ring structure may each independently include a carbon-carbon double bond. In addition, $R_{6c}$ and $R_{7c}$ may be bonded to each other to form a ring structure.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Examples of the group formed by the bonding of any two or more of $R_{1c}$, . . . , or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

Next, the cation (ZI-14) will be described.

The cation (ZI-14) is represented by General Formula (ZI-14).

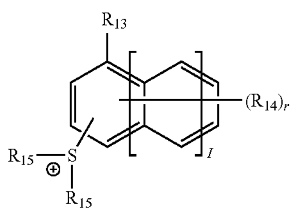

(ZI-14)

In General Formula (ZI-14), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton. These groups may have a substituent.

In a case where a plurality of $R_{14}$'s are present, $R_{14}$'s each independently represent an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure.

In General Formula (ZI-14), the alkyl group of each of $R_{13}$, $R_{14}$, and $R_{15}$ is linear or branched. The alkyl group preferably has 1 to 10 carbon atoms. As the alkyl group, a methyl group, an ethyl group, an n-butyl group, a t-butyl group, or the like is more preferable.

Next, General Formula (ZIIA) will be described.

In General Formula (ZIIA), $R_{204}$ and $R_{205}$ each independently represent an aryl group, an alkyl group, or a cycloalkyl group.

The aryl group of each of $R_{204}$ and $R_{205}$ is preferably a phenyl group or a naphthyl group, and more preferably the phenyl group. The aryl group of each of $R_{204}$ and $R_{205}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group of each of $R_{204}$ and $R_{205}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group of each of $R_{204}$ and $R_{205}$ may each independently have a substituent. Examples of the substituent which may be contained in the aryl group, the alkyl group, or the cycloalkyl group of each of $R_{204}$ and $R_{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, a lactone ring group, and a phenylthio group.

Examples of the lactone ring group include groups obtained by removing a hydrogen atom from a structure represented by any of General Formulae (LC1-1) to (LC1-22) which will be described later.

Preferred examples of the cations as $M^+$ in $(M^+)n$ are shown below, but the present invention is not limited thereto. Me represents a methyl group and Bu represents a butyl group.

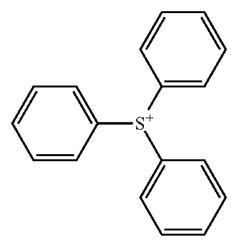

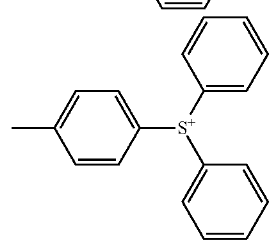

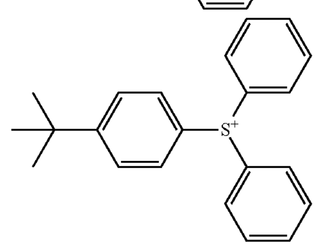

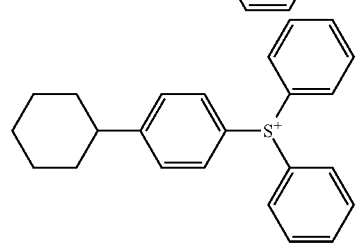

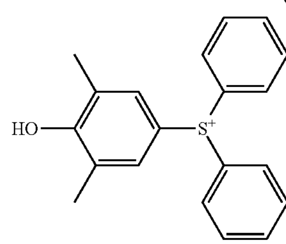

-continued
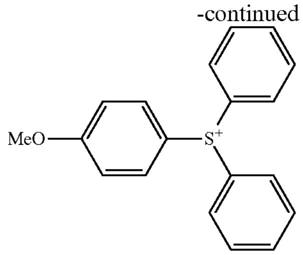
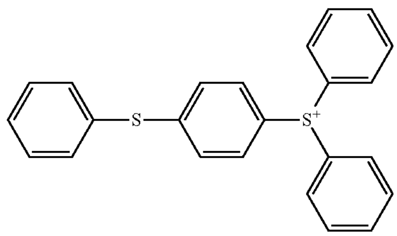
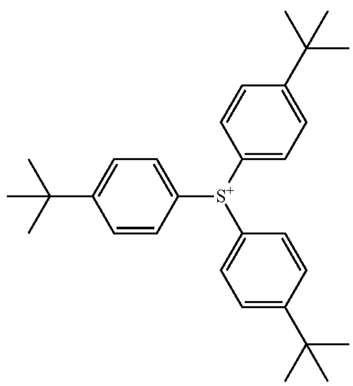
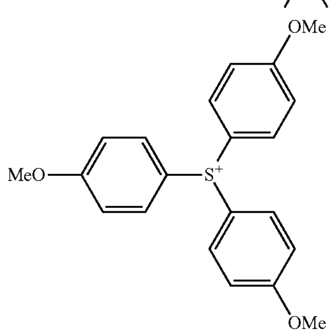
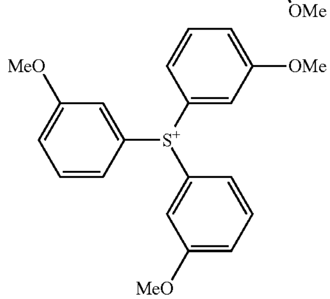
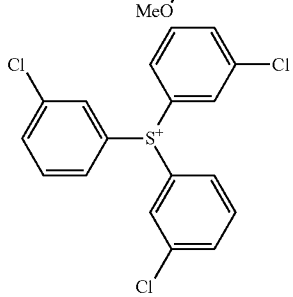
-continued
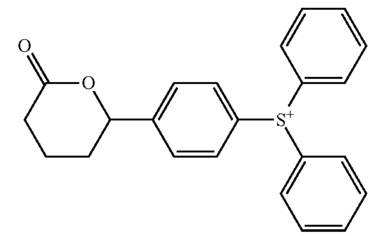
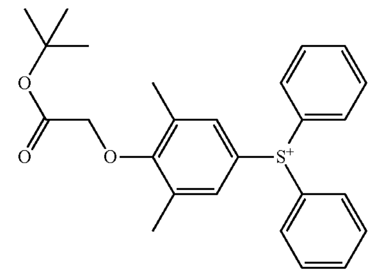
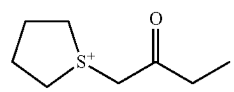
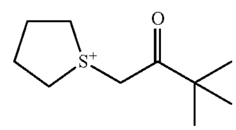
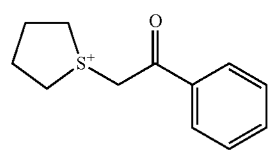
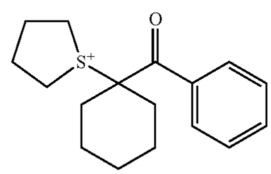
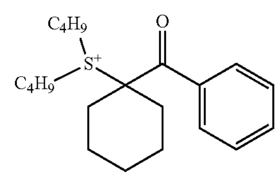
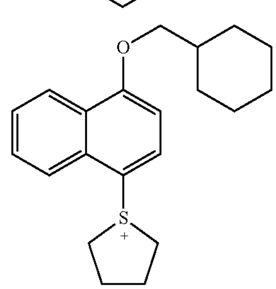
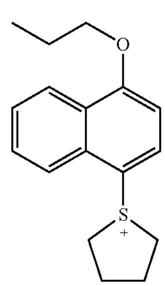
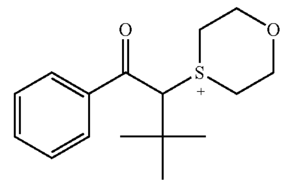

-continued
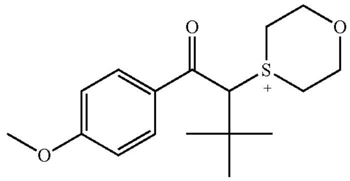
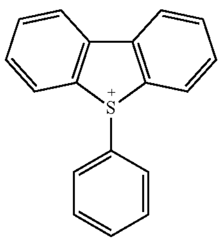
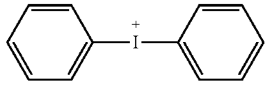
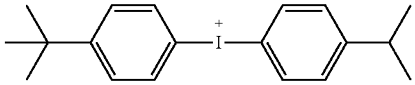
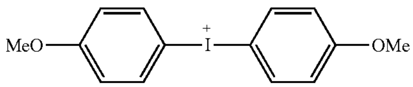
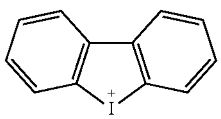
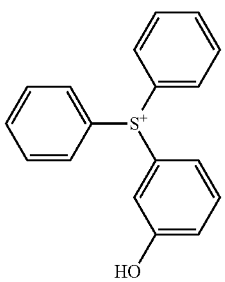
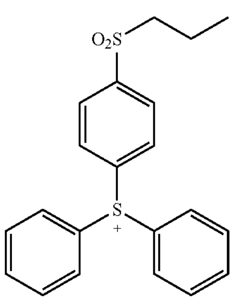
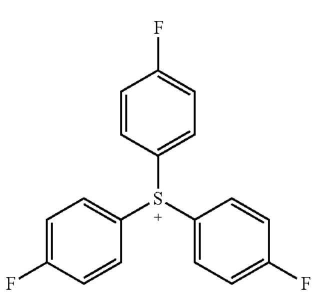
-continued
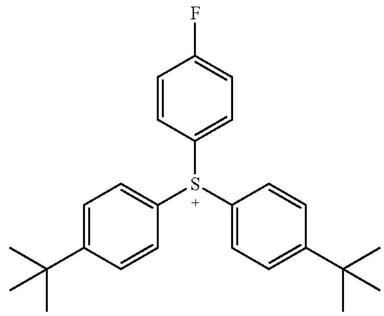
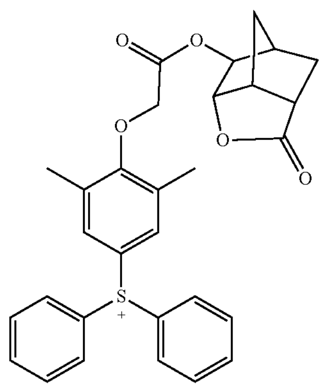
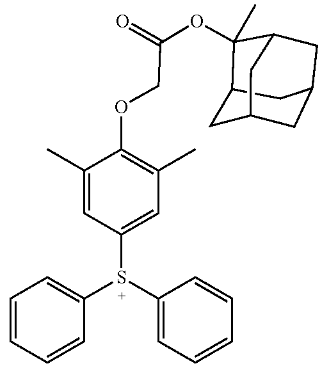
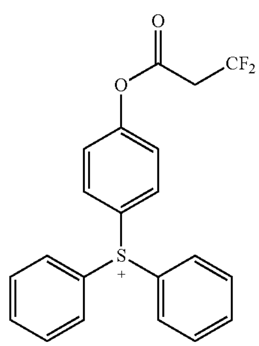
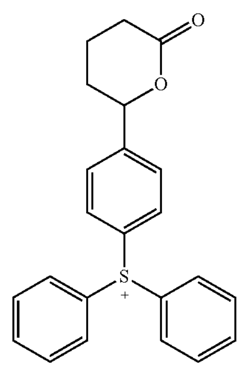
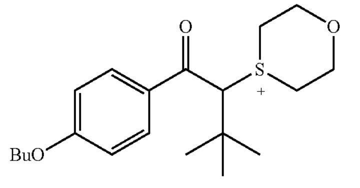

-continued
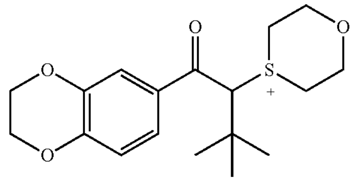
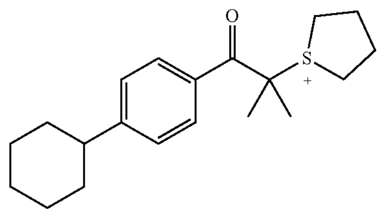
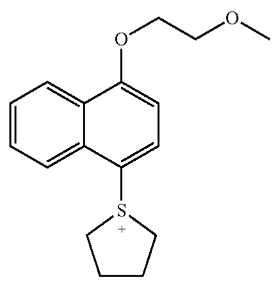
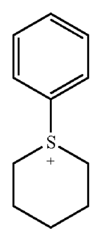
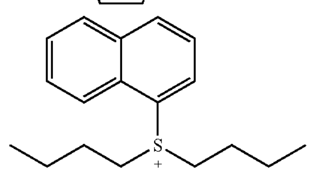
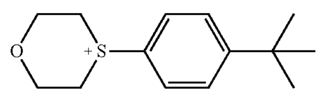
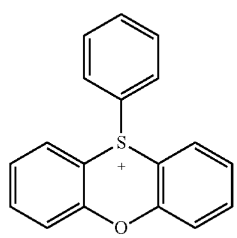
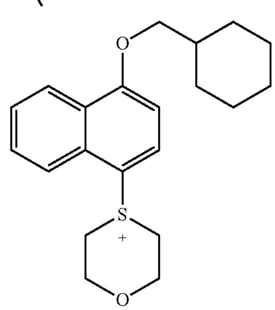
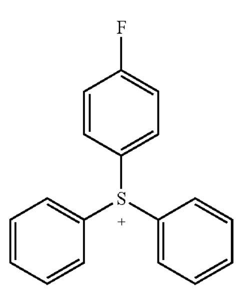
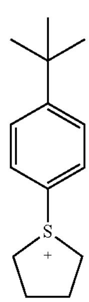
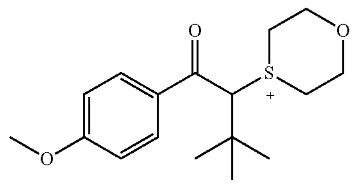
-continued
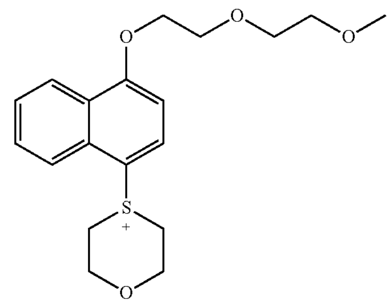
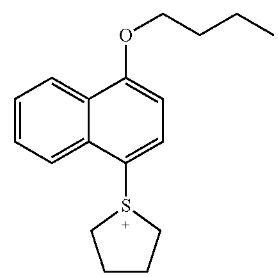
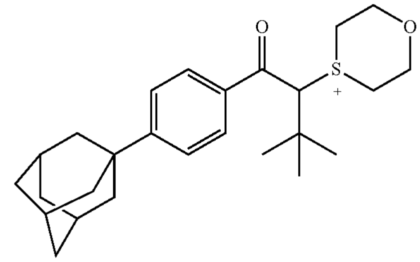
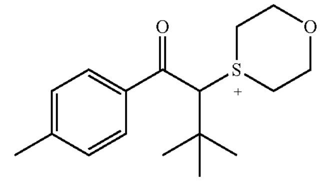
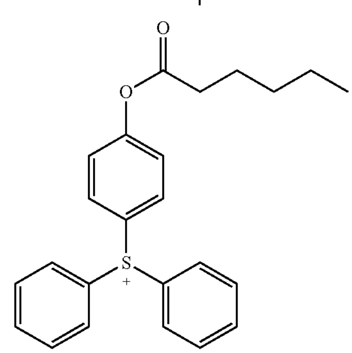
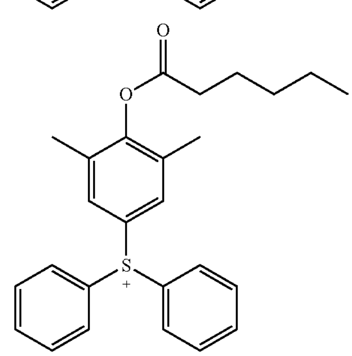

-continued

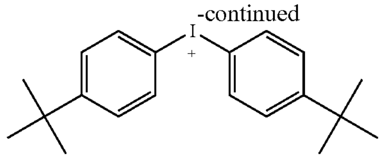

The compound represented by General Formula (I) is preferably a compound represented by General Formula (I-1).

(I-1)

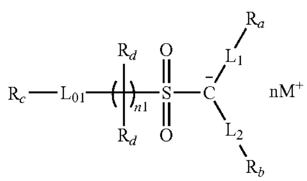

In General Formula (I-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$R_d$'s each independently represent a hydrogen atom, a fluorine atom, or an alkyl fluoride group.

$n_1$ represents an integer of 1 to 5.

$L_{01}$ represents a single bond or a divalent linking group.

The fact that $R_a$ and $R_b$ in General Formula (I-1) have the same definitions as $R_a$ and $R_b$ in General Formula (I), respectively, means that the proviso requirements in General Formula (I) are also satisfied.

The alkyl fluoride group of Rd is not particularly limited as long as it is an alkyl group having at least one fluorine atom, but the alkyl group in the alkyl fluoride group may be linear or branched, examples thereof include an alkyl group having 1 to 10 carbon atoms, and the alkyl group is preferably an alkyl group having 1 to 5 carbon atoms, and more preferably an alkyl group having 1 to 3 carbon atoms.

Specific examples of the alkyl fluoride group include a perfluoroalkyl group.

$n_1$ is preferably an integer of 1 to 3.

The divalent linking group as $L_{01}$ is not particularly limited, examples thereof include an alkylene group, a cycloalkylene group, a heterocyclic group, an arylene group, —COO—, —O—, —CO—, —S—, —SO—, —$SO_2$—, —CS—, —$NR_{31}$—, —N═N—, or a group formed by combination of two or more kinds of these groups.

$R_{31}$ represents a hydrogen atom or an alkyl group. $R_{31}$ and $R_c$ may be bonded to each other to form a ring.

Furthermore, in a case where $R_c$ represents an anion group, the divalent linking group as $L_{01}$ may have an anion group (not corresponding to $R_c$). The anion group is not particularly limited, but examples thereof include a group represented by any of the following groups.

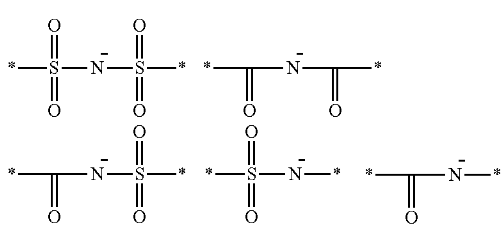

The number of anion groups in the divalent linking group as $L_{01}$ is not particularly limited, but is preferably 0 to 3, and more preferably 0 to 2. In a case where the divalent linking group as $L_{01}$ has a plurality of anion groups, the plurality of anion groups may be the same as or different from the each other.

The alkylene group as $L_{01}$ is not particularly limited, but may be linear or branched, examples thereof include an alkylene group having 1 to 15 carbon atoms, and the alkylene group is preferably an alkylene group having 1 to 10 carbon atoms, and more preferably an alkylene group having 1 to 5 carbon atoms.

The cycloalkylene group as $L_{01}$ may be either a monocycle or a polycycle, and is not particularly limited, but is preferably a cycloalkylene group having 3 to 20 carbon atoms, more preferably a cycloalkylene group having 3 to 15 carbon atoms, and still more preferably a cycloalkylene group having 3 to 10 carbon atoms.

The heterocyclic group as $L_{01}$ is not particularly limited, but is preferably a heterocyclic group including a nitrogen atom. Examples of the ring include a 3- to 10-membered ring, and the ring is preferably a 4- to 8-membered ring, and more preferably a 5- or 6-membered ring.

Specific examples of the heterocyclic ring constituting the heterocyclic group include piperidine, piperidone, pyrrolidine, and pyrrolidone.

The arylene group as $L_{01}$ is not particularly limited, but is preferably an arylene group having 6 to 20 carbon atoms, and more preferably an arylene group having 6 to 10 carbon atoms. Specific examples of the arylene group include a phenylene group.

The alkyl group as $R_{31}$ is not particularly limited, but may be linear or branched, examples thereof include an alkyl group having 1 to 20 carbon atoms, and the alkyl group is preferably an alkyl group having 1 to 15 carbon atoms, and more preferably an alkyl group having 1 to 10 carbon atoms.

The alkylene group, the cycloalkylene group, the heterocyclic group, the arylene group, and the alkyl group may have a substituent. The substituent is not particularly limited, but examples thereof include the above-mentioned substituent T.

$R_{31}$ and $R_c$ may be bonded to each other to form a ring, and the formed ring may have a heteroatom (for example, an oxygen atom) as a ring member.

In the group formed by combination of two or more of the groups, two or more of each of an alkylene group, a cycloalkylene group, a heterocyclic group, an arylene group, —COO—, —O—, —CO—, —S—, —SO—, —$SO_2$—, —CS—, —$NR_{31}$—, or —N═N— may be present. For example, a group formed by combination of —$SO_2$—, an alkylene group, and —$SO_2$— may be present.

$L_{01}$ preferably represents the single bond, a cycloalkylene group, —COO—, —O—, —CO—, —SO—, —$SO_2$—, —CS—, —$NR_{31}$—, or a group consisting of a combination thereof.

The compound represented by General Formula (I-1) preferably has at least one fluorine atom. In addition, the compound represented by General Formula (I-1) preferably has at least one fluorine atom in the anionic moiety.

The compound represented by General Formula (I-1) is preferably a compound represented by General Formula (I-1-1).

(I-1-1)

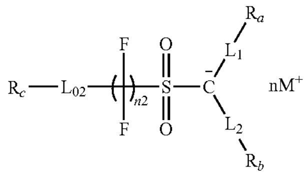

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

The fact that $R_a$ and $R_b$ in General Formula (I-1-1) have the same definitions as $R_a$ and $R_b$ in General Formula (I), respectively, means that the proviso requirements in General Formula (I) are also satisfied.

$n_2$ is preferably an integer of 1 to 3.

The divalent linking group as $L_{02}$ is the same as that mentioned as the divalent linking group of $L_{01}$.

$L_{02}$ in the compound represented by General Formula (I-1-1) preferably represents the single bond, a cycloalkylene group, —COO—, —O—, —CO—, —S—, —SO—, —$SO_2$—, —CS—, —$NR_{31}$—, or a group consisting of a combination thereof.

$R_{31}$ is as described in the divalent linking group as $L_{01}$ in the compound represented by General Formula (I-1).

$R_{31}$ and $R_c$ may be bonded to each other to form a ring, and the formed ring may have a heteroatom (for example, an oxygen atom) as a ring member.

$R_c$ in the compound represented by General Formula (I-1-1) preferably represents an alkyl group, a cycloalkyl group, an aryl group, or a fluorine atom.

The carbon anion group represented by Formula (A) in the compound represented by General Formula (I), (I-1), or (I-1-1) is preferably a group represented by any of General Formulae (a-1) to (a-9).

(A)

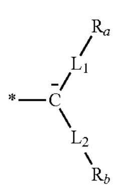

In Formula (A),

* represents a bonding position.

(a-1)

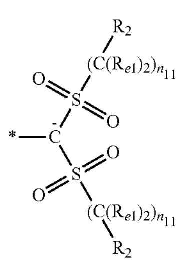

-continued (a-2)

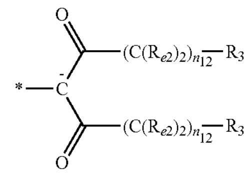

(a-3)

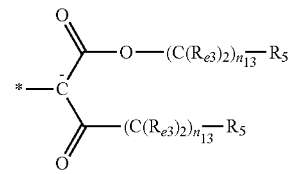

(a-4)

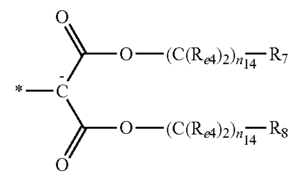

(a-5)

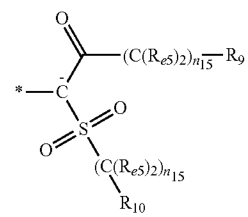

(a-6)

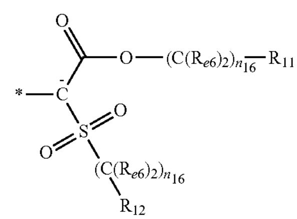

(a-7)

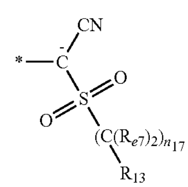

(a-8)

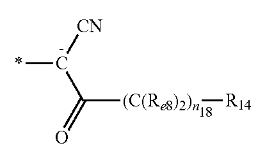

(a-9)

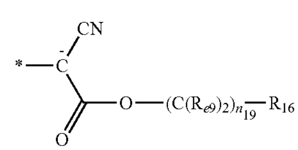

In General Formula (a-1), $R_1$ and $R_2$ each independently represent a hydrogen atom or a substituent.

It should be noted that $R_1$ and $R_2$ satisfy the following requirement (1A) or (1B).

(1A) At least one of $R_1$ or $R_2$ represents a secondary alkyl group, a tertiary alkyl group, a cycloalkyl group, or a perfluoroalkyl group, and $R_1$ and $R_2$ may be bonded to each other to form a ring.

(1B) $R_1$ and $R_2$ are bonded to each other to form a ring.

$R_{e1}$'s each independently represent a hydrogen atom, a fluorine atom, or an alkyl fluoride group.

$n_{11}$'s each independently represent 0, 1, or 2.

In General Formula (a-2), $R_3$ and $R_4$ each independently represent a hydrogen atom or a substituent.

It should be noted that $R_3$ and $R_4$ satisfy the following requirement (2A) or (2B).

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring.

(2B) $R_3$ and $R_4$ are bonded to each other to form a ring.

$R_{e2}$'s each independently represent a hydrogen atom, a fluorine atom, or an alkyl fluoride group.

$n_{12}$'s each independently represent 0, 1, or 2.

In General Formula (a-3), $R_5$ and $R_6$ each independently represent a hydrogen atom or a substituent.

It should be noted that $R_5$ and $R_6$ satisfy the following requirement (3A) or (3B).

(3A) At least one of $R_5$ or $R_6$ represents a secondary alkyl group, a tertiary alkyl group, a cycloalkyl group, or a perfluoroalkyl group, and $R_5$ and $R_6$ may be bonded to each other to form a ring.

(3B) $R_5$ and $R_6$ are bonded to each other to form a ring.

$R_{e3}$'s each independently represent a hydrogen atom, a fluorine atom, or an alkyl fluoride group.

$n_{13}$'s each independently represent 0, 1, or 2.

In General Formula (a-4), $R_7$ and $R_8$ each independently represent a hydrogen atom or a substituent.

It should be noted that $R_7$ and $R_8$ satisfy the following requirement (4A) or (4B).

(4A) At least one of $R_7$ or $R_8$ represents a secondary alkyl group, a tertiary alkyl group, a cycloalkyl group, or a perfluoroalkyl group, and $R_7$ and $R_8$ may be bonded to each other to form a ring.

(4B) $R_7$ and $R_5$ are bonded to each other to form a ring.

$R_{e4}$'s each independently represent a hydrogen atom, a fluorine atom, or an alkyl fluoride group.

$n_{14}$'s each independently represent 0, 1, or 2.

In General Formula (a-5), $R_9$ and $R_{10}$ each independently represent a hydrogen atom or a substituent.

It should be noted that $R_9$ and $R_{10}$ satisfy the following requirement (5A) or (5B).

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring.

(5B) $R_9$ and $R_{10}$ are bonded to each other to form a ring.

$R_{e5}$'s each independently represent a hydrogen atom, a fluorine atom, or an alkyl fluoride group.

$n_{15}$'s each independently represent 0, 1, or 2.

In General Formula (a-6), $R_{11}$ and $R_{12}$ each independently represent a hydrogen atom or a substituent.

It should be noted that $R_{11}$ and $R_{12}$ satisfy the following requirement (6A) or (6B).

(6A) At least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring.

(6B) $R_{11}$ and $R_{12}$ are bonded to each other to form a ring.

$R_{e6}$'s each independently represent a hydrogen atom, a fluorine atom, or an alkyl fluoride group.

$n_{16}$'s each independently represent 0, 1, or 2.

In General Formula (a-7), $R_{13}$ represents a secondary alkyl group, a tertiary alkyl group, a cycloalkyl group, or a perfluoroalkyl group.

$R_{e7}$'s each independently represent a hydrogen atom, a fluorine atom, or an alkyl fluoride group.

$n_{17}$ represents 0, 1, or 2.

In General Formula (a-8), $R_{10}$ represents a secondary alkyl group, a tertiary alkyl group, a cycloalkyl group, or a perfluoroalkyl group.

$R_{e8}$'s each independently represent a hydrogen atom, a fluorine atom, or an alkyl fluoride group.

$n_{18}$ represents 0, 1, or 2.

In General Formula (a-9), $R_{15}$ represents a secondary alkyl group, a tertiary alkyl group, a cycloalkyl group, or a perfluoroalkyl group.

$R_{e9}$'s each independently represent a hydrogen atom, a fluorine atom, or an alkyl fluoride group.

$n_{19}$ represents 0, 1, or 2.

In General Formulae (a-1) to (a-9),

* represents a bonding position.

It should be noted that in a case where the carbon anion group represented by Formula (A) in the compound represented by General Formula (I), General Formula (I-1), or General Formula (I-1-1) is a group represented by General Formula (B), in General Formula (I), a case where $L_0$ represents —$SO_2$— and $R_c$ represents a perfluoroalkyl group is excluded.

In General Formula (I-1) or General Formula (I-1-1), a case where $L_{01}$ or $L_{02}$ is a single bond, and $R_e$ represents a perfluoroalkyl group or a fluorine atom is excluded.

(I-1-1)

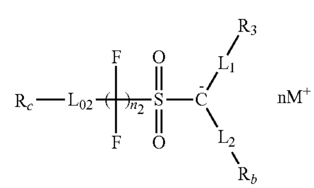

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

(B)

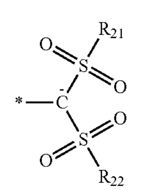

In General Formula (B), $R_{21}$ and $R_{22}$ each independently represent a perfluoroalkyl group.

In General Formula (a-1), examples of the substituent in each of $R_1$ and $R_2$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (1A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_1$ and $R_2$ in the requirement (1B) include the same ones as the rings described as the ring formed by the mutual bonding of $R_a$ and $R_b$ in the requirement (2) of General Formula (I).

The alkyl fluoride group of $R_{e1}$ is not particularly limited as long as it is an alkyl group having at least one fluorine atom, but the alkyl group in the alkyl fluoride group may be linear or branched, examples thereof include an alkyl group having 1 to 10 carbon atoms, and the alkyl group is preferably an alkyl group having 1 to 5 carbon atoms, and more preferably an alkyl group having 1 to 3 carbon atoms.

Specific examples of the alkyl fluoride group include a perfluoroalkyl group.

As $R_{e1}$, the hydrogen atom or the fluorine atom is preferable, and the hydrogen atom is more preferable.

In General Formula (a-2), examples of the substituent in each of $R_3$ and $R_4$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (2A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_3$ and $R_4$ in the requirement (2B) include the same ones as the rings described as the ring formed by the mutual bonding of $R_a$ and $R_b$ in the requirement (2) of General Formula (I).

Examples of the alkyl fluoride group of $R_e$e include the same ones as the groups described as the alkyl fluoride group in $R_{e1}$ of General Formula (a-1).

As $R_{e2}$, the hydrogen atom or the fluorine atom is preferable, and the hydrogen atom is more preferable.

In General Formula (a-3), examples of the substituent in each of $R_5$ and $R_6$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (3A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_5$ and $R_6$ in the requirement (3B) include the same ones as the rings described as the ring formed by the mutual bonding of $R_a$ and $R_b$ in the requirement (2) of General Formula (I).

Examples of the alkyl fluoride group of $R_{e3}$ include the same ones as the groups described as the alkyl fluoride group in $R_{e1}$ of General Formula (a-1).

As $R_{e3}$, the hydrogen atom or the fluorine atom is preferable, and the hydrogen atom is more preferable.

In General Formula (a-4), examples of the substituent in each of $R_7$ and $R_8$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (4A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_7$ and $R_8$ in the requirement (4B) include the same ones as the rings described as the ring formed by the mutual bonding of $R_a$ and $R_b$ in the requirement (2) of General Formula (I).

Examples of the alkyl fluoride group of $R_{e4}$ include the same ones as the groups described as the alkyl fluoride group in $R_{e1}$ of General Formula (a-1).

As $R_{e4}$, the hydrogen atom or the fluorine atom is preferable, and the hydrogen atom is more preferable.

In General Formula (a-5), examples of the substituent in each of $R_9$ and $R_{10}$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (5A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_9$ and $R_{10}$ in the requirement (5B) include the same ones as the rings described as the ring formed by the mutual bonding of $R_a$ and $R_b$ in the requirement (2) of General Formula (I).

Examples of the alkyl fluoride group of $R_{e5}$ include the same ones as the groups described as the alkyl fluoride group in $R_{e1}$ of General Formula (a-1).

As $R_{e5}$, the hydrogen atom or the fluorine atom is preferable, and the hydrogen atom is more preferable.

In General Formula (a-6), examples of the substituent in each of $R_{11}$ and $R_{12}$ include the same ones as the groups described as the substituent in each of $R_a$ and $R_b$ of General Formula (I).

Examples of the secondary alkyl group, the tertiary alkyl group, the cycloalkyl group, and the perfluoroalkyl group in the requirement (6A) include the same ones as the groups described as the secondary alkyl group, the tertiary alkyl group, the cycloalkyl group, or the perfluoroalkyl group in the requirement (1) of General Formula (I).

Examples of the ring formed by the mutual bonding of $R_{11}$ and $R_{12}$ in the requirement (6B) include the same ones as the rings described as the ring formed by the mutual bonding of $R_a$ and $R_b$ in the requirement (2) of General Formula (I).

Examples of the alkyl fluoride group of $R_{e6}$ include the same ones as the groups described as the alkyl fluoride group in $R_{e1}$ of General Formula (a-1).

As $R_{e6}$, the hydrogen atom or the fluorine atom is preferable, and the hydrogen atom is more preferable.

In General Formula (a-7), examples of the secondary alkyl group, the tertiary alkyl group, the cycloalkyl group, and the perfluoroalkyl group in $R_{13}$ include the same ones as the groups described as the secondary alkyl group, the tertiary alkyl group, the cycloalkyl group, or the perfluoroalkyl group in the requirement (1) of General Formula (I).

Examples of the alkyl fluoride group of $R_{e7}$ include the same ones as the groups described as the alkyl fluoride group in $R_{e1}$ of General Formula (a-1).

As $R_{e7}$, the hydrogen atom or the fluorine atom is preferable, and the hydrogen atom is more preferable.

In General Formula (a-8), examples of the secondary alkyl group, the tertiary alkyl group, the cycloalkyl group, and the perfluoroalkyl group in $R_{14}$ include the same ones as the groups described as the secondary alkyl group, the tertiary alkyl group, the cycloalkyl group, or the perfluoroalkyl group in the requirement (1) of General Formula (I).

Examples of the alkyl fluoride group of $R_{e8}$ include the same ones as the groups described as the alkyl fluoride group in $R_{e1}$ of General Formula (a-1).

As $R_{e8}$, the hydrogen atom or the fluorine atom is preferable, and the hydrogen atom is more preferable.

In General Formula (a-9), examples of the secondary alkyl group, the tertiary alkyl group, the cycloalkyl group, and the perfluoroalkyl group in $R_{15}$ include the same ones as the groups described as the secondary alkyl group, the tertiary alkyl group, the cycloalkyl group, or the perfluoroalkyl group in the requirement (1) of General Formula (I).

Examples of the alkyl fluoride group of $R_{e8}$ include the same ones as the groups described as the alkyl fluoride group in $R_{e1}$ of General Formula (a-1).

As $R_{e8}$, the hydrogen atom or the fluorine atom is preferable, and the hydrogen atom is more preferable.

General Formula (I), General Formula (I-1), and General Formula (I-1-1) are as described above.

In General Formula (B), examples of the perfluoroalkyl group in each of $R_{21}$ and $R_{22}$ include the same ones as the groups described as the perfluoroalkyl group in each of $R_a$ and $R_b$ of General Formula (I).

In General Formula (a-1), it is preferable that $n_{11}$'s each independently represent 0 or 1.

In General Formula (a-2), it is preferable that $n_{12}$'s each independently represent 0 or 1.

In General Formula (a-3), it is preferable that $n_{13}$'s each independently represent 0 or 1.

In General Formula (a-4), it is preferable that $n_{14}$'s each independently represent 0 or 1.

In General Formula (a-5), it is preferable that $n_{15}$'s each independently represent 0 or 1.

In General Formula (a-6), it is preferable that $n_{16}$'s each independently represent 0 or 1.

In General Formula (a-7), it is preferable that $n_{17}$'s each independently represent 0 or 1.

In General Formula (a-8), it is preferable that $n_{18}$'s each independently represent 0 or 1.

In General Formula (a-9), it is preferable that $n_{19}$'s each independently represent 0 or 1.

In (1A) in General Formula (a-1), t is preferable that $R_1$ and $R_2$ each independently represent a secondary alkyl group, a tertiary alkyl group, a cycloalkyl group, or a perfluoroalkyl group, and $R_1$ and $R_2$ may be bonded to each other to form a ring.

In (2A) in General Formula (a-2), t is preferable that $R_3$ and $R_4$ each independently represent a secondary alkyl group, a tertiary alkyl group, a cycloalkyl group, or a perfluoroalkyl group, and $R_3$ and $R_4$ may be bonded to each other to form a ring.

In (3A) in General Formula (a-3), t is preferable that $R_5$ and $R_6$ each independently represent a secondary alkyl group, a tertiary alkyl group, a cycloalkyl group, or a perfluoroalkyl group, and $R_5$ and $R_6$ may be bonded to each other to form a ring.

In (4A) in General Formula (a-4), t is preferable that $R_7$ and $R_5$ each independently represent a secondary alkyl group, a tertiary alkyl group, a cycloalkyl group, or a perfluoroalkyl group, and $R_7$ and $R_5$ may be bonded to each other to form a ring.

In (5A) in General Formula (a-5), t is preferable that $R_9$ and $R_{10}$ each independently represent a secondary alkyl group, a tertiary alkyl group, a cycloalkyl group, or a perfluoroalkyl group, and $R_9$ and $R_{10}$ may be bonded to each other to form a ring.

In (6A) in General Formula (a-6), t is preferable that $R_{11}$ and $R_{12}$ each independently represent a secondary alkyl group, a tertiary alkyl group, a cycloalkyl group, or a perfluoroalkyl group, and $R_{11}$ and $R_{12}$ may be bonded to each other to form a ring.

The carbon anion group represented by Formula (A) in the compound represented by General Formula (I), (I-1), or (I-1-1) is preferably the group represented by any of General Formulae (a-1), (a-2), and (a-5) to (a-9).

The carbon anion group represented by Formula (A) in the compound represented by General Formula (I), (I-1), or (I-1-1) is preferably the group represented by General Formulae (a-1) or (a-2).

$R_c$ in the compound represented by General Formula (I), (I-1), or (I-1-1) preferably represents an anion group. It should be noted that in a case where a carbon anion group represented by Formula (A) in a compound represented by General Formula (I-1-1) is a group represented by General Formula (B), the anion group of $R_c$ is not a group represented by General Formula (a-x).

(I-1-1)

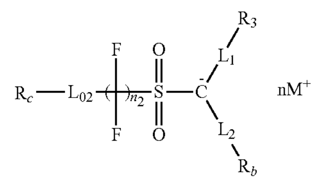

In General Formula (I-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

(A)

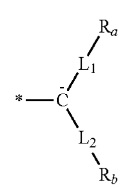

In Formula (A),

* represents a bonding position.

(B)

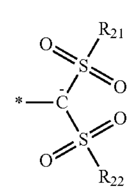

In General Formula (B), $R_{21}$ and $R_{22}$ each independently represent a perfluoroalkyl group.

* represents a bonding position.

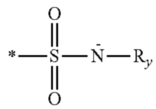

(a-x)

In General Formula (a-x), $R_y$ represents an alkyl group.

* represents a bonding position.

General Formula (I-1-1) is as described above.

In General Formula (B), examples of the perfluoroalkyl group in each of $R_{21}$ and $R_{22}$ include the same ones as the groups described as the perfluoroalkyl group in each of $R_a$ and $R_b$ of General Formula (I).

The alkyl group of $R_y$ is not particularly limited, but may be linear or branched, examples thereof include an alkyl group having 1 to 15 carbon atoms, and the alkyl group is preferably an alkyl group having 1 to 10 carbon atoms, and more preferably an alkyl group having 1 to 5 carbon atoms.

The alkyl group may have a substituent. The substituent is not particularly limited, but examples thereof include the above-mentioned substituent T.

The anion group of $R_c$ is preferably a group represented by any of General Formulae (b-1) to (b-9).

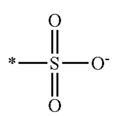

(b-1)

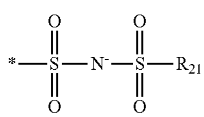

(b-2)

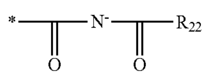

(b-3)

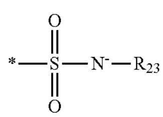

(b-4)

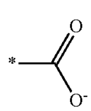

(b-5)

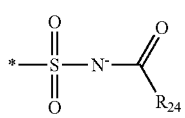

(b-6)

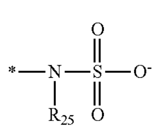

(b-7)

-continued

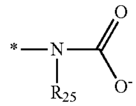

(b-8)

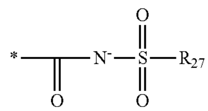

(b-9)

In General Formula (b-2), $R_{21}$ represents a substituent.

In General Formula (b-3), $R_{22}$ represents a substituent.

In General Formula (b-4), $R_{23}$ represents a substituent.

In General Formula (b-6), $R_{24}$ represents a substituent.

In General Formula (b-7), $R_{25}$ represents a substituent.

In General Formula (b-8), $R_{26}$ represents a substituent.

In General Formula (b-9), $R_{27}$ represents a substituent.

In General Formulae (b-1) to (b-9),

* represents a bonding position.

The substituent of $R_{21}$ is not particularly limited, but examples thereof include an organic group.

The number of carbon atoms of the organic group is not particularly limited, but is usually 1 to 20, and is preferably 1 to 10.

The organic group is not particularly limited, but examples thereof include an alkyl group, a cycloalkyl group, an alkenyl group, an aryl group, and a group formed by combination of a plurality of these groups.

The alkyl group may be linear or branched. The alkyl group preferably has 1 to 15 carbon atoms, more preferably has 1 to 12 carbon atoms, and still more preferably has 1 to 8 carbon atoms.

A substituent which may be contained in the alkyl group is not particularly limited, but is preferably a cycloalkyl group (preferably having 3 to 10 carbon atoms), a fluorine atom, or a cyano group.

In a case where the alkyl group has a fluorine atom as the substituent, the alkyl group may or may not be a perfluoroalkyl group.

As the alkyl group, an alkyl group having 1 to 12 carbon atoms, which has no substituent, is preferable, and an alkyl group having 1 to 8 carbon atoms, which has no substituent, is more preferable.

The cycloalkyl group may be monocyclic or polycyclic. The cycloalkyl group preferably has 3 to 15 carbon atoms, and more preferably has 5 to 10 carbon atoms.

Examples of the cycloalkyl group include a cyclopentyl group, a cyclohexyl group, a norbornyl group, and an adamantyl group.

The substituent which may be contained in the cycloalkyl group is not particularly limited, but is preferably an alkyl group (which may be linear or branched, and preferably has 1 to 5 carbon atoms).

One or more of the carbon atoms which are ring member atoms of the cycloalkyl group may be substituted with carbonyl carbon atoms.

The alkenyl group may be linear or branched. The alkenyl group preferably has 2 to 10 carbon atoms, and more preferably has 2 to 6 carbon atoms.

As a substituent which may be contained in the alkenyl group, a cycloalkyl group (preferably having 3 to 10 carbon atoms), a fluorine atom, or a cyano group is preferable.

Examples of the alkenyl group include an ethenyl group, a propenyl group, and a butenyl group.

The aryl group is not particularly limited, but is preferably an aryl group having 6 to 20 carbon atoms, and specific examples thereof include a phenyl group, a naphthyl group, an anthryl group, a phenanthryl group, a pyrenyl group, a naphthacenyl group, and a fluorenyl group.

As the aryl group, an aryl group having 6 to 15 carbon atoms is more preferable, and an aryl group having 6 to 10 carbon atoms is still more preferable.

The substituent that the aryl group may have is not particularly limited, but is preferably an alkyl group, a cycloalkyl group, an alkenyl group, an aryl group, a fluorine atom, a chlorine atom, a bromine atom, an iodine atom, a cyano group, or a fluoroalkyl group, and more preferably the fluorine atom or the fluoroalkyl group.

As $R_{21}$ in General Formula (b-2), an alkyl group or a cycloalkyl group is preferable, and the alkyl group is more preferable.

Among those, the groups mentioned as the suitable alkyl group are still more preferable, and the alkyl group having 1 to 8 carbon atoms, which has no substituent, or the alkyl group having a fluorine atom as a substituent is particularly preferable.

Examples of the substituent of $R_{22}$ include the same ones as the groups described as the substituent in $R_{21}$ of General Formula (b-2).

Examples of the substituent of $R_{23}$ include the same ones as the groups described as the substituent in $R_{21}$ of General Formula (b-2).

Examples of the substituent of $R_{24}$ include the same ones as the groups described as the substituent in $R_{21}$ of General Formula (b-2).

Examples of the substituent of $R_{25}$ include the same ones as the groups described as the substituent in $R_{21}$ of General Formula (b-2).

Examples of the substituent of $R_{26}$ include the same ones as the groups described as the substituent in $R_{21}$ of General Formula (b-2).

Examples of the substituent of $R_{27}$ include the same ones as the groups described as the substituent in $R_{21}$ of General Formula (b-2).

Preferred examples of the specific compound are shown below. In the following examples, the combinations of the anion and the cation may be exchanged and used.

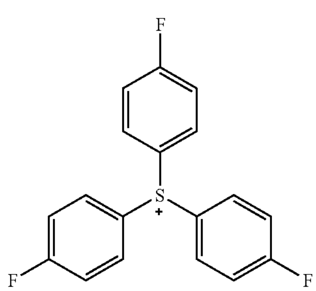

-continued

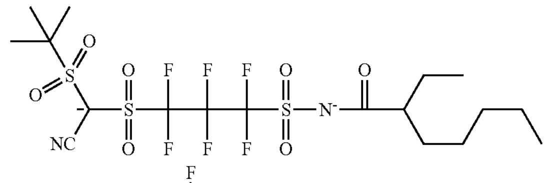

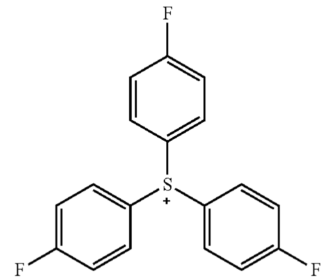

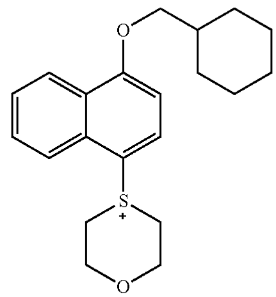

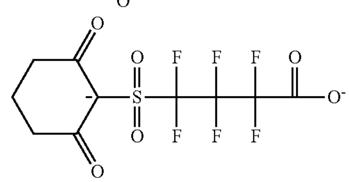

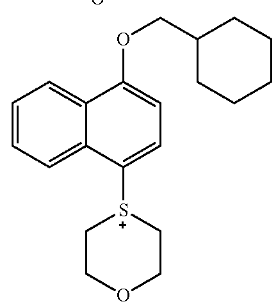

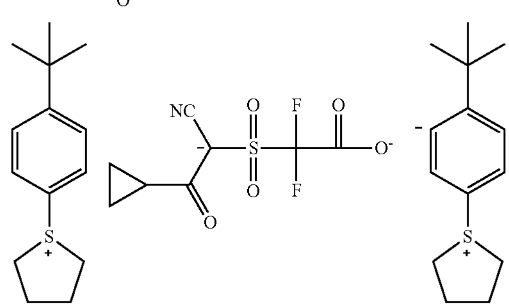

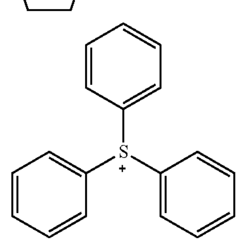

-continued
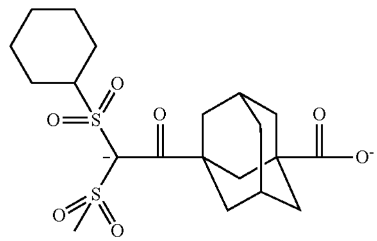
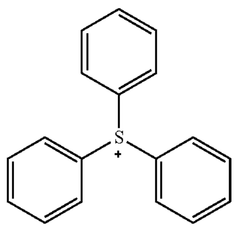
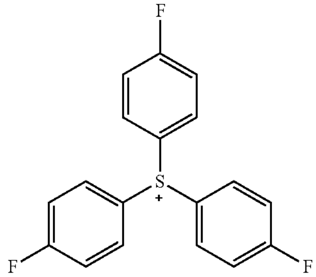
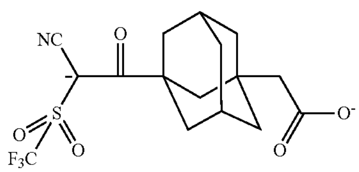
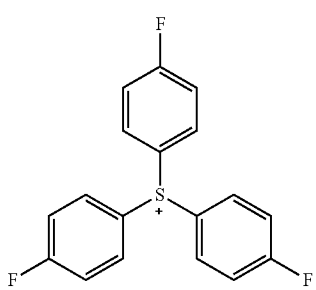
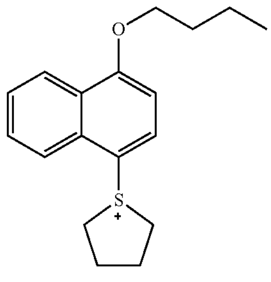
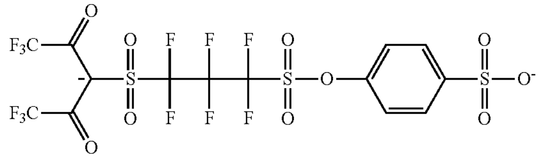
-continued
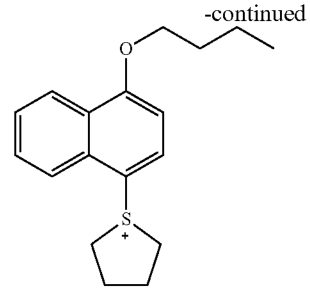
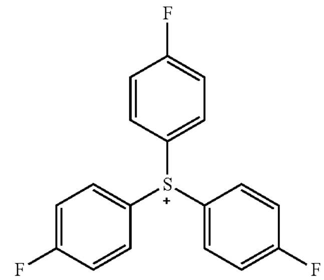
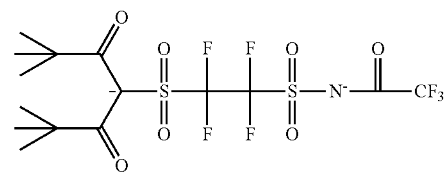
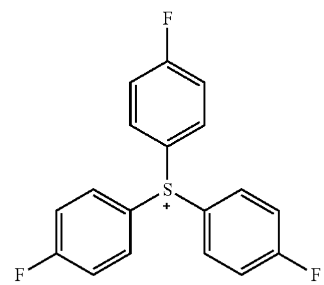
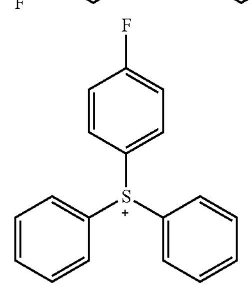
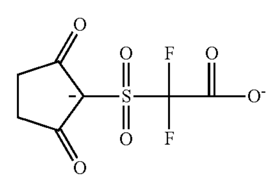
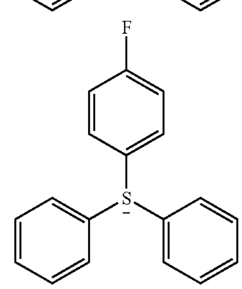
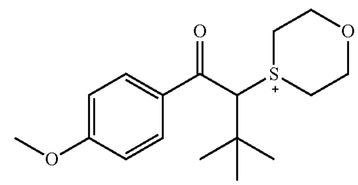

-continued
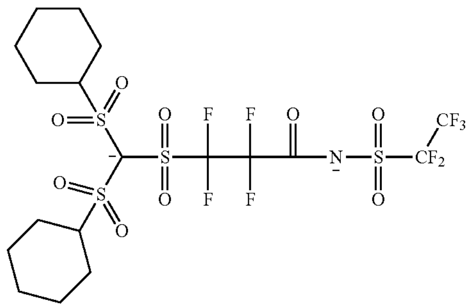
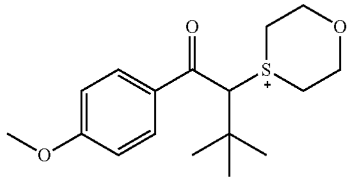
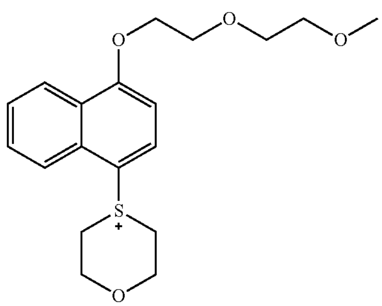
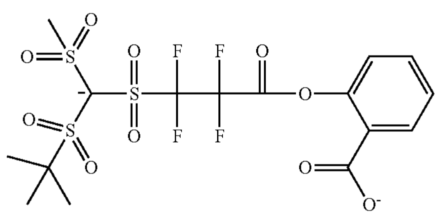
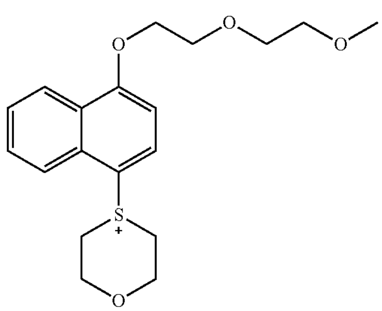
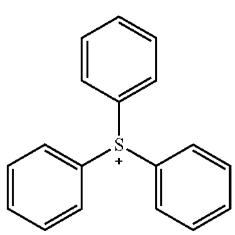
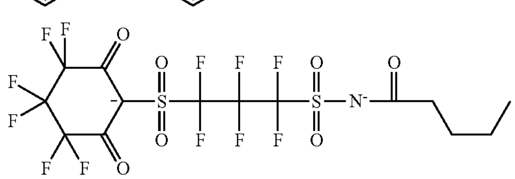
-continued
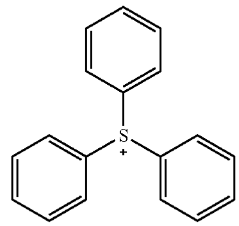
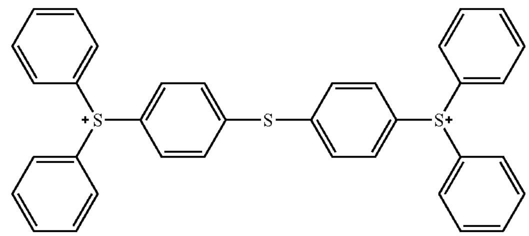
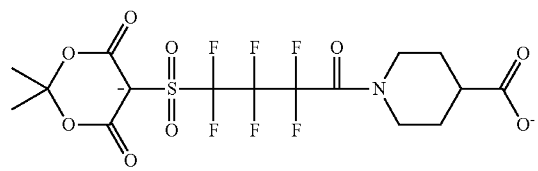
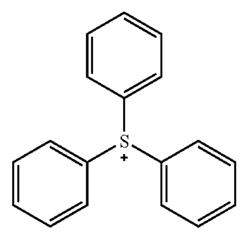
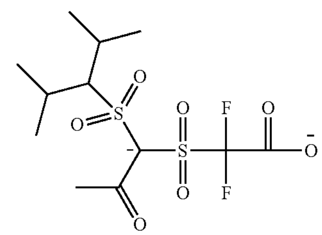
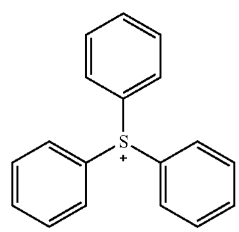
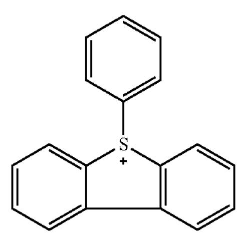
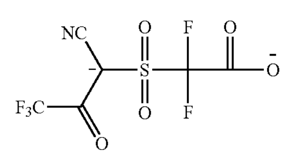
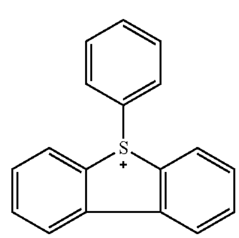

-continued
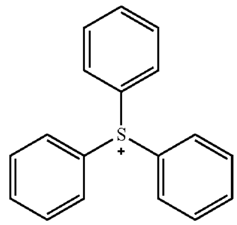
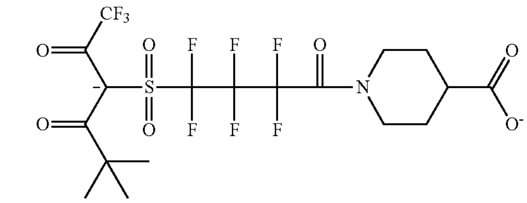
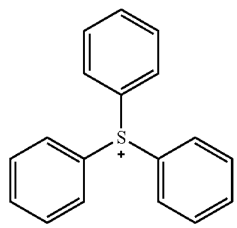
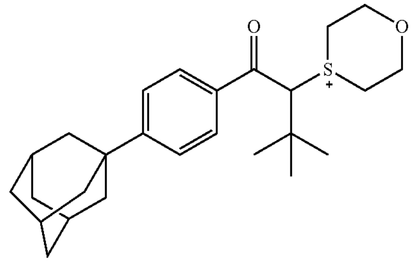
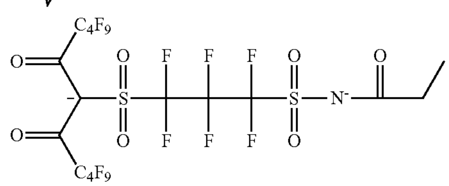
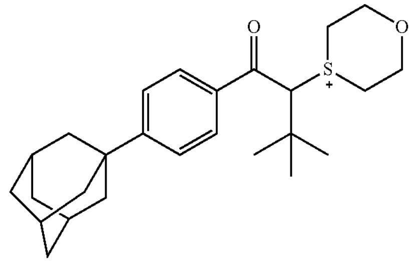
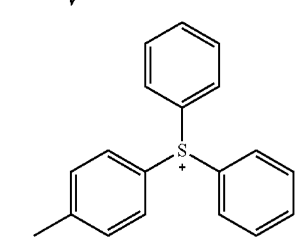
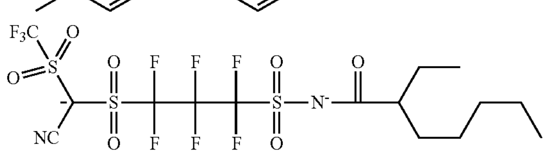
-continued
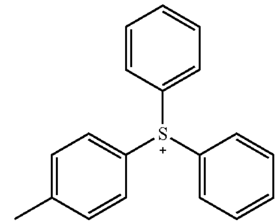
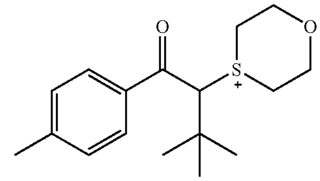
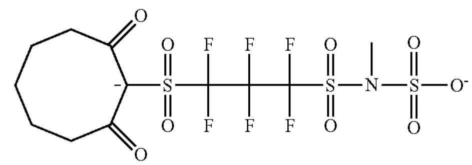
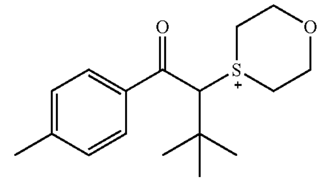
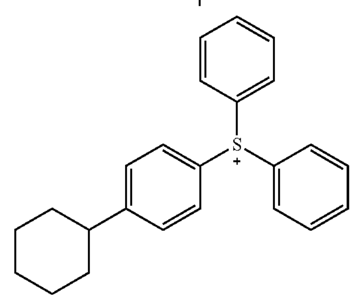
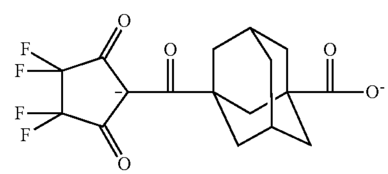
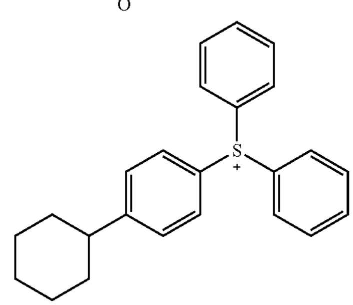
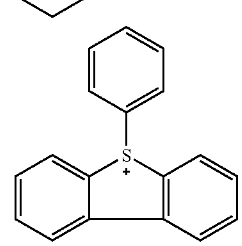
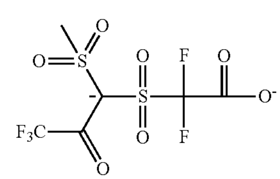

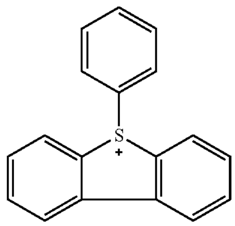
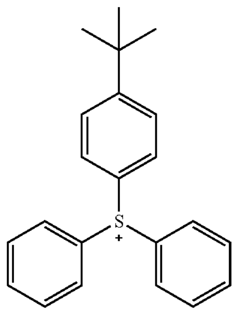
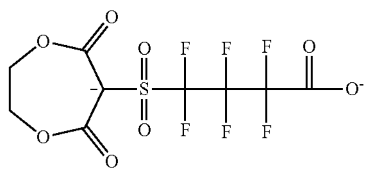
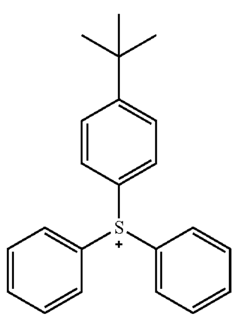
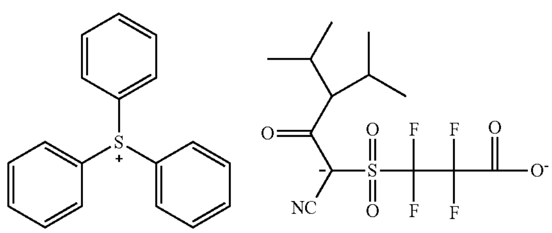
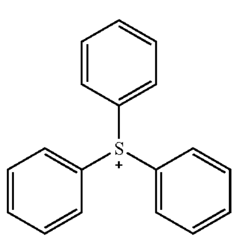
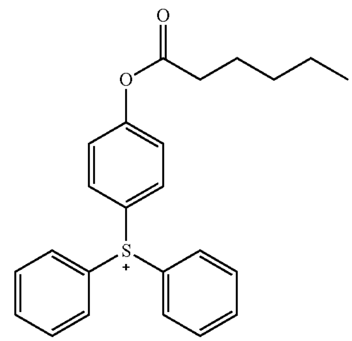
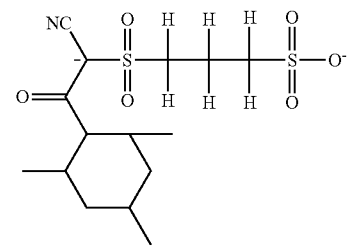
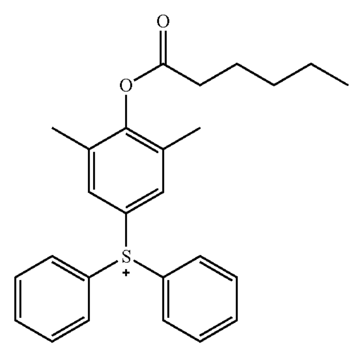
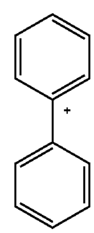
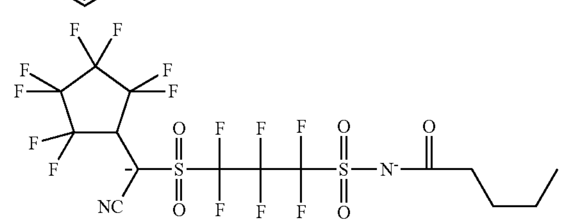
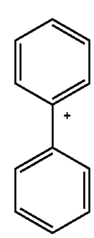

-continued
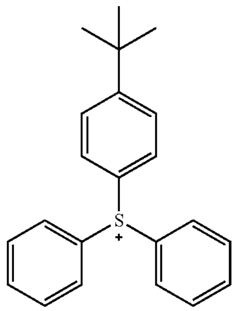
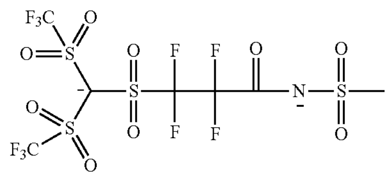
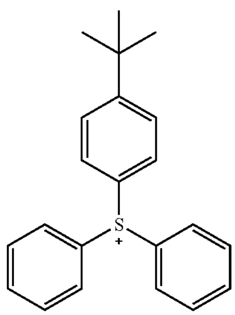
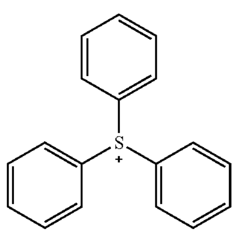
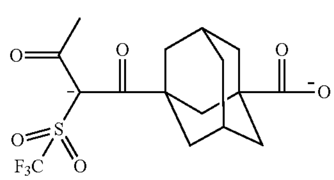
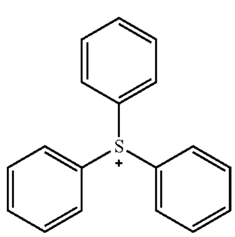
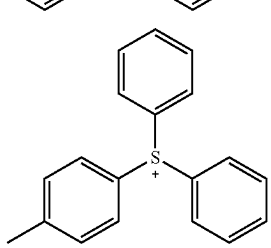
-continued
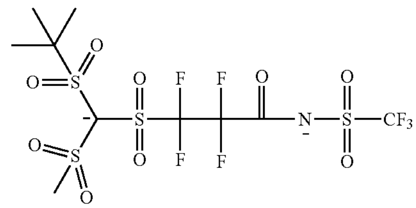
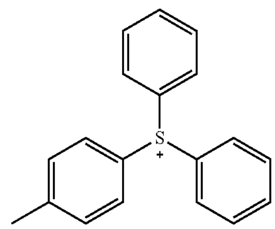
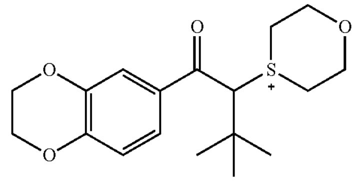
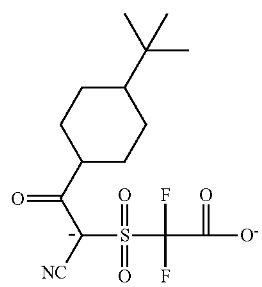
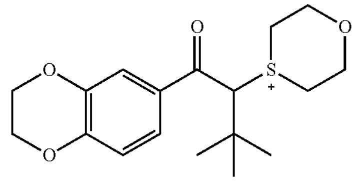
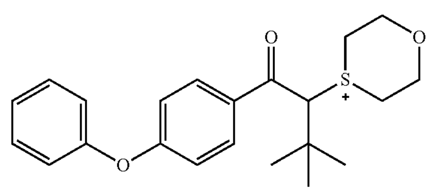
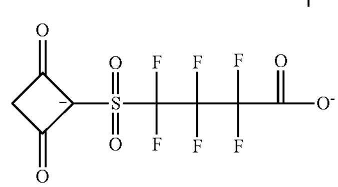
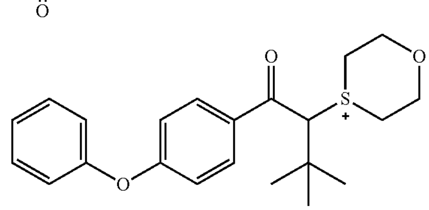

-continued
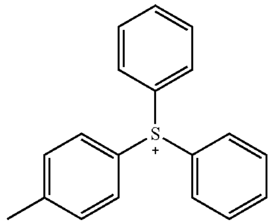
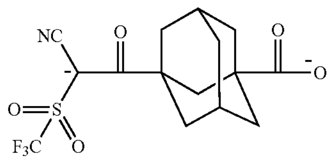
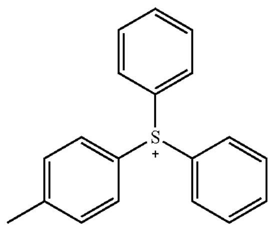
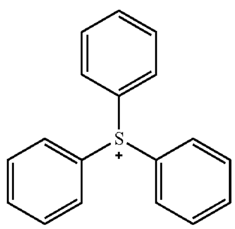
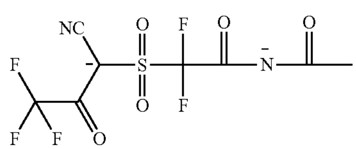
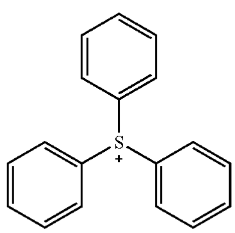
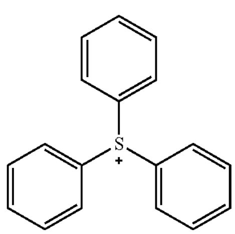
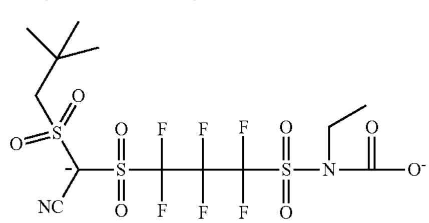
-continued
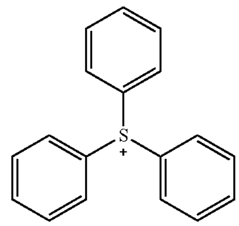
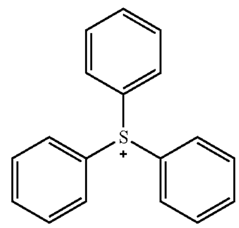
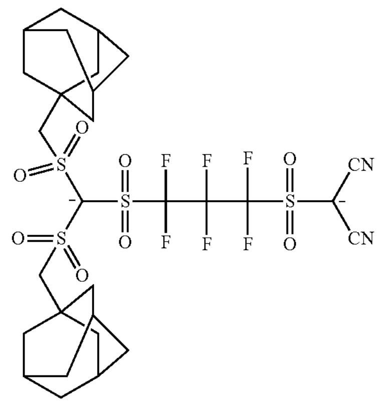
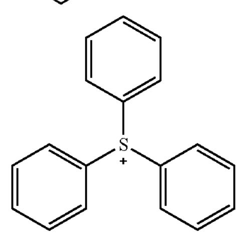
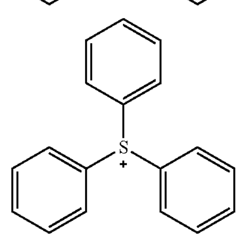
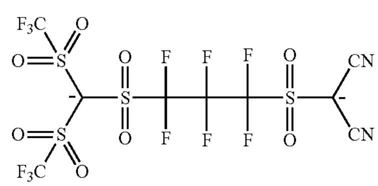
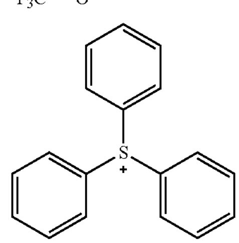

-continued
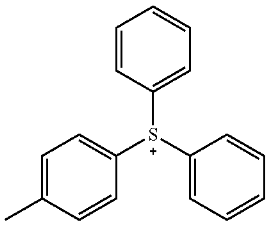
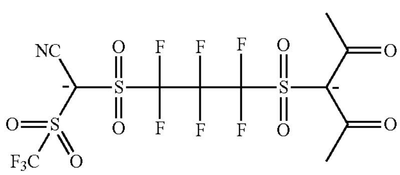
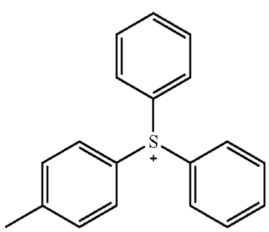
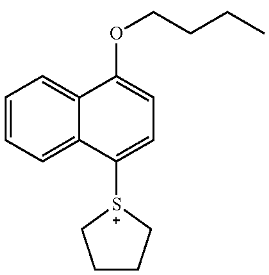
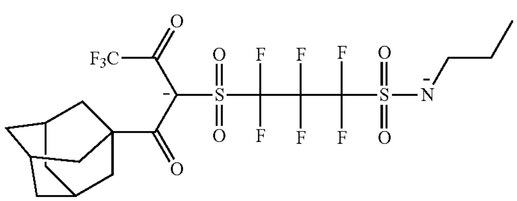
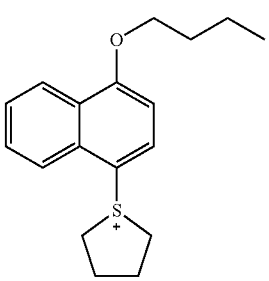
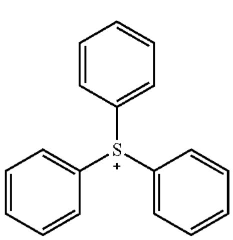
-continued
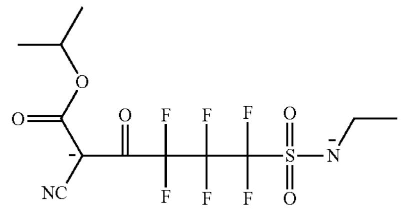
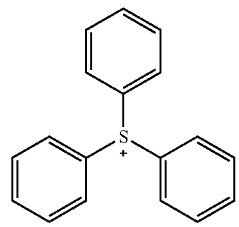
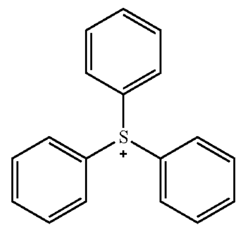
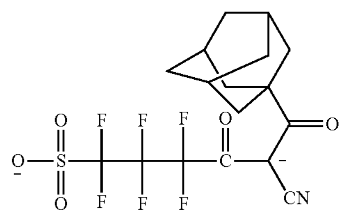
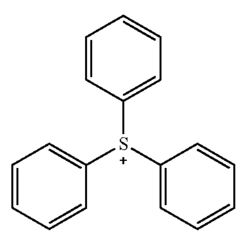
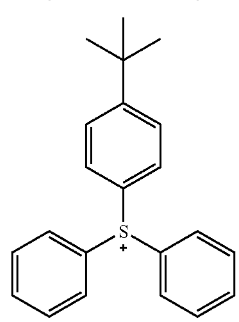
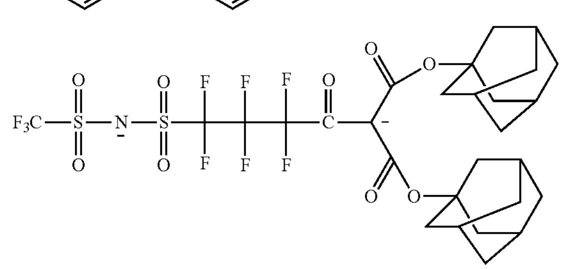

-continued
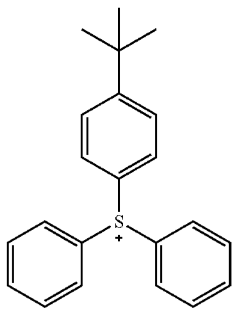
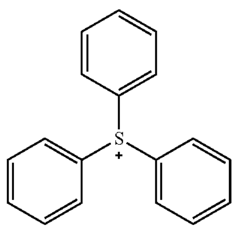
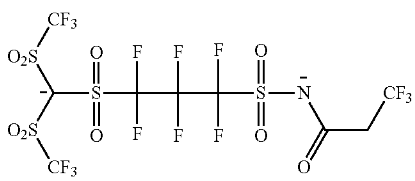
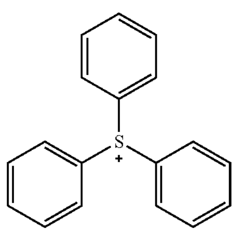
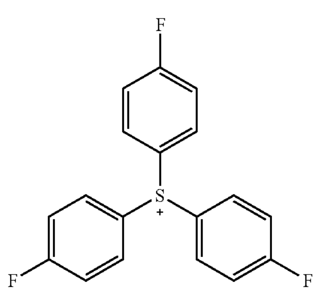
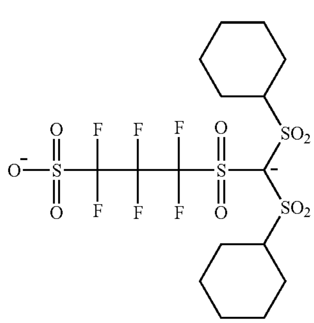
-continued
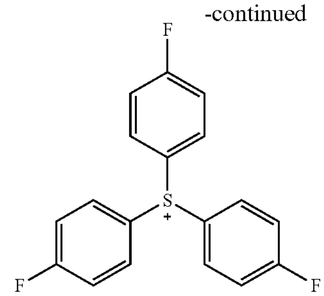
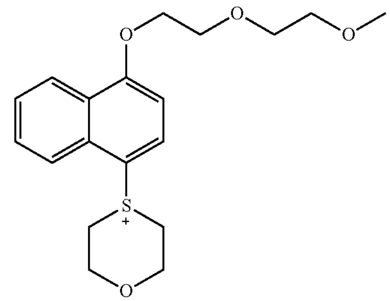
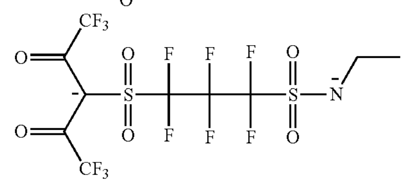
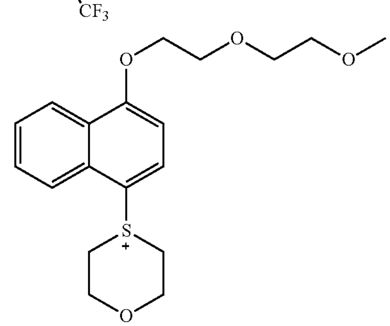
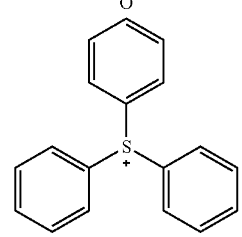
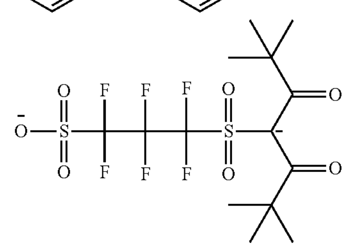
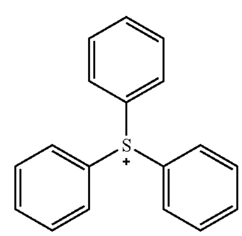

-continued
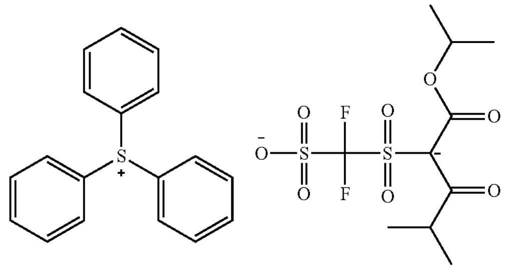
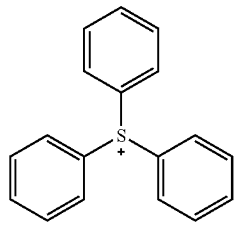
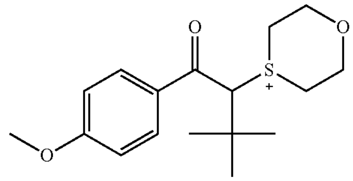
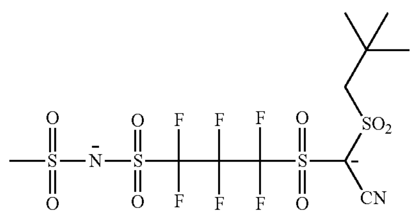
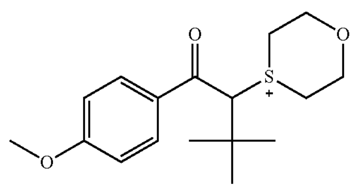
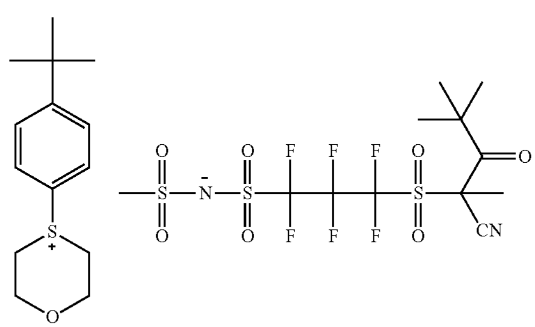
-continued
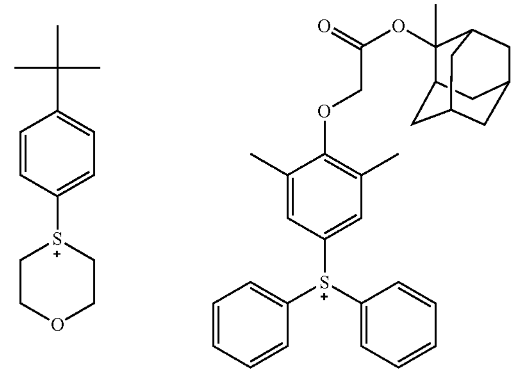
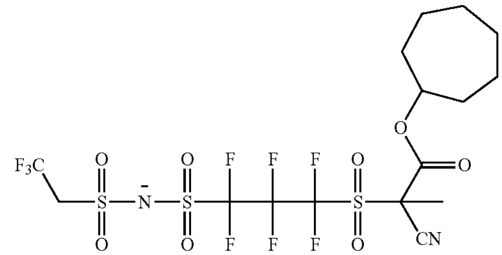
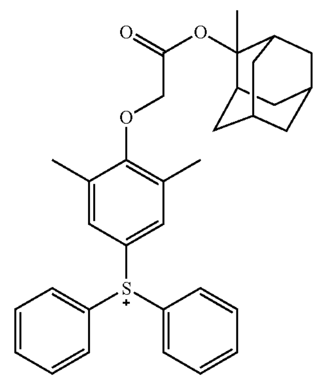
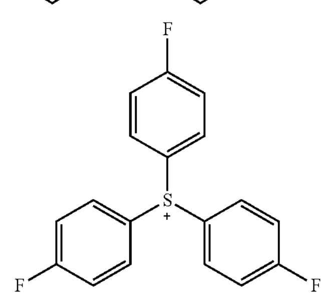
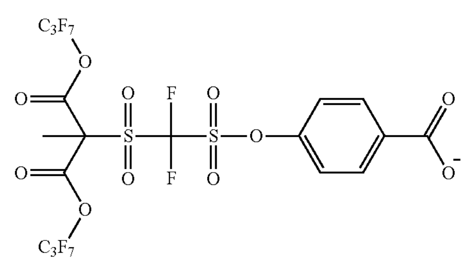

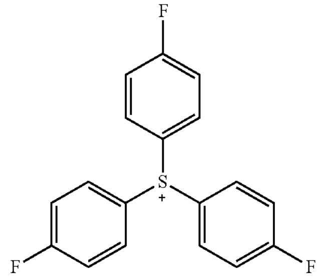
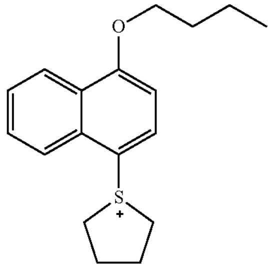
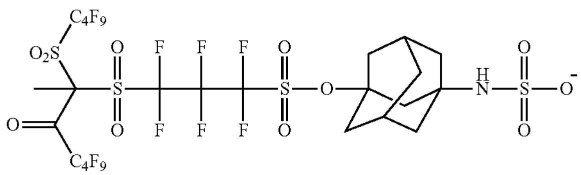
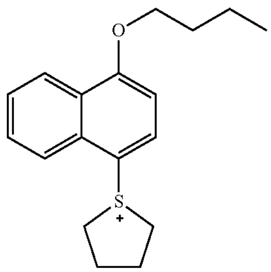
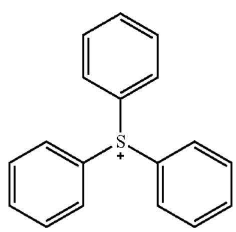
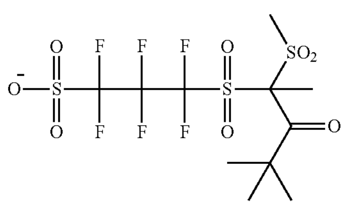
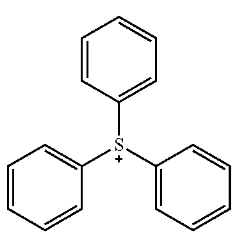
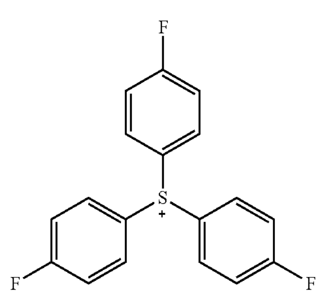
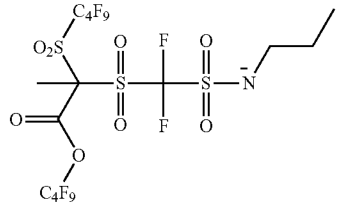
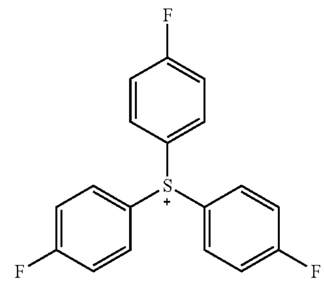
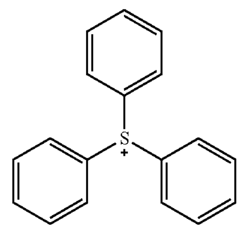
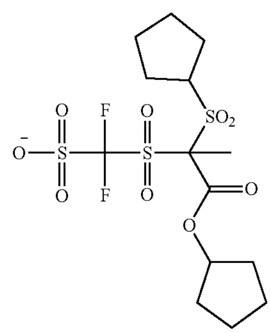
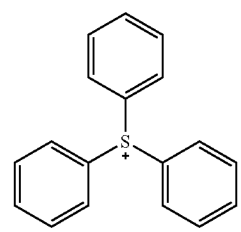
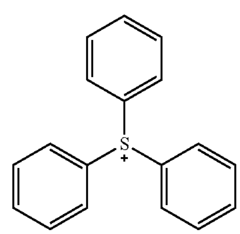
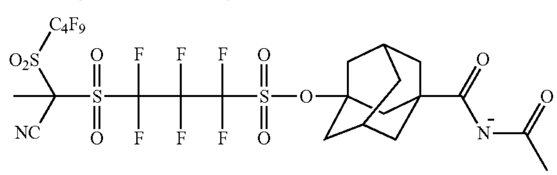
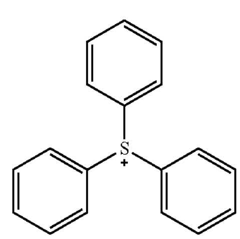

-continued
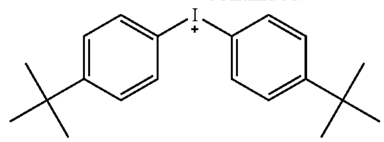
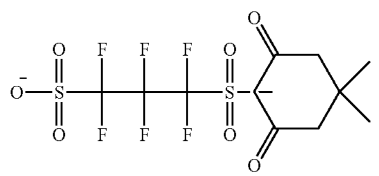
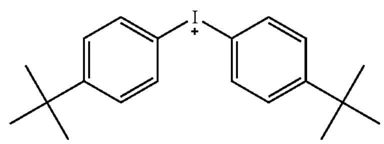
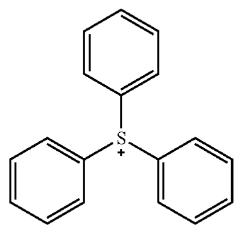
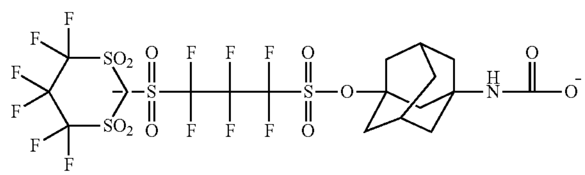
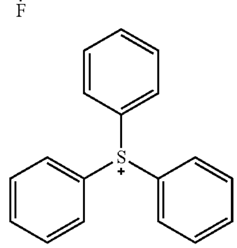
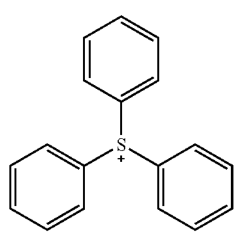
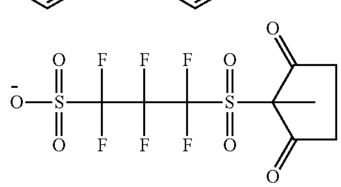
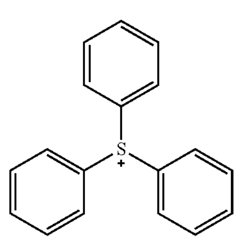
-continued
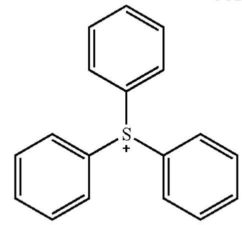
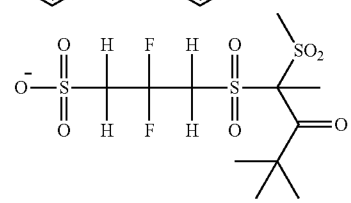
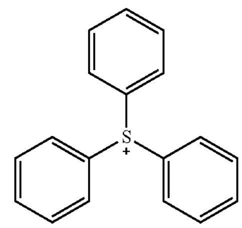
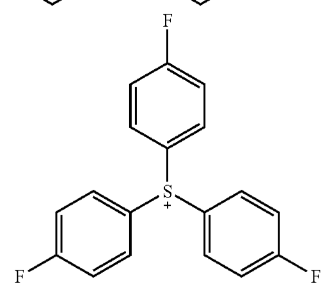
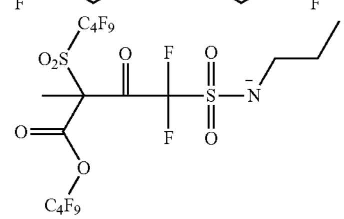
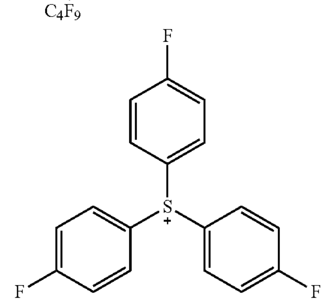
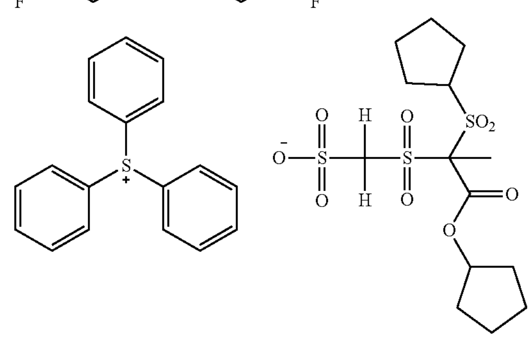

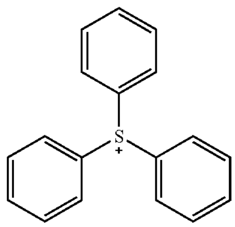
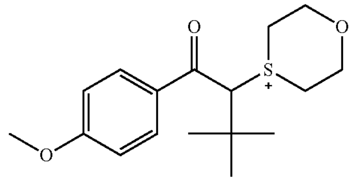
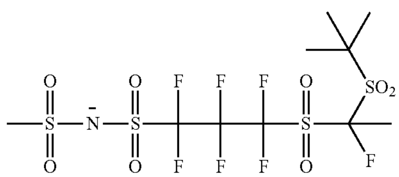
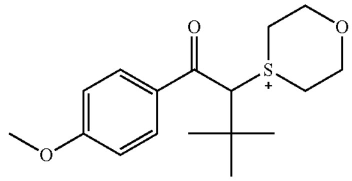
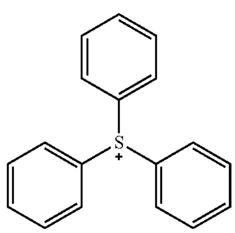
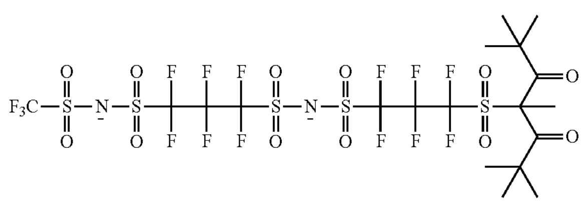
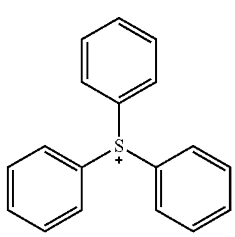
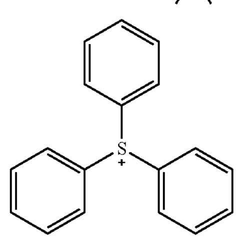
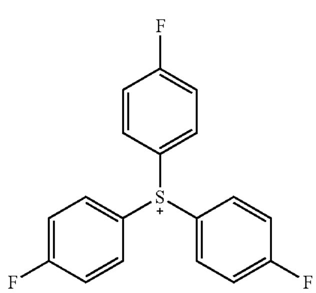
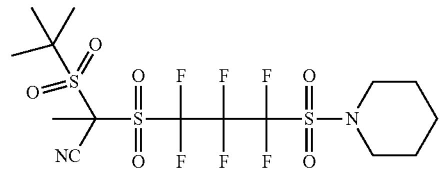
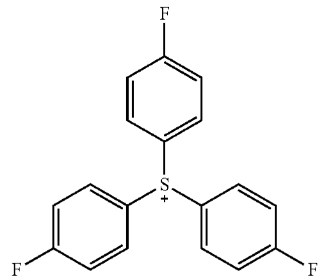
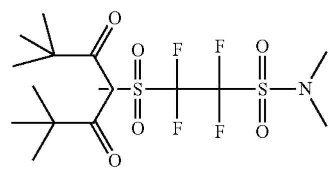
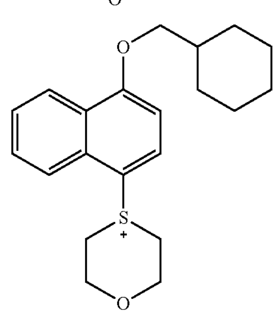
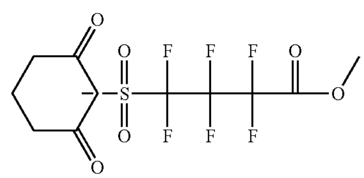
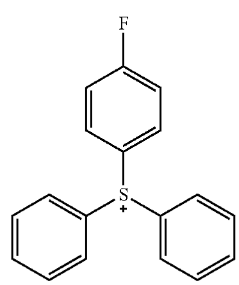
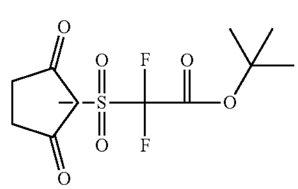

-continued
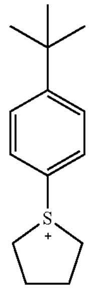
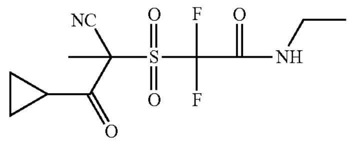
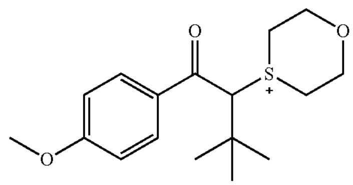
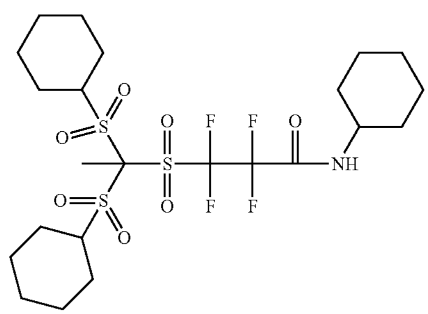
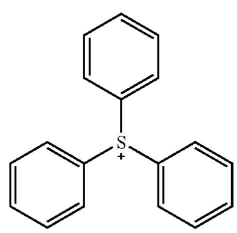
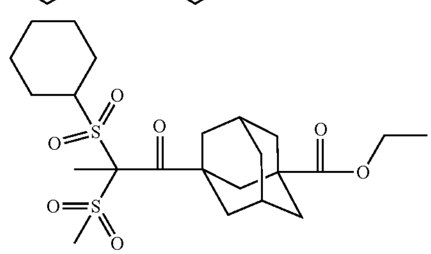
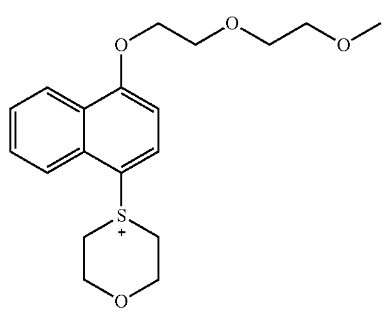
-continued
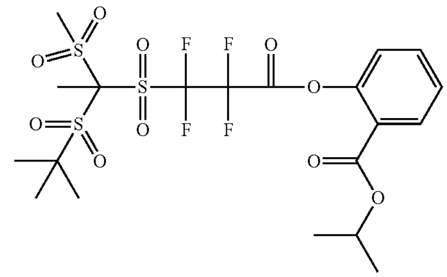
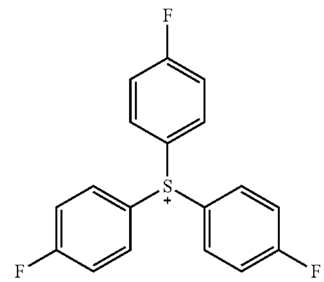
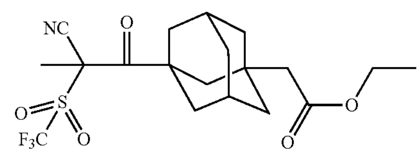
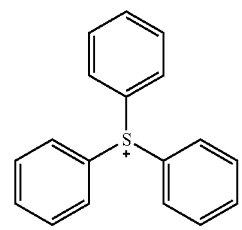
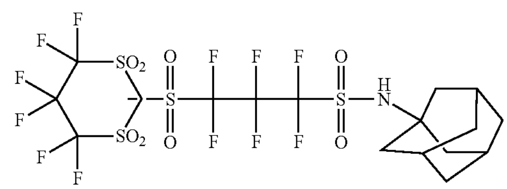
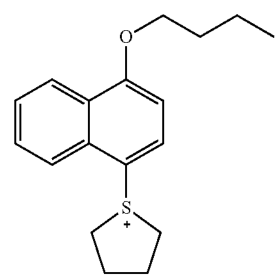
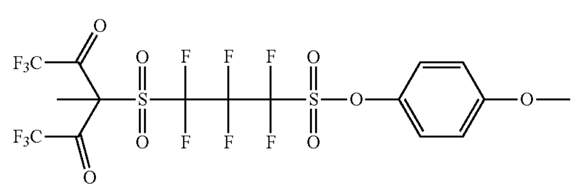

-continued
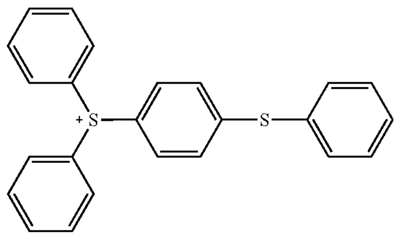
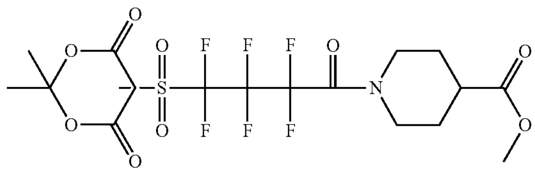
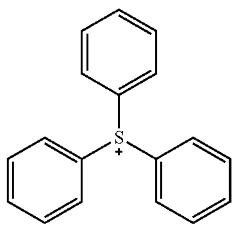
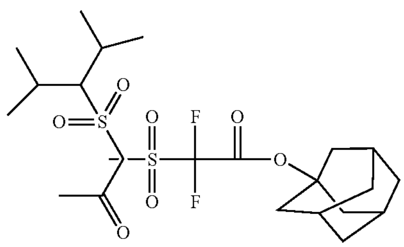
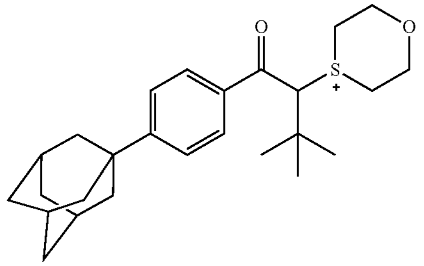
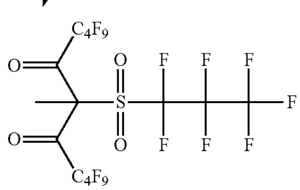
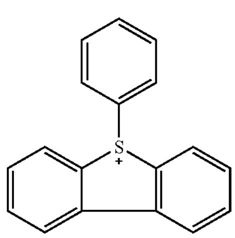
-continued
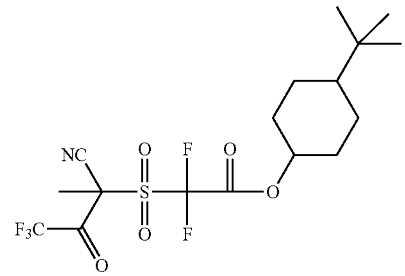
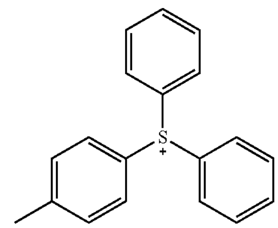
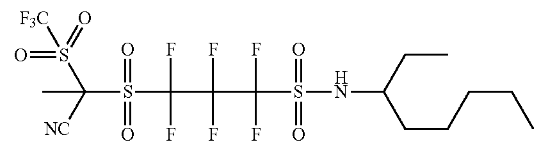
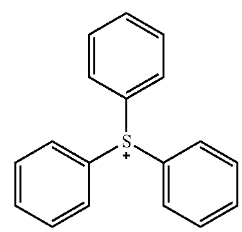
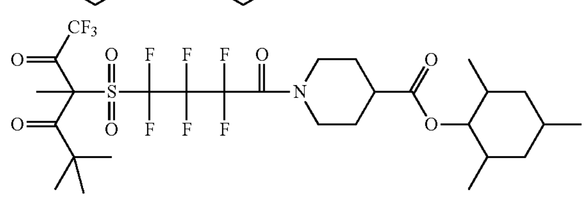
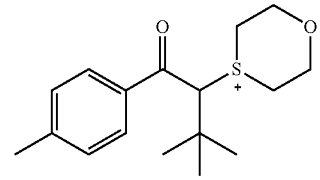
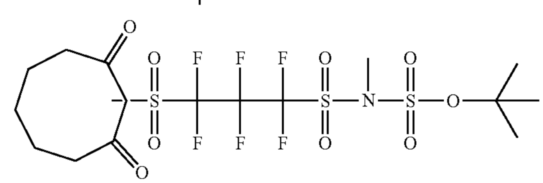
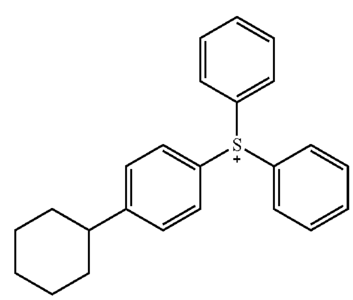

-continued
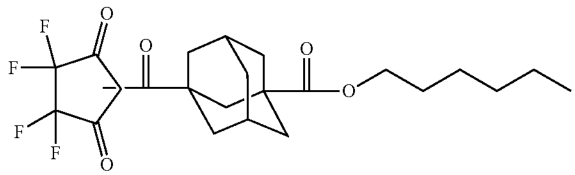
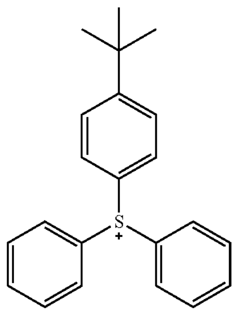
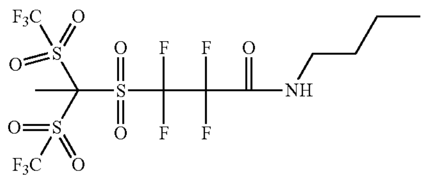
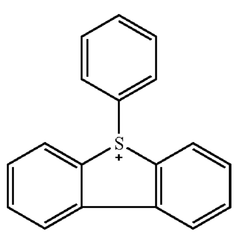
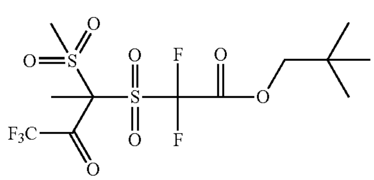
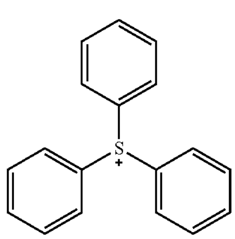
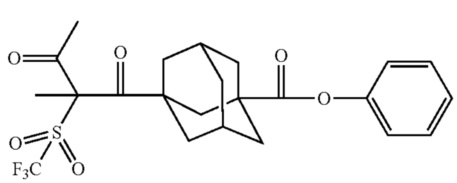
-continued
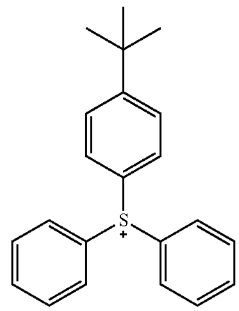
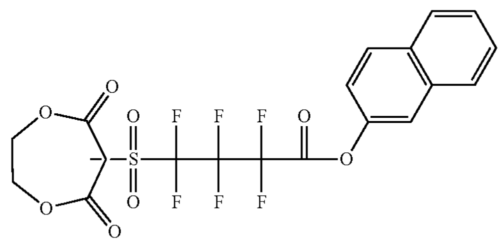
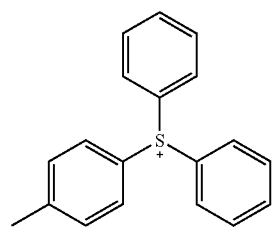
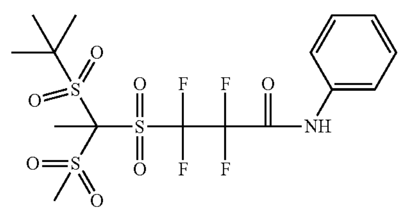
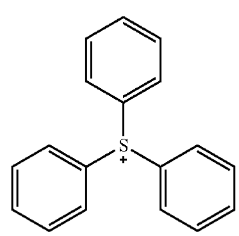
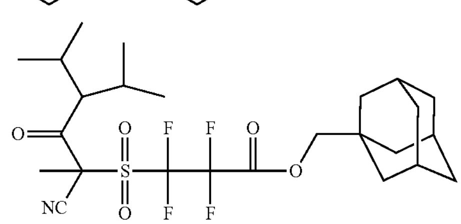
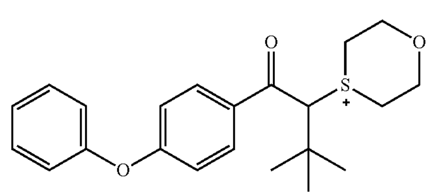

-continued
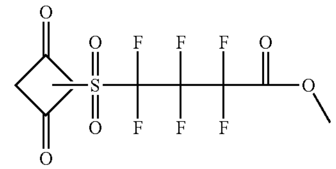
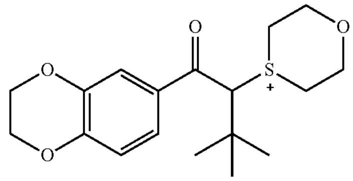
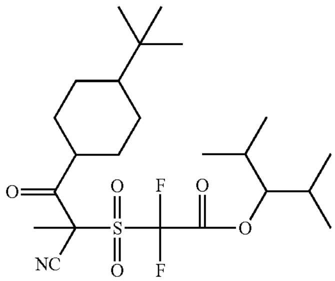
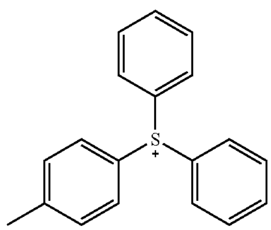
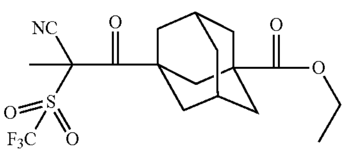
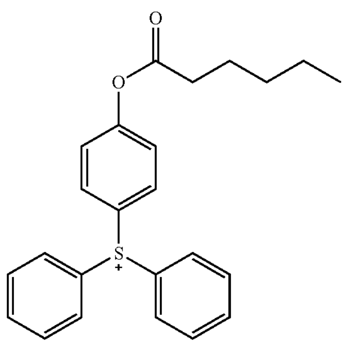
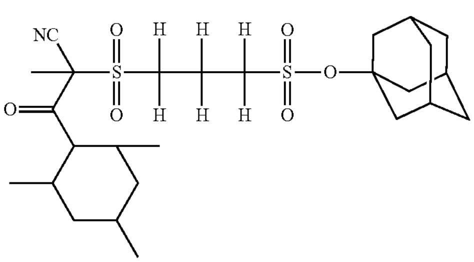
-continued
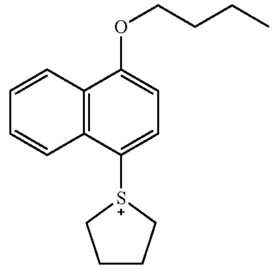
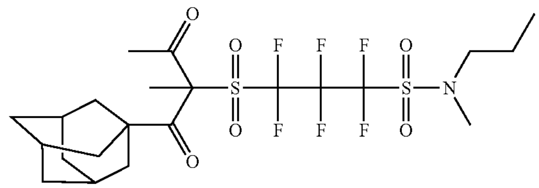
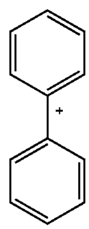
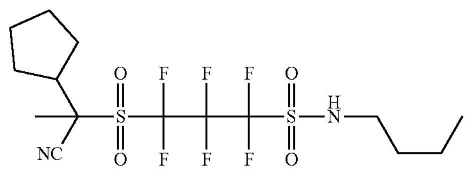
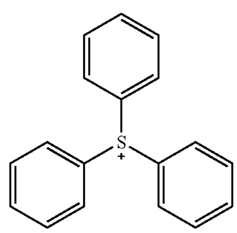
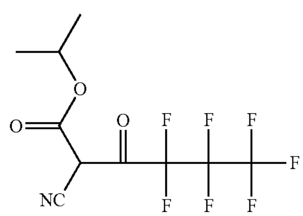
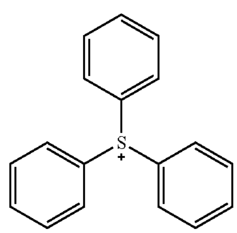
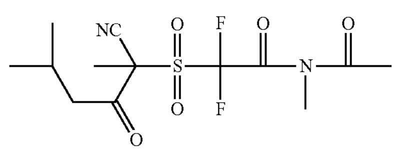

-continued
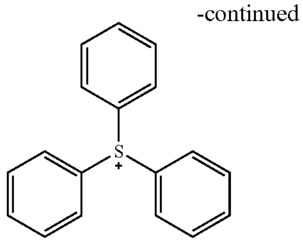
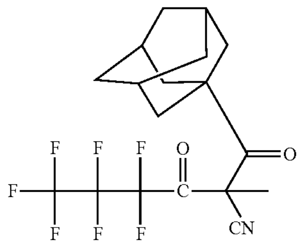
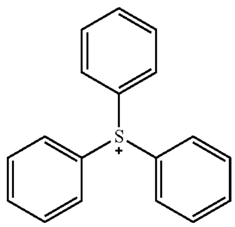
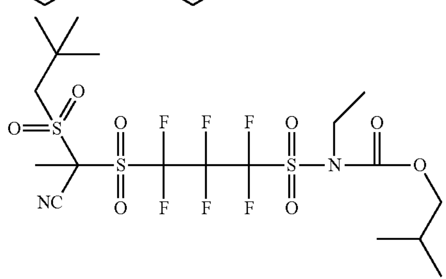
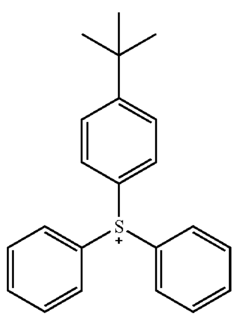
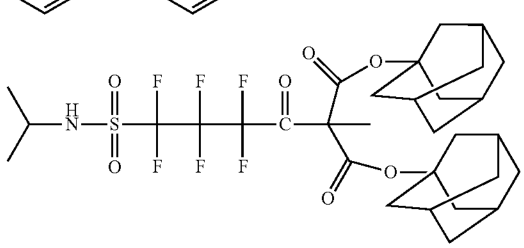
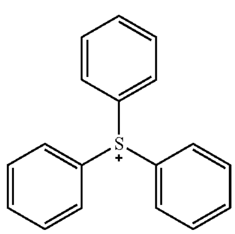
-continued
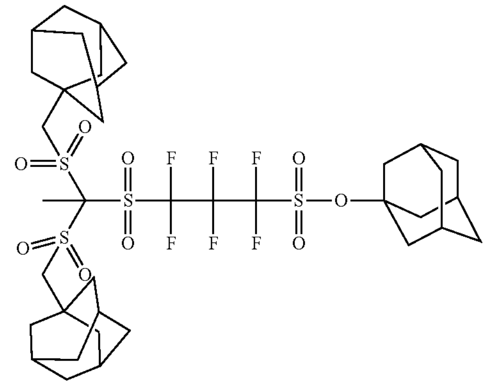
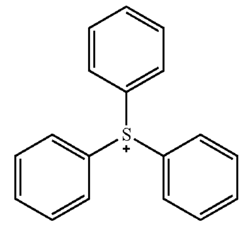
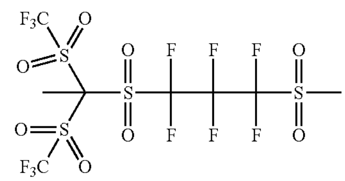
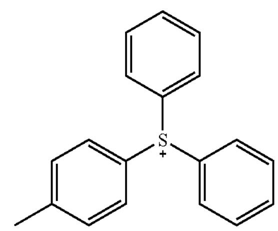
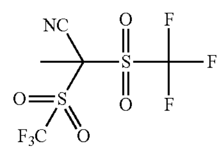
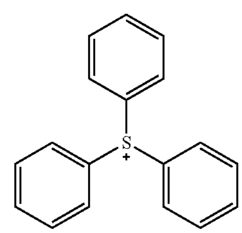
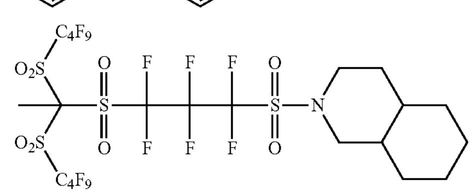
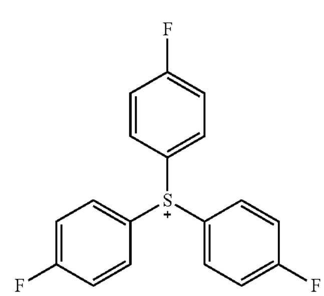

-continued
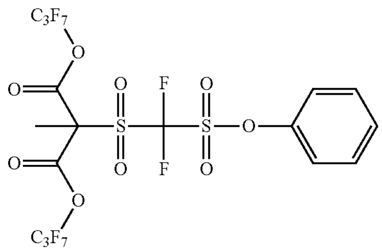
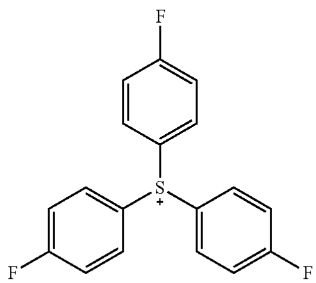
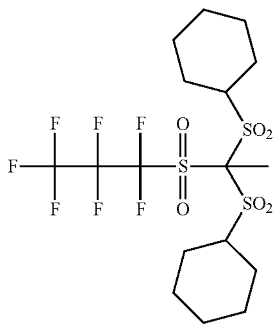
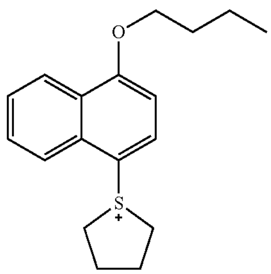
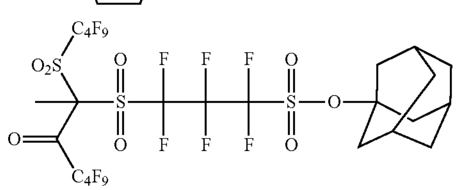
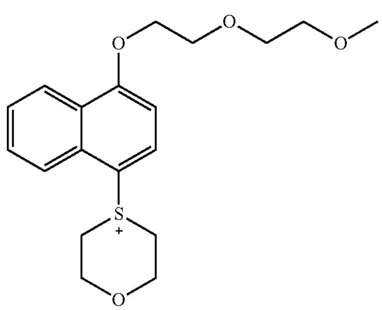
-continued
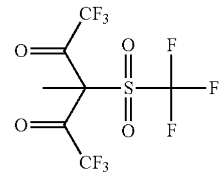
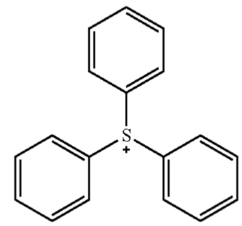
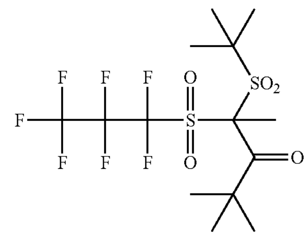
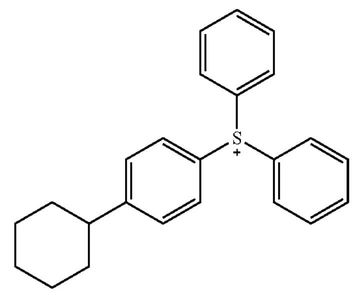
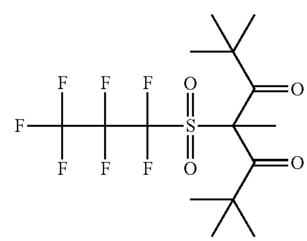
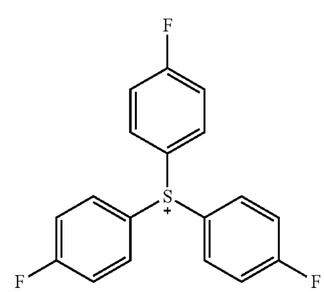
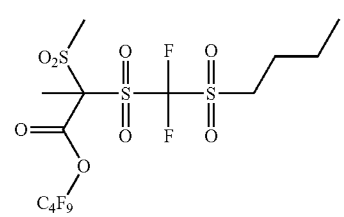

-continued
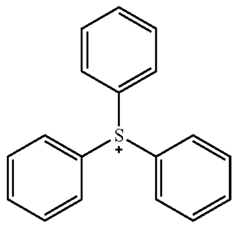
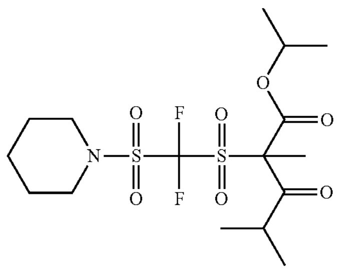
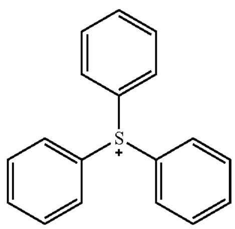
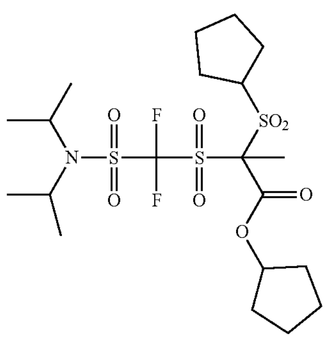
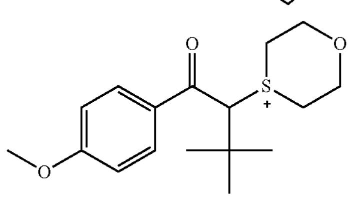
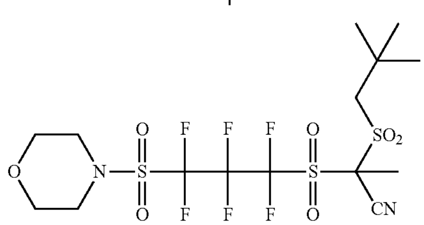
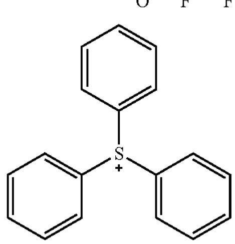
-continued
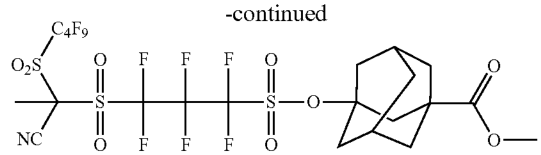
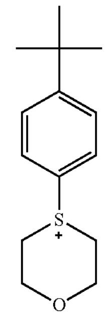
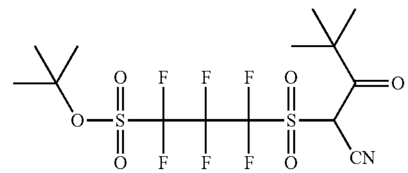
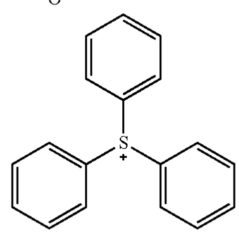
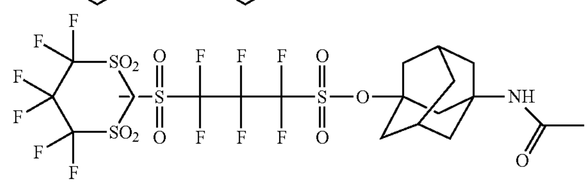
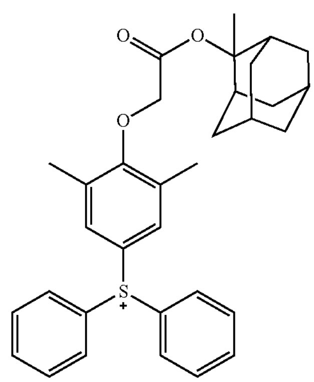
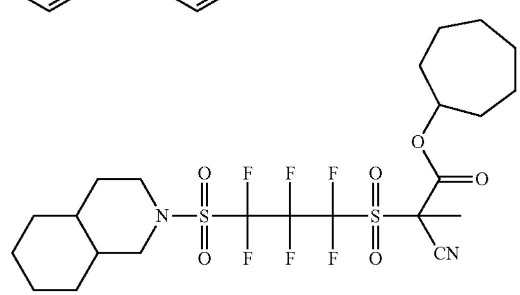
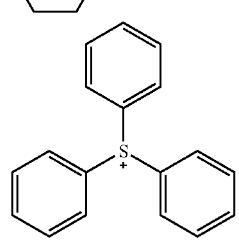

-continued

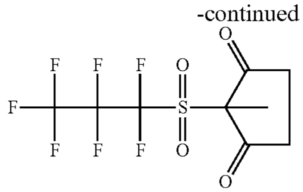

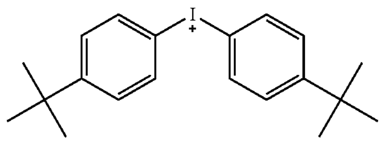

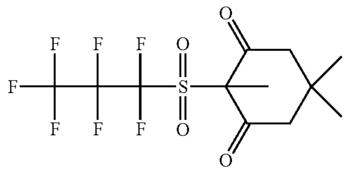

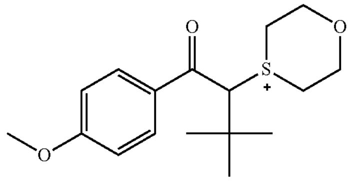

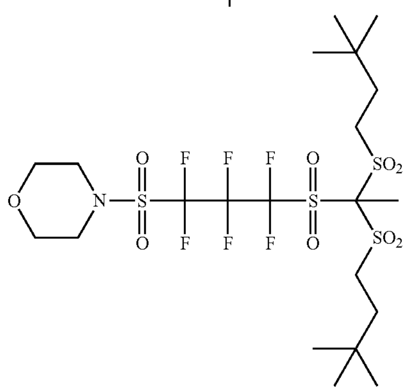

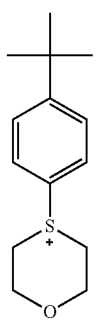

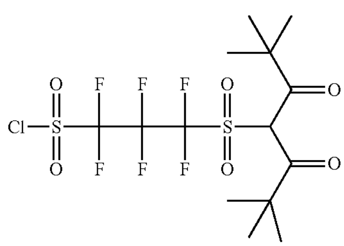

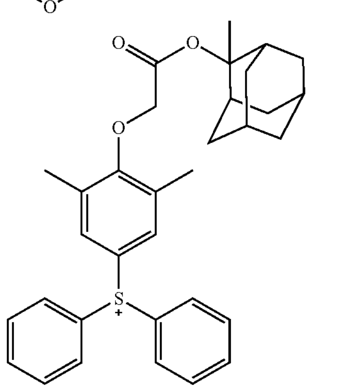

-continued

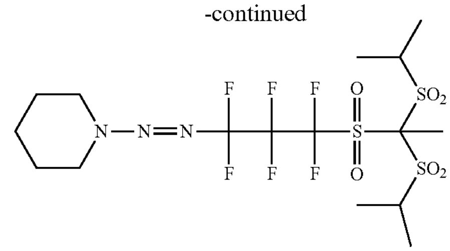

The specific compound can be used as both a photoacid generator and an acid diffusion control agent.

In a case where the specific compound is used as a photoacid generator and is used in combination with a compound (DC) which can be used as an acid diffusion control agent which will be described later, it is preferable that an acid generated from the specific compound serves as a strong acid relative to an acid generated from the compound (DC).

In a case where the specific compound is used as an acid diffusion control agent, it is preferable to use a photoacid generator in combination such that an acid generated from the photoacid generator serves as a strong acid relative to the acid generated from the specific compound.

In addition, in a case where the specific compound has an anion group as $R_c$, both a methide anion salt and a salt of an anion as $R_c$ are present in the specific compound. In a case where an acid of the methide anion salt serves as a strong acid relative to an acid of the anion as $R_c$, the methide anion salt can function as a photoacid generator and the salt of the anion as $R_c$ can function as an acid diffusion control agent. On the other hand, in a case where the acid of the methide anion salt is a weak acid relative to the acid of the anion salt as $R_c$, the methide anion salt can function as an acid diffusion control agent and the salt of the anion as $R_c$ can function as a photoacid generator.

In a case where the specific compound has an anion group as $R_c$ as above, one compound can function as a photoacid generator and an acid diffusion control agent.

The specific compound can be synthesized by a known method, but is preferably synthesized by the following method.

In a case where $R_c$ is not an anion group, the specific compound can be synthesized, for example, by the following scheme. In the following scheme, $R_a$, $R_b$, $R_c$, $L_1$, $L_2$, Rd, $n_1$, and $L_{01}$ have the same definitions as $R_a$, $R_b$, $R_c$, $L_1$, $L_2$, Rd, $n_1$, and $L_{01}$ in General Formula (I-1), respectively. $M^+$ corresponds to a case where n represents 1 in $nM^+$ in General Formula (I-1). X represents a leaving group.

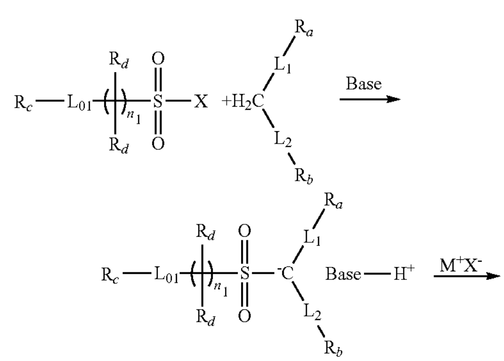

-continued

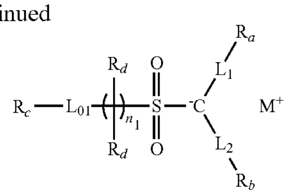

Specifically, the specific compound can be synthesized by allowing a sulfonyl halide compound and a methylene compound to act in the presence of a base to synthesize a methide compound, and then allowing an onium compound to act therein.

In addition, in a case where $R_c$ is an anion group, the specific compound can be synthesized, for example, by the following scheme. In the following scheme, $R_a$, $R_b$, $R_c$, $L_1$, $L_2$, $R_d$, $n_1$, and $L_{01}$ have the same definitions as $R_a$, $R_b$, $R_c$, $L_1$, $L_2$, $R_d$, $n_1$, and $L_{01}$ in General Formula (I-1), respectively. $M^+$ corresponds to a case where n represents 2 in $nM^+$ in General Formula (I-1). X represents a leaving group.

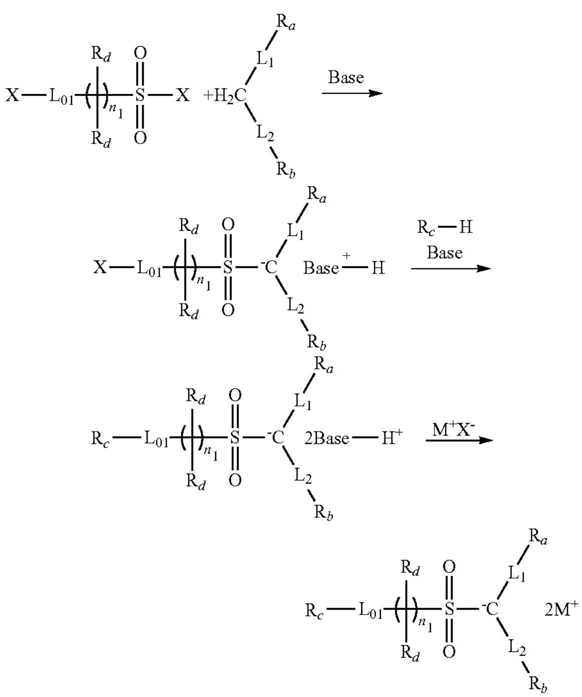

Specifically, a sulfonyl halide compound and a methylene compound are allowed to act in the presence of a base to synthesize the methide compound. An anion group precursor $R_c$—H is allowed to act on the obtained methide compound in the presence of a base to synthesize a divalent compound. Finally, an onium compound can be allowed to act on the compound to synthesize the specific compound.

The specific compound may be in a form of a low-molecular-weight compound or a form incorporated into a part of a polymer. In addition, a combination of the form of a low-molecular-weight compound and the form incorporated into a part of a polymer may also be used.

The specific compound is preferably in the form of a low-molecular-weight compound.

In a case where the specific compound is in the form of a low-molecular-weight compound, the molecular weight is preferably 3,000 or less, more preferably 2,500 or less, and still more preferably 2,000 or less.

The content of the specific compound is preferably 0.1% to 50% by mass, more preferably 0.5% to 45% by mass, and still more preferably 3% to 40% by mass with respect to the total solid content of the composition.

The specific compounds may be used alone or in combination of two or more kinds thereof. In a case where two or more kinds of such other photoacid generators are used, a total content thereof is preferably within the suitable content range.

<Resin>

The resin included in the composition of the embodiment of the present invention is preferably an acid-decomposable resin (hereinafter also referred to as a "resin A").

The acid-decomposable resin usually has a repeating unit having a group having a polarity that increases through decomposition by the action of an acid (hereinafter also referred to as an "acid-decomposable group").

In the pattern forming method of an embodiment of the present invention, typically, in a case where an alkali developer is adopted as the developer, a positive tone pattern is suitably formed, and in a case where an organic developer is adopted as the developer, a negative tone pattern is suitably formed.

(Repeating Unit Having Acid-Decomposable Group)

The resin A preferably has a repeating unit having an acid-decomposable group.

The acid-decomposable group preferably has a structure in which a polar group is protected by a group that leaves through decomposition by the action of an acid (leaving group).

Examples of the polar group include an acidic group (a group which dissociates in a 2.38%-by-mass aqueous tetramethylammonium hydroxide solution), such as a carboxy group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol group (for example, a hexafluoroisopropanol group) having the α-position substituted with an electron-withdrawing group such as a fluorine atom is excluded as a hydroxyl group. The alcoholic hydroxyl group is preferably a hydroxyl group having an acid dissociation constant (pKa) of 12 to 20.

As the polar group, the carboxy group, the phenolic hydroxyl group, the fluorinated alcohol group (preferably a hexafluoroisopropanol group), or the sulfonic acid group is preferable.

The group which is preferable as the acid-decomposable group is a group in which a hydrogen atom is substituted with a group (leaving group) that leaves by the action of an acid.

Examples of the group (leaving group) that leaves by the action of an acid include $—C(R_{36})(R_{37})(R_{38})$, $—C(R_{36})(R_{37})(OR_{39})$, and $—C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group as each of $R_{36}$ to $R_{39}$, $R_{01}$, and $R_{02}$ may be either a monocycle or polycycle. As the monocycle, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycycle, a cycloalkyl group having 6 to 20 carbon atoms is preferable, and examples thereof include an adamantyl group, a norbornyl group, an isobornyl group, a camphanyl group, a dicyclopentyl group, an a-pinene group, a tricyclodecanyl group, a tetracyclododecyl group, and an androstanyl group. Furthermore, one or more carbon atoms in the cycloalkyl group may be substituted with heteroatoms such as an oxygen atom.

The aryl group as each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group as each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a (monocyclic or polycyclic) cycloalkyl group. As the monocyclic cycloalkyl group, a cyclopentyl group or a cyclohexyl group is preferable, and as the polycyclic cycloalkyl group, a norbornyl group, a tetracyclodecanyl group, a tetracyclododecanyl group, or an adamantyl group is preferable.

The acid-decomposable group preferably has a tertiary alkyl ester group, an acetal group, a cumyl ester group, an enol ester group, or an acetal ester group, and more preferably has the acetal group or the tertiary alkyl ester group.

The resin A preferably has a repeating unit represented by General Formula (AI) as a repeating unit having an acid-decomposable group.

(AI)

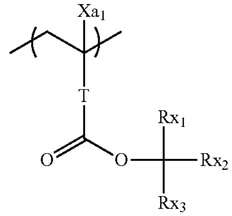

In General Formula (AI), T represents a single bond or a divalent linking group.

Examples of the divalent linking group of T include an alkylene group, an arylene group, —COO—Rt-, and —O—Rt-. In the formulae, Rt represents an alkylene group, a cycloalkylene group, or an arylene group.

T is preferably the single bond or —COO—Rt-. Rt is preferably a chain alkylene group having 1 to 5 carbon atoms, and more preferably $—CH_2—$, $—(CH_2)_2—$, or $—(CH_2)_3—$.

T is more preferably the single bond.

In General Formula (AI), $Xa_1$ represents a hydrogen atom, a halogen atom, or a monovalent organic group.

$Xa_1$ is preferably a hydrogen atom or an alkyl group.

The alkyl group of $Xa_1$ may have a substituent, and examples of the substituent include a hydroxyl group and a halogen atom (preferably a fluorine atom).

The alkyl group of $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably the methyl group.

In General Formula (AI), $Rx_1$ to $Rx_3$ each independently represent an alkyl group or a cycloalkyl group.

Any two of $Rx_1$, $Rx_2$, or $Rx_3$ may or may not be bonded to each other to form a ring structure.

The alkyl group of each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like. The alkyl group preferably has 1 to 10 carbon atoms, more preferably has 1 to 5 carbon atoms, and still more preferably has 1 to 3 carbon atoms. In the alkyl groups of each of $Rx_1$, $Rx_2$, and $Rx_3$, a part of carbon-carbon bonds may be a double bond.

The cycloalkyl group of each of $Rx_1$, $Rx_2$, and $Rx_3$ may be either a monocycle or a polycycle. Examples of the monocyclic cycloalkyl group include a cyclopentyl group and a cyclohexyl group. Examples of the polycyclic cycloalkyl group include a norbornyl group, a tetracyclodecanyl group, a tetracyclododecanyl group, and an adamantyl group.

A ring formed by the bonding of two of $Rx_1$, $Rx_2$, and $Rx_3$ may be either a monocycle or a polycycle. Examples of the monocycle include monocyclic cycloalkane rings such as a cyclopentyl ring, a cyclohexyl ring, a cycloheptyl ring, and a cyclooctane ring. Examples of the polycycle include polycyclic cycloalkyl rings such as a norbornane ring, a tetracyclodecane ring, a tetracyclododecane ring, and an adamantane ring. Among these, the cyclopentyl ring, the cyclohexyl ring, or the adamantane ring is preferable.

In addition, as a ring formed by the bonding of two of $Rx_1$, $Rx_2$, and $Rx_3$, a ring shown below is also preferable.

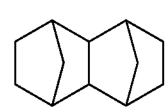 [SMILES: C1CC2CC1C1C3CCC(C3)C21]

Specific examples of the monomer corresponding to the repeating unit represented by General Formula (AI) are shown below. The following specific examples correspond to a case where $Xa_1$ in General Formula (AI) is a methyl group, but $Xa_1$ can be optionally substituted with a hydrogen atom, a halogen atom, or a monovalent organic group.

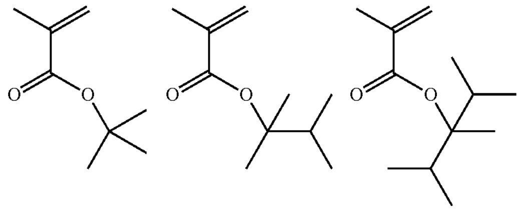
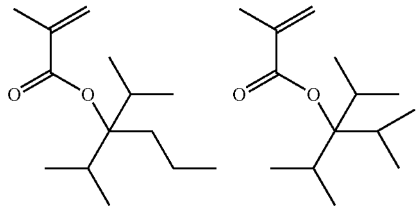
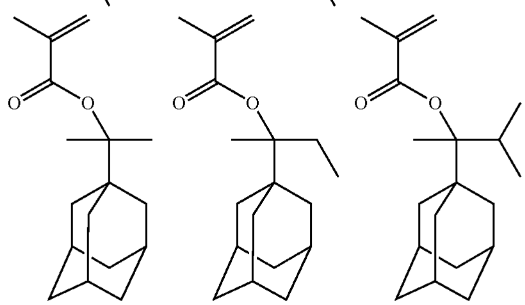
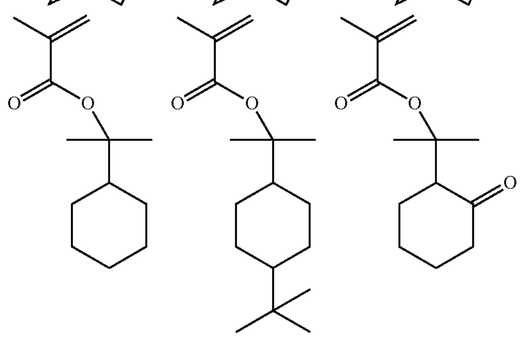
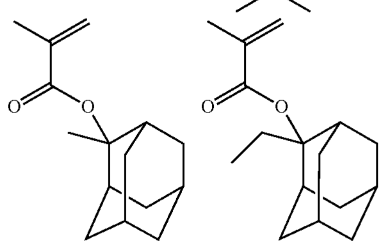
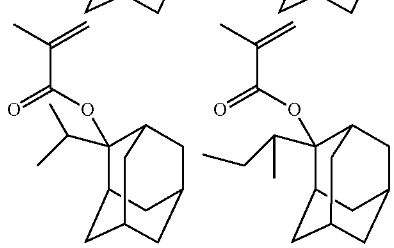
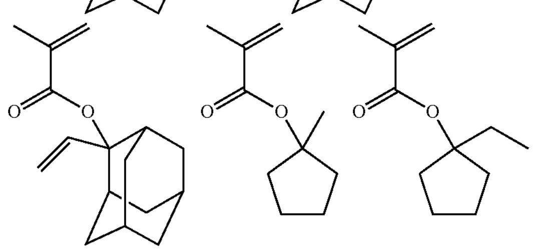
-continued
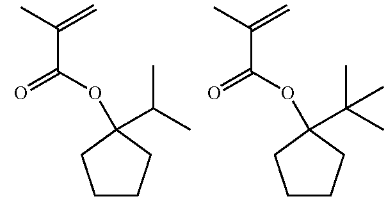
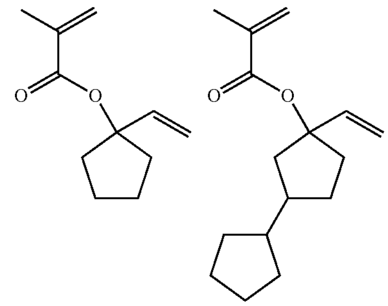
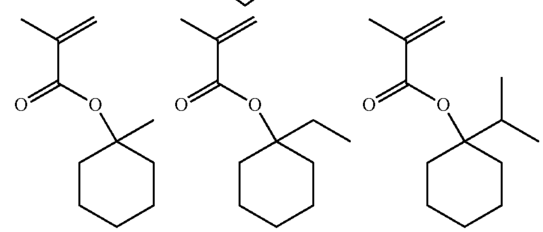
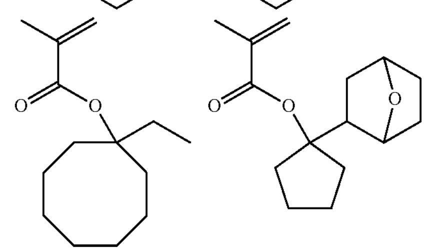
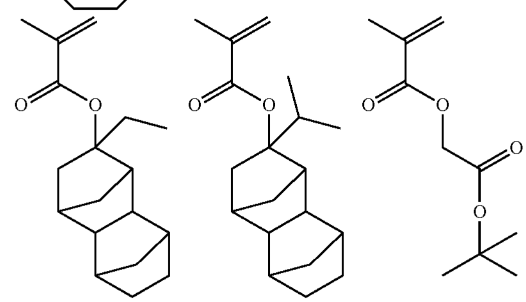
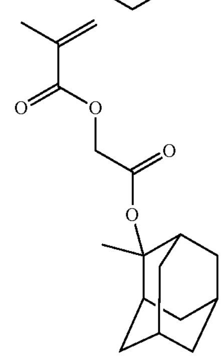
It is also preferable that the resin A has the repeating unit described in paragraphs [0336] to [0369] of the specification of US2016/0070167A1 as the repeating unit having an acid-decomposable group.

Furthermore, the resin A may have a repeating unit including a group that decomposes by the action of an acid to produce an alcoholic hydroxyl group described in paragraphs [0363] to [0364] of the specification of US2016/0070167A1 as a repeating unit having an acid-decomposable group.

The content of the repeating unit having an acid-decomposable group included in the resin A is preferably 10% to 90% by mole, more preferably 20% to 80% by mole, and still more preferably 30% to 70% by mole with respect to all the repeating units of the resin A.

The resin A may have the repeating units having an acid-decomposable group alone or in combination of two or more kinds thereof. In a case where the resin A has two or more kinds of the repeating units, the total content thereof is preferably within the suitable content range.

(Repeating Unit Having at Least One Selected from Group Consisting of Lactone Structure, Sultone Structure, and Carbonate Structure)

The resin A preferably has a repeating unit having at least one selected from the group consisting of a lactone structure, a sultone structure, and a carbonate structure.

As the lactone structure or the sultone structure, any structure which has a lactone ring or sultone ring may be used, but a lactone structure having a 5- to 7-membered ring or a sultone structure having a 5- to 7-membered ring is preferable.

A lactone structure in which another ring is fused with the 5- to 7-membered lactone ring so as to form a bicyclo structure or a spiro structure is also preferable. A sultone structure in which another ring is fused with a 5- to 7-membered sultone ring so as to form a bicyclo structure or a spiro structure is also preferable.

Among those, the resin A preferably has a repeating unit having a lactone structure represented by any of General Formulae (LC1-1) to (LC1-22) or a sultone structure represented by any of General Formulae (SL1-1) to (SL1-3). In addition, a lactone structure or sultone structure may be bonded directly to the main chain.

Among those, the lactone structure represented by General Formula (LC1-1), General Formula (LC1-4), General Formula (LC1-5), General Formula (LC1-8), General Formula (LC1-16), General Formula (LC1-21), or General Formula (LC1-22), or the sultone structure represented by General Formula (SL1-1) is preferable.

LC1-1

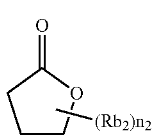

LC1-2

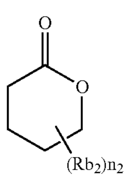

LC1-3

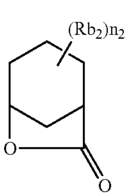

-continued

LC1-4

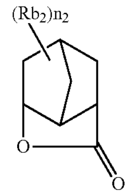

LC1-5

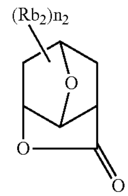

LC1-6

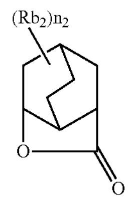

LC1-7

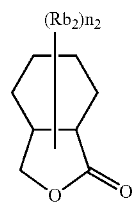

LC1-8

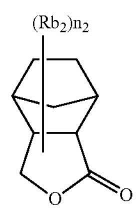

LC1-9

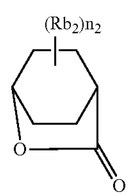

LC1-10

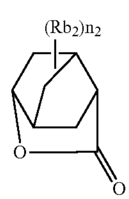

LC1-11

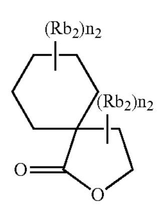

-continued

LC1-12

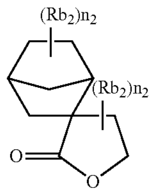

LC1-13

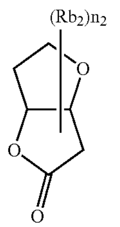

LC1-14

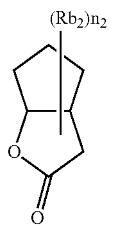

LC1-15

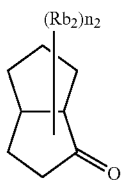

LC1-16

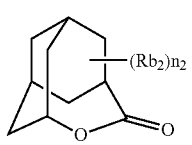

LC1-17

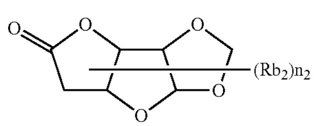

LC1-18

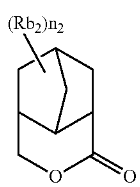

LC1-19

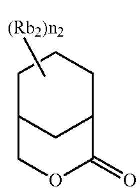

-continued

LC1-20

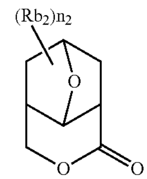

LC1-21

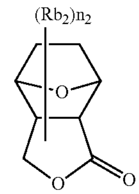

LC1-22

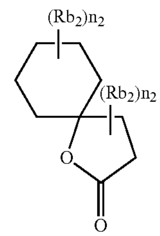

SL1-1

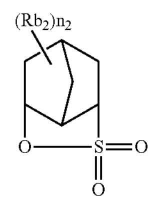

SL1-2

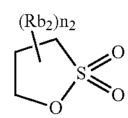

SL1-3

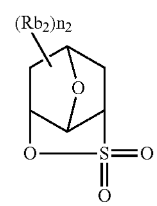

The lactone structure or the sultone structure may or may not have a substituent ($Rb_2$). As the substituent ($Rb_2$), an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, or an acid-decomposable group is preferable, and an alkyl group having 1 to 4 carbon atoms, the cyano group, or the acid-decomposable group is more preferable. $n_2$ represents an integer of 0 to 4. In a case where $n_2$ is 2 or more, the substituents ($Rb_2$) which are present in a plural number may be the same as or different from each other. In addition, the substituents ($R_{b2}$) which are present in a plural number may be bonded to each other to form a ring.

As the repeating unit having a lactone structure or a sultone structure, a repeating unit represented by General Formula (III) is preferable.

(III)

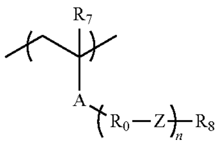

In General Formula (III),

A represents an ester bond (a group represented by —COO—) or an amide bond (a group represented by —CONH—).

n is the number of repetitions of the structure represented by —$R_0$—Z—, represents an integer of 0 to 5, and is preferably 0 or 1, and more preferably 0. In a case where n is 0, (—$R_0$—Z—)n is a single bond.

$R_0$ represents an alkylene group, a cycloalkylene group, or a combination thereof. In a case where $R_0$'s are present in a plural number, $R_0$'s which are present in a plural number may be the same as or different from each other.

The alkylene group or the cycloalkylene group of $R_0$ may have a substituent.

Z represents a single bond, an ether bond, an ester bond, an amide bond, a urethane bond, or a urea bond. In a case where Z's are present in a plural number, Z's may be the same as or different from each other.

Among those, Z is preferably an ether bond or an ester bond, and more preferably the ester bond.

$R_8$ represents a monovalent organic group having a lactone structure or a sultone structure.

Among those, any of the structures represented by General Formulae (LC1-1) to (LC1-22) and the structures represented by General Formulae (SL1-1) to (SL1-3) is preferably a group obtained by removing one hydrogen atom from one carbon atom constituting the lactone structure or the sultone structure. In addition, it is preferable that the carbon atom from which one hydrogen atom is removed is not a carbon atom constituting the substituent ($Rb_2$).

$R_7$ represents a hydrogen atom, a halogen atom, or a monovalent organic group (preferably a methyl group).

Examples of a monomer corresponding to the repeating unit having at least one selected from the group consisting of a lactone structure and a sultone structure are shown below.

In the following examples, the methyl group bonded to the vinyl group may be substituted with a hydrogen atom, a halogen atom, or a monovalent organic group.

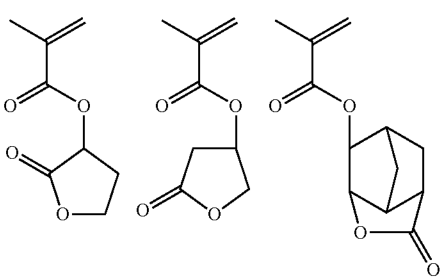

-continued

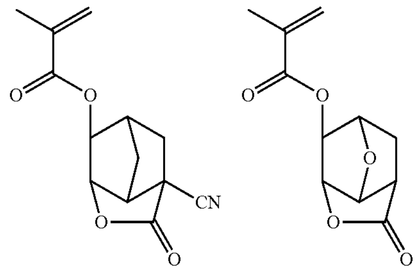

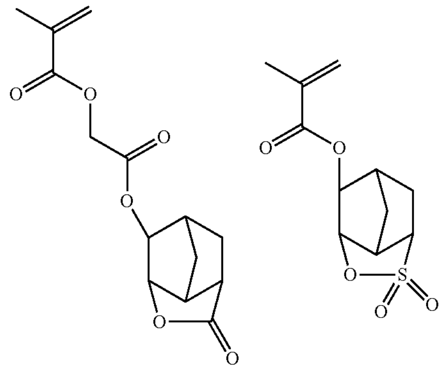

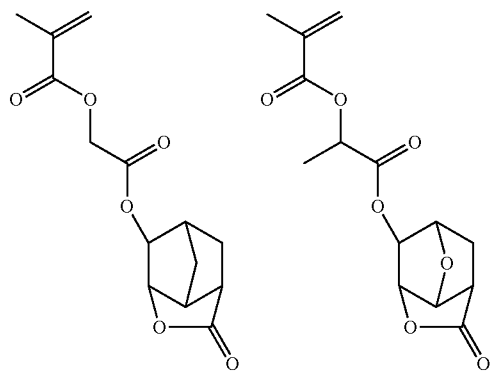

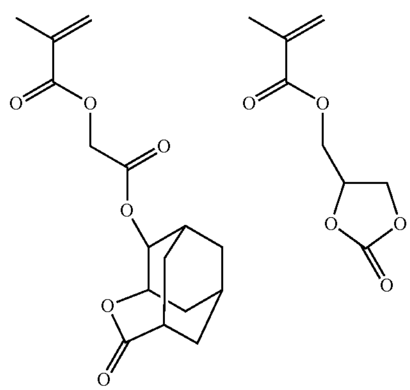

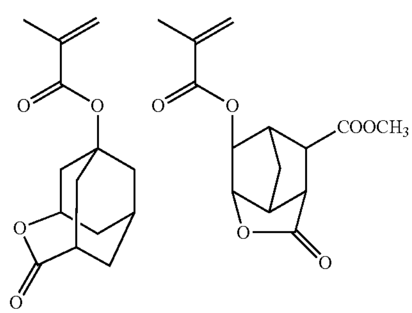

-continued

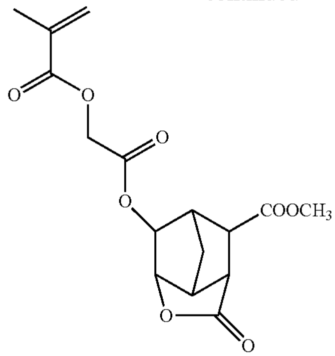

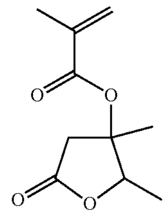

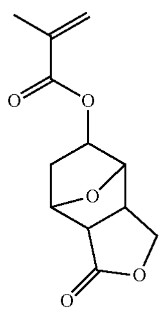

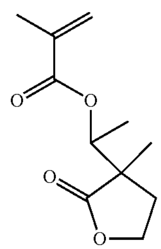

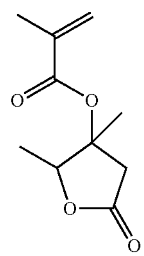

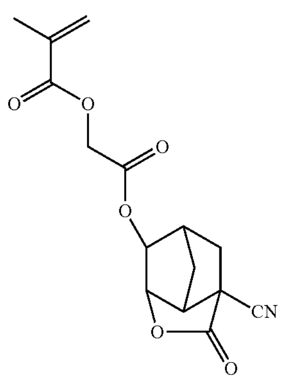

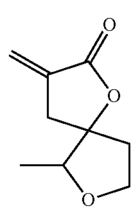

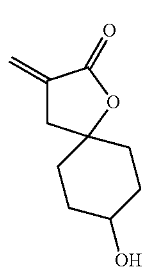

The resin A may have a repeating unit having a carbonate structure. As the carbonate structure, a cyclic carbonic acid ester structure is preferable.

As the repeating unit having a cyclic carbonic acid ester structure, a repeating unit represented by General Formula (A-1) is preferable.

(A-1)

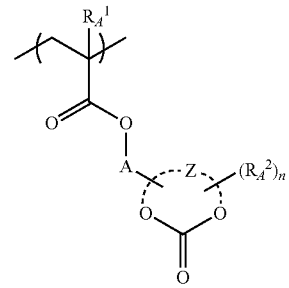

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in a plural number may be the same as or different from each other.

A represents a single bond or a divalent linking group.

Z represents an atomic group that forms a monocycle or polycycle with a group represented by —O—CO—O— in the formula.

The resin A preferably includes the repeating unit described in paragraphs [0370] to [0414] of the specification of US2016/0070167A1 as a repeating unit having at least one selected from the group consisting of a lactone structure, a sultone structure, and a carbonate structure.

In a case where the resin A has a repeating unit having at least one selected from the group consisting of a lactone structure, a sultone structure, and a carbonate structure, the content of the repeating unit having at least one selected from the group consisting of a lactone structure, a sultone structure, and a carbonate structure included in the resin A is preferably 5% to 70% by mole, more preferably 10% to 65% by mole, and still more preferably 20% to 60% by mole with respect to all the repeating units in the resin A.

The resin A may have only one kind or two or more kinds of repeating units having at least one selected from the group consisting of a lactone structure, a sultone structure, and a carbonate structure. In a case where the resin A has two or more kinds of the repeating units, the total content thereof is preferably within the suitable content range.

(Repeating Unit Having Polar Group)

The resin A may have a repeating unit having a polar group, in addition to the above-mentioned repeating units.

Examples of the polar group include a hydroxyl group, a cyano group, a carboxy group, and a fluorinated alcohol group.

The repeating unit having a polar group is preferably a repeating unit having an alicyclic hydrocarbon structure substituted with a polar group. In addition, the repeating unit having a polar group preferably does not have an acid-decomposable group. The alicyclic hydrocarbon structure in the alicyclic hydrocarbon structure substituted with a polar group is preferably an adamantyl group or a norbornane group.

Specific examples of a monomer corresponding to the repeating unit having a polar group are shown below, but the present invention is not limited to these specific examples.

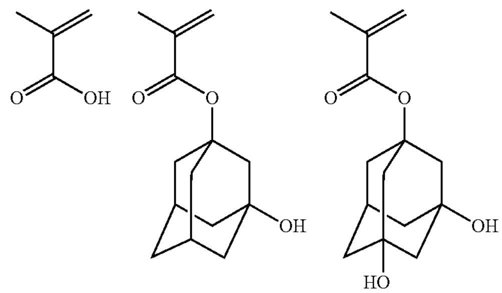

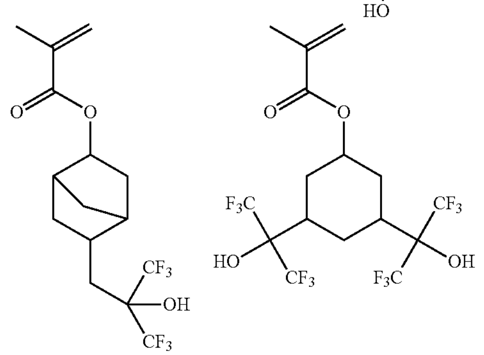

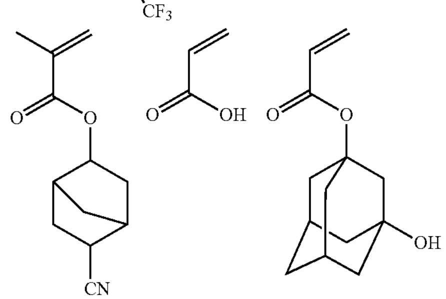

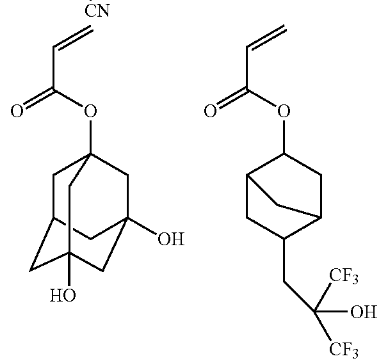

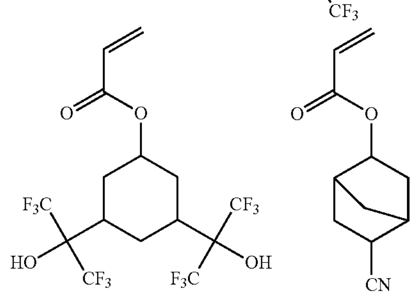

In addition to these, specific examples of the repeating unit having a polar group include the repeating units disclosed in paragraphs [0415] to [0433] of the specification of US2016/0070167A1.

In a case where the resin A has a repeating unit having a polar group, a content of the repeating unit having a polar group is preferably 5% to 40% by mole, more preferably 5% to 30% by mole, and still more preferably 10% to 25% by mole with respect to all the repeating units in the resin A.

The resin A may have only one kind or two or more kinds of the repeating units having a polar group. In a case where the resin A has two or more kinds of the repeating units, the total content thereof is preferably within the suitable content range.

(Repeating Unit Having Neither Acid-Decomposable Group Nor Polar Group)

The resin A may further have a repeating unit having neither an acid-decomposable group nor a polar group, in addition to the above-mentioned repeating units. The repeating unit having neither an acid-decomposable group nor a polar group preferably has an alicyclic hydrocarbon structure such as an alicyclic group. Examples of the repeating unit having neither an acid-decomposable group nor a polar group include the repeating units described in paragraphs [0236] and [0237] of the specification of US2016/0026083A1. Preferred examples of a monomer corresponding to the repeating unit having neither an acid-decomposable group nor a polar group are shown below.

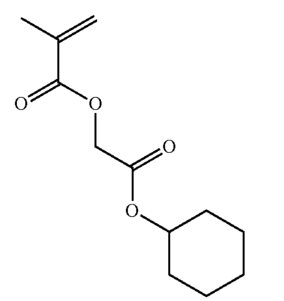

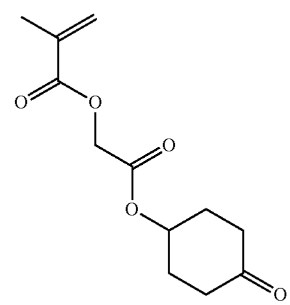

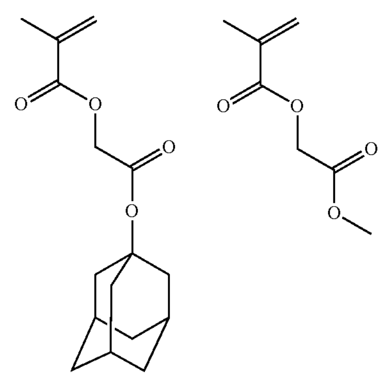

-continued

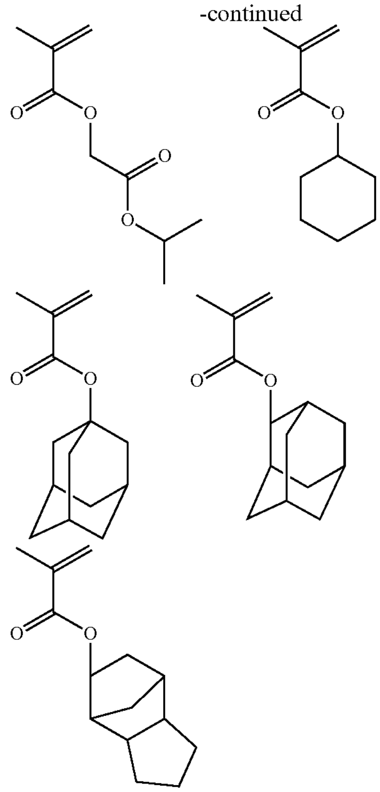

In addition to these, specific examples of the repeating unit having neither an acid-decomposable group nor a polar group include the repeating unit disclosed in paragraph [0433] of the specification of US2016/0070167A1.

In a case where the resin A has the repeating unit having neither an acid-decomposable group nor a polar group, the content of the repeating unit having neither an acid-decomposable group nor a polar group is preferably 5% to 40% by mole, more preferably 5% to 30% by mole, and still more preferably 5% to 25% by mole with respect to all the repeating units in the resin A. The resin A may have only one kind or two or more kinds of the repeating units having neither an acid-decomposable group nor a polar group. In a case where the resin A has two or more kinds of the repeating units, the total content thereof is preferably within the suitable content range.

The resin A may have a variety of repeating structural units, in addition to the above-mentioned repeating structural units, for the purpose of controlling dry etching resistance, suitability for a standard developer, adhesiveness to a substrate, and a resist profile, resolving power, heat resistance, sensitivity, and the like which are general characteristics required for a resist.

Examples of such a repeating structural unit include a repeating structural unit corresponding to a predetermined monomer, but are not limited thereto.

Examples of a predetermined monomer include a compound having one addition-polymerizable unsaturated bond, selected from (meth)acrylic acid esters, (meth)acrylamides, allyl compounds, vinyl ethers, and vinyl esters.

In addition to these, an addition-polymerizable unsaturated compound that is copolymerizable with a monomer corresponding to the various repeating structural units may be used.

In the resin A, the content molar ratio of each repeating structural unit is appropriately set in order to adjust various performances.

In a case where the composition of the embodiment of the present invention is used for ArF exposure, it is preferable that the resin A has substantially no aromatic group from the viewpoint of transparency to ArF light. More specifically, the repeating unit having an aromatic group is preferably 5% by mole or less, more preferably 3% by mole or less, and ideally 0% by mole with respect to all the repeating units in the resin A, that is, it is still more preferable that the repeating unit having an aromatic group is not included. In addition, the resin A preferably has a monocyclic or polycyclic alicyclic hydrocarbon structure.

The resin A is preferably a (meth)acrylic ester-based resin, and more preferably the methacrylic ester-based resin.

The (meth)acrylic ester-based resin (or the methacrylic ester-based resin) has a content of the (meth)acrylate-based repeating unit (or methacrylate-based repeating unit) of 80% by mole or more, preferably 90% by mole or more, more preferably 95% by mole or more, and still more preferably 99% by mole or more with respect to all the repeating units of the resin A.

In the resin A, all the repeating units may be constituted with the (meth)acrylate-based repeating units. In this case, all of the repeating units may be the methacrylate-based repeating units, all of the repeating units may be the acrylate-based repeating units, and all of the repeating units are a combination of the methacrylate-based repeating units and the acrylate-based repeating units. Above all, the content of the acrylate-based repeating units is preferably 50% by mole or less with respect to all the repeating units of the resin A.

In addition, as the resin A, a known resin can be appropriately used. For example, the known resins disclosed in paragraphs [0055] to [0191] of the specification of US2016/0274458A1, paragraphs [0035] to [0085] of the specification of US2015/0004544A1, and paragraphs [0045] to [0090] of the specification of US2016/0147150A1 can be suitably used as the resin A.

In a case where the composition of the embodiment of the present invention is for KrF exposure, EB exposure, or EUV exposure, the resin A preferably has a repeating unit having an aromatic hydrocarbon group, and more preferably has a repeating unit including a phenolic hydroxyl group. Examples of the repeating unit including a phenolic hydroxyl group include a hydroxystyrene-based repeating unit and a hydroxystyrene (meth)acrylate-based repeating unit.

In a case where the composition of the embodiment of the present invention is for KrF exposure, EB exposure, or EUV exposure, it is preferable that the resin A has a structure in which a hydrogen atom of the phenolic hydroxyl group is protected with a group (leaving group) that leaves through decomposition by the action of an acid.

In this case, the content of the repeating unit having an aromatic hydrocarbon group included in the resin A is preferably 30% to 100% by mole, more preferably 40% to 100% by mole, and still more preferably 50% to 100% by mole with respect to all the repeating units in the resin A.

The weight-average molecular weight of the resin A is preferably 1,000 to 200,000, more preferably 2,000 to 20,000, and still more preferably 3,000 to 19,000. The dispersity (Mw/Mn) is usually 1.00 to 3.00, preferably 1.00 to 2.60, more preferably 1.00 to 2.00, and still more preferably 1.10 to 2.00.

The resin A may be used alone or in combination of two or more kinds thereof.

The content of the resin A in the composition is usually 20% by mass or more, preferably 40% by mass or more, more preferably 50% by mass or more, and still more preferably 60% by mass or more with respect to the total solid content in the composition. The upper limit is not particularly limited, but is preferably 95% by mass or less, and more preferably 90% by mass or less.

In a case where two or more kinds of the resins A are used in the composition, the total content thereof is preferably within the suitable content range.

Furthermore, the solid content is intended to be components excluding the solvent in the composition, and any of components other than the solvent are regarded as the solid content even in a case where they are liquid components.

<Photoacid Generator>

The composition of the embodiment of the present invention may or may not contain a photoacid generator (hereinafter also referred to as a "photoacid generator" or a "photoacid generator C") which does not correspond to the specific compound.

The photoacid generator is a compound that generates an acid upon irradiation with actinic rays or radiation.

As the photoacid generator, a compound that generates an organic acid upon irradiation with actinic rays or radiation is preferable. Examples thereof can include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

As the photoacid generators, known compounds that generate an acid upon irradiation with actinic rays or radiation can be used alone or as a mixture thereof, appropriately selected and used. For example, the known compounds disclosed in paragraphs [0125] to [0319] of the specification of US2016/0070167A1, paragraphs [0086] to [0094] of the specification of US2015/0004544A1, and paragraphs [0323] to [0402] of the specification of US2016/0237190A1 can be suitably used as the photoacid generator C.

Suitable aspects of the photoacid generator C include compounds represented by General Formulae (ZI), (ZII), and (ZIII).

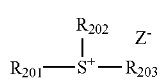

(ZI)

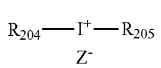

(ZII)

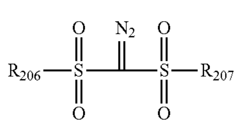

(ZIII)

In General Formula (ZI), $R_{201}$, $R_{202}$, and $R_{203}$ have the same definitions as $R_{201}$, $R_{202}$, and $R_{203}$ in General Formula (ZIA), respectively.

$Z^-$ represents an anion.

Next, General Formulae (ZII) and (ZIII) will be described.

In General Formula (ZII), $R_{204}$ and $R_{205}$ have the same definitions as $R_{204}$ and $R_{205}$ in General Formula (ZIIA). $Z^-$ represents an anion.

In General Formula (ZIII), $R_{206}$ and $R_{207}$ each independently represent an aryl group, an alkyl group, or a cycloalkyl group. Examples of the aryl group, the alkyl group, and the cycloalkyl group in $R_{206}$ and $R_{207}$ in General Formula (ZIII) include the same ones as the groups described as the aryl group, the alkyl group, and the cycloalkyl group in $R_{204}$ and $R_{205}$ in General Formula (ZIIA), respectively.

As $Z^-$ in General Formula (ZI) and $Z^-$ in General Formula (ZII), an anion represented by General Formula (3) is preferable.

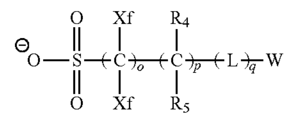

(3)

In General Formula (3), o represents an integer of 1 to 3. p represents an integer of 0 to 10. q represents an integer of 0 to 10.

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where a plurality of $R_4$'s and $R_5$'s are present, they may be the same as or different from each other.

L represents a divalent linking group, and in a case where a plurality of L's are present, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, the alkyl group substituted with at least one fluorine atom is preferably a perfluoroalkyl group.

Xf is preferably the fluorine atom or the perfluoroalkyl group having 1 to 4 carbon atoms. Xf is more preferably the fluorine atom or $CF_3$. It is particularly preferable that both Xf's are the fluorine atoms.

$R_4$ and $R_5$ each independently represent a hydrogen atom, a fluorine atom, an alkyl group, or an alkyl group substituted with at least one fluorine atom. In a case where a plurality of each of $R_4$'s and $R_5$'s are present, they may be the same as or different from each other.

The alkyl group represented by each of $R_4$ and $R_5$ may have a substituent, and preferably has 1 to 4 carbon atoms. $R_4$ and $R_5$ are each preferably the hydrogen atom.

Specific examples and suitable aspects of the alkyl group substituted with at least one fluorine atom are the same as the specific examples and the suitable aspects, respectively, of Xf in General Formula (3).

L represents a divalent linking group, and in a case where a plurality of L's are present, they may be the same as or different from each other.

Examples of the divalent linking group include —COO— (—C(═O)—O—), —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 15 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO—, —OCO—, —CONH—, —$SO_2$—, —COO-alkylene group-, or —OCO-alkylene group- is more preferable.

W represents an organic group including a cyclic structure. Among these, W is preferably a cyclic organic group.

Examples of the cyclic organic group include an alicyclic group, an aryl group, and a heterocyclic group.

The alicyclic group may be either monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be either monocyclic or polycyclic. The polycyclic heterocyclic group can further suppress acid diffusion. Furthermore, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. Examples of the lactone ring and the sultone ring include the above-mentioned lactone structures and sultone structures exemplified in the resin. As the heterocyclic ring in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

Preferred examples of the anion represented by General Formula (3) include $SO_3^-$—$CF_2$—$CH_2$—OCO-(L)q'-W, $SO_3^-$—$CF_2$—CHF—$CH_2$—OCO-(L)q'-W, $SO_3^-$—$CF_2$—OCO-(L)q'-W, $SO_3^-$—$CF_2$—$CF_2$—$CH_2$—$CH_2$-(L)q-W, and $SO_3^-$—$CF_2$—CH($CF_3$)—OCO-(L)q'-W. Here, L, q, and W are each the same as in General Formula (3). q' represents an integer of 0 to 10.

In one aspect, $Z^-$ in General Formula (ZI) and $Z^-$ in General Formula (ZII), an anion represented by General Formula (4) is also preferable.

(4)

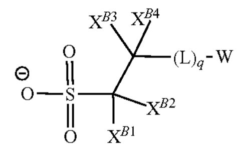

In General Formula (4), $X^{B1}$ and $X^{B2}$ each independently represent a hydrogen atom or a monovalent organic group having no fluorine atom. It is preferable that $X^{B1}$ and $X^{B2}$ are each the hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both of $X^{B3}$ and $X^{B4}$ are fluorine atoms or monovalent organic groups having a fluorine atom. It is still more preferable that both $X^{B3}$ and $X^{B4}$ are alkyl groups substituted with fluorine.

L, q, and W are the same as in General Formula (3).

As $Z^-$ in General Formula (ZI) and $Z^-$ in General Formula (ZII), an anion represented by General Formula (5) is preferable.

(5)

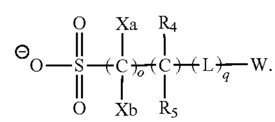

In General Formula (5), Xa's each independently represent a fluorine atom or an alkyl group substituted with at least one fluorine atom. Xb's each independently represent a hydrogen atom or an organic group having no fluorine atom. The definitions and preferred aspects of o, p, q, $R_4$, $R_5$, L, and W are each the same as in General Formula (3).

$Z^-$ in General Formula (ZI) and $Z^-$ in General Formula (ZII) may be a benzenesulfonate anion, and are each preferably a benzenesulfonate anion substituted with a branched alkyl group or a cycloalkyl group.

As $Z^-$ in General Formula (ZI) and $Z^-$ in General Formula (ZII), an aromatic sulfonate anion represented by General Formula (SA1) is also preferable.

(SA1)

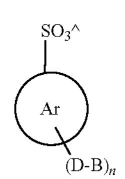

In Formula (SA1),

Ar represents an aryl group, and may further have a substituent other than a sulfonate anion and a -(D-B) group. Examples of the substituent which may be further contained include a fluorine atom and a hydroxyl group.

n represents an integer of 0 or more. n is preferably 1 to 4, more preferably 2 or 3, and most preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group consisting of a combination of two or more kinds of these.

B represents a hydrocarbon group.

Preferably, D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) include the same cations mentioned above as preferred examples of the cation as $M^+$.

Preferred examples of the anion $Z^-$ in General Formula (ZI) and General Formula (ZII) are shown below.

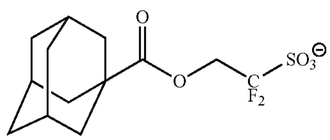

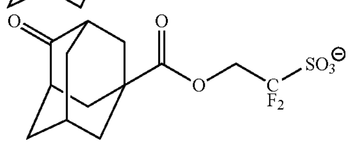

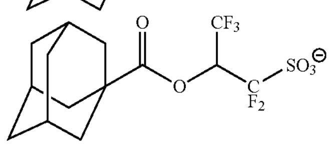

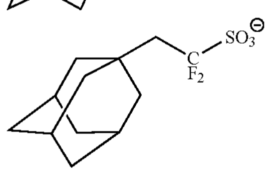

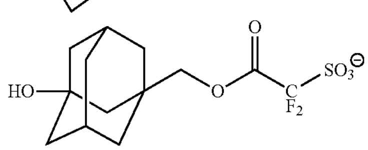

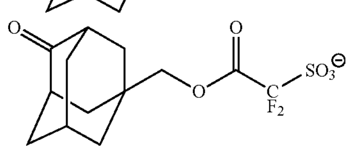

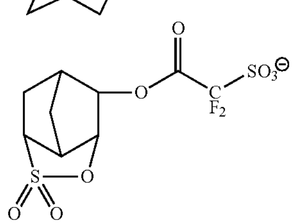

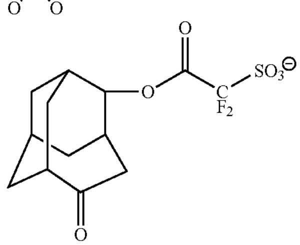

-continued

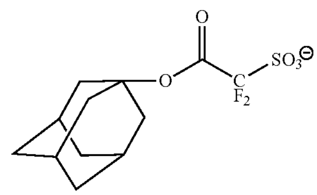

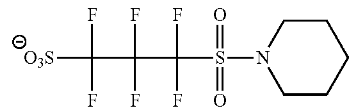

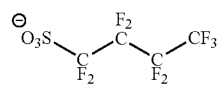

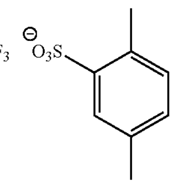

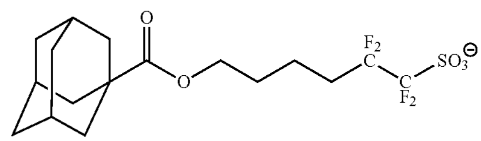

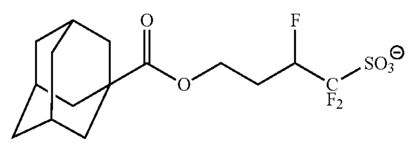

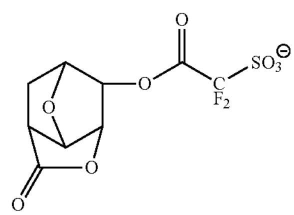

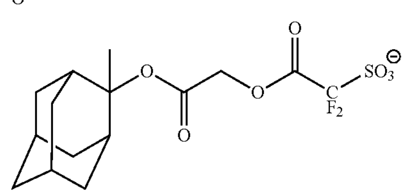

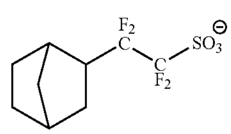

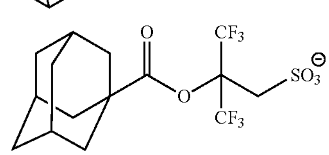

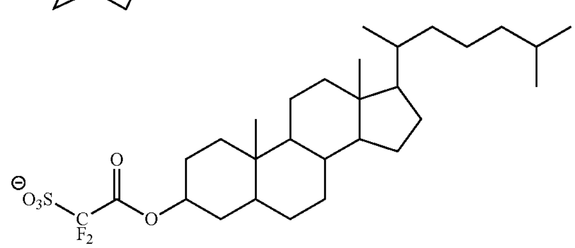

-continued

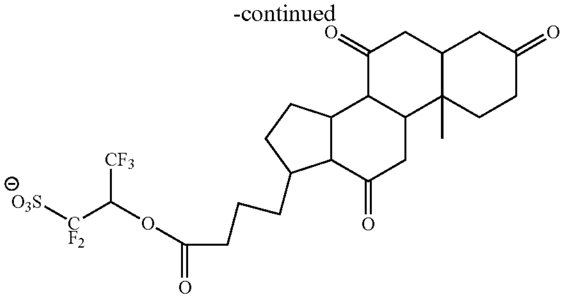

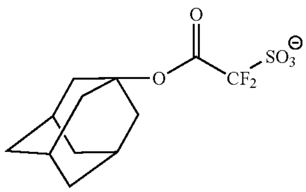

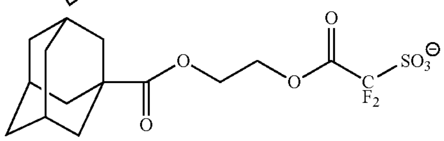

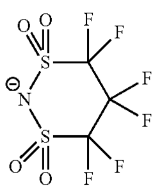

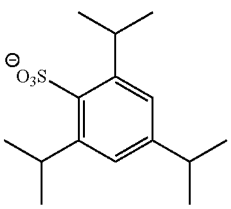

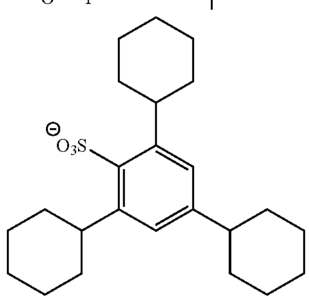

Any combination of the cations and the anions can be used as the photoacid generator.

In addition, the compounds C-1 to C-25 used in Examples can also be preferably used.

The photoacid generator C may be in a form of a low-molecular-weight compound or a form incorporated into a part of a polymer. In addition, a combination of the form of a low-molecular-weight compound and the form incorporated into a part of a polymer may also be used.

The photoacid generator C is preferably in the form of a low-molecular-weight compound.

In a case where the photoacid generator C is in the form of a low-molecular-weight compound, the molecular weight is preferably 3,000 or less, more preferably 2,000 or less, and still more preferably 1,000 or less.

The content of the photoacid generator C is preferably 0.1% to 35% by mass, more preferably 0.5% to 30% by mass, and still more preferably 1% to 25% by mass with respect to the total solid content of the composition.

The photoacid generator C may be used alone or in combination of two or more kinds thereof. In a case where two or more kinds of such other photoacid generators are used, a total content thereof is preferably within the suitable content range.

<Acid Diffusion Control Agent>

The composition of the embodiment of the present invention may or may not contain an acid diffusion control agent that does not correspond to the specific compound, but it is preferable that the composition contains the acid diffusion control agent. The acid diffusion control agent acts as a quencher that suppresses a reaction of an acid-decomposable resin in the unexposed portion by excessive generated acids by trapping the acids generated from a photoacid generator and the like upon exposure.

Examples of the acid diffusion control agent include a basic compound (DA), a basic compound (DB) whose basicity is reduced or lost upon irradiation with actinic rays or radiation, and a low-molecular-weight compound (DD) having a nitrogen atom and a group that leaves by the action of an acid. In the composition of the embodiment of the present invention, a known acid diffusion control agent can be appropriately used. For example, the known compounds disclosed in paragraphs [0627] to [0664] of US2016/0070167A1, paragraphs [0095] to [0187] of US2015/0004544A1, paragraphs [0403] to [0423] of US2016/0237190A1, and paragraphs [0259] to [0328] of US2016/0274458A1 can be suitably used as the acid diffusion control agent.

(Basic Compound (DA))

As the basic compound (DA), compounds having structures represented by Formulae (A) to (E) are preferable.

(A)

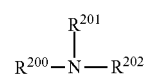

(B)

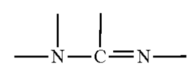

(C)

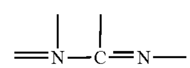

(D)

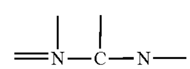

(E)

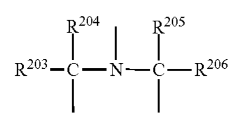

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of General Formulae (A) and (E) may have a substituent or may be unsubstituted. With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (A) and (E) are more preferably unsubstituted.

As the basic compound (DA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

(Compound (DB))

The basic compound (DB) having basicity reduced or lost upon irradiation with actinic rays or radiation (hereinafter also referred to as a "compound (DB)") is a compound which has a proton-accepting functional group, and decomposes under irradiation with actinic rays or radiation to exhibit reduced or lost proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

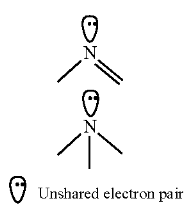

Preferred examples of the partial structure of the proton-accepting functional group include crown ether, azacrown ether, primary to tertiary amines, pyridine, imidazole, and pyrazine structures.

The compound (DB) decomposes upon irradiation with actinic rays or radiation to generate a compound exhibiting reduced or lost proton-accepting properties, or a change from the proton-accepting properties to acidic properties. Here, exhibiting reduced or lost proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (DB) having the proton-accepting functional group and the proton.

The proton-accepting properties can be confirmed by performing pH measurement.

The acid dissociation constant pKa of the compound generated by decomposition of the compound (DB) upon irradiation with actinic rays or radiation preferably is $pKa<-1$, more preferably $-13<pKa<-1$, and still more preferably $-13<pKa<-3$.

The compound (DB) is preferably a compound represented by General Formula (c-1).

$$R—B—X—A—W_1—N^-—W_2—R_f[C^+] \quad \text{(c-1)}$$

In General Formula (c-1), $W_1$ and $W_2$ each independently represent —$SO_2$— or —CO—.

$R_f$ represents an alkyl group which may have a substituent, a cycloalkyl group which may have a substituent, or an aryl group which may have a substituent.

A represents a single bond or a divalent linking group.

X represents a single bond, —$SO_2$—, or —CO—.

B represents a single bond, an oxygen atom, or —N($R_x$)$R_y$—.

$R_x$ represents a hydrogen atom or an organic group.

$R_y$ represents a single bond or a divalent organic group.

R represents a monovalent organic group having a proton-accepting functional group.

$R_x$ may be bonded to $R_y$ to form a ring, or may be bonded to R to form a ring.

[$C^+$] represents a counter cation.

It is preferable that at least one of $W_1$ or $W_2$ is —$SO_2$—, and it is more preferable that the both are —$SO_2$—.

$R_f$ is preferably an alkyl group having 1 to 6 carbon atoms, which may have a fluorine atom, more preferably a perfluoroalkyl group having 1 to 6 carbon atoms, and still more preferably a perfluoroalkyl group having 1 to 3 carbon atoms.

The divalent linking group for A is preferably a divalent linking group having 2 to 12 carbon atoms, and examples thereof include an alkylene group and a phenylene group. Among those, an alkylene group having at least one fluorine atom is preferable, and the alkylene group preferably has 2 to 6 carbon atoms, and more preferably has 2 to 4 carbon atoms. The alkylene chain may have a linking group such as an oxygen atom or a sulfur atom. The alkylene group is preferably an alkylene group in which 30% to 100% of the hydrogen atoms have been substituted with fluorine atoms, and more preferably an alkylene group in which the carbon atom bonded to the Q site has a fluorine atom. Among those, the divalent linking group for A is preferably a perfluoroalkylene group, and more preferably a perfluoroethylene group, a perfluoropropylene group, or a perfluorobutylene group.

The monovalent organic group for Rx preferably has 2 to 30 carbon atoms, and examples thereof include an alkyl group, a cycloalkyl group which may have an oxygen atom in the ring, an aryl group, an aralkyl group, and an alkenyl group.

The alkyl group for Rx may have a substituent, and is preferably a linear or branched alkyl group having 1 to 20 carbon atoms, and an oxygen atom, a sulfur atom, and/or a nitrogen atom may be contained in the alkyl chain.

Furthermore, examples of the alkyl group having a substituent include a linear or branched alkyl group substituted with a cycloalkyl group (for example, an adamantylmethyl group, an adamantylethyl group, a cyclohexylethyl group, and a camphor residue).

The cycloalkyl group for Rx may have a substituent and is preferably a cycloalkyl group having 3 to 20 carbon atoms. Further, the cycloalkyl group may have an oxygen atom in the ring.

The aryl group for Rx may have a substituent, and is preferably an aryl group having 6 to 14 carbon atoms.

The aralkyl group for Rx may have a substituent, and is preferably an aralkyl group having 7 to 20 carbon atoms.

The alkenyl group for Rx may have a substituent, and examples thereof include a group having a double bond at any position of the alkyl group mentioned as Rx.

In a case where B represents —N(Rx)Ry-, the divalent organic group for Ry is preferably an alkylene group. Further, in this case, examples of the ring formed by the mutual bonding of Rx and Ry include a 5- to 8-membered ring including a nitrogen atom, and particularly preferably a 6-membered ring. The nitrogen atom included in the ring may be a nitrogen atom other than the nitrogen atom directly bonded to X in —N(Rx)Ry-.

In a case where B represents —N(Rx)Ry-, it is preferable that R and Rx are bonded to each other to form a ring. In a case of forming a ring, stability is improved, and the storage stability of a composition using the same ring structure is improved. The number of carbon atoms forming the ring is preferably 4 to 20 and may be either a monocycle or a polycycle, and the ring may include an oxygen atom, a sulfur atom and/or a nitrogen atom. The nitrogen atom included in the ring may be a nitrogen atom other than the nitrogen atom directly bonded to X in —N(Rx)Ry-.

Examples of the monocycle include a 4-membered ring, a 5-membered ring, a 6-membered ring, a 7-membered ring, and an 8-membered ring, each of which includes a nitrogen atom. Examples of such a ring structure include a piperazine ring and a piperidine ring. The polycycle includes a structure constituted with a combination of 2 or 3 or more monocyclic structures. Each of the monocycle and the polycycle may have a substituent, which is preferably a halogen atom, a hydroxyl group, a cyano group, a carboxy group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and aminoacyl group (preferably 2 to 20 carbon atoms). These substituents may further have a substituent where available. In a case where the aryl group and the cycloalkyl group each further have a substituent, examples of the substituent include an alkyl group (preferably having 1 to 15 carbon atoms). Examples of the substituent which is further contained in the aminoacyl group include an alkyl group (preferably having 1 to 15 carbon atoms).

The proton-accepting functional group in R is as described above, and preferably has, as a partial structure thereof, a structure of, for example, a crown ether, primary to tertiary amines, and a nitrogen-containing heterocyclic ring (pyridine, imidazole, pyrazine, and the like).

Furthermore, as the proton-accepting functional group, a functional group having a nitrogen atom is preferable, and a group having a primary to tertiary amino group or a nitrogen-containing heterocyclic group is more preferable. In these structures, it is preferable that all of the atoms adjacent to the nitrogen atom included in the structure are carbon atoms or hydrogen atoms. In addition, it is preferable that an electron-withdrawing functional group (such as a carbonyl group, a sulfonyl group, a cyano group, and a halogen atom) is not directly linked to the nitrogen atom.

The monovalent organic group in the monovalent organic group (the group R) including such a proton-accepting functional group preferably has 2 to 30 carbon atoms, examples thereof include an alkyl group, a cycloalkyl group, an aryl group, an aralkyl group, and an alkenyl group, and each of the groups may have a substituent.

In the alkyl group, the cycloalkyl group, the aryl group, the aralkyl group, and the alkenyl group, each of which includes a proton-accepting functional group in R, examples of the alkyl group, the cycloalkyl group, the aryl group, the aralkyl group, and the alkenyl group include the same ones as the groups as the alkyl group, the cycloalkyl group, the aryl group, the aralkyl group, and the alkenyl group mentioned as Rx, respectively.

The substituent which may be contained in each of the groups include a halogen atom, a hydroxyl group, a nitro group, a cyano group, a carboxy group, a cycloalkyl group (preferably having 3 to 10 carbon atoms; a part of the group may be substituted with a heteroatom or a group having a heteroatom (an ester group or the like)), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). Examples of the substituent which may be contained in the cyclic group in the aryl group, the cycloalkyl group, and the like include an alkyl group (preferably having 1 to 20 carbon atoms). Examples of the substituent which is contained in the aminoacyl group include 1 or 2 alkyl groups (preferably having 1 to 20 carbon atoms).

$[C^+]$ is preferably a sulfonium cation or an iodonium cation as a counter cation. As the sulfonium cation and the iodonium cation, for example, a sulfonium cation and an iodonium cation for the cation which may be contained in the specific photoacid generator (more specifically the cation in the compound represented by General Formula (ZaI), the cation in the compound represented by General Formula (ZaII), and the like) can be similarly used.

(Compound (DC))

In the composition of the embodiment of the present invention, the onium salt (DC) hereinafter also referred to as a "compound (DC)") which is a weak acid relative to a photoacid generator can be used as the acid diffusion control agent.

In a case where the photoacid generator and the onium salt that generates an acid which is a weak acid relative to an acid generated from an acid generator are mixed and used, an acid generated from the photoacid generator upon irradiation with actinic rays or radiation generates an onium salt having a strong acid anion by discharging the weak acid through salt exchange in a case where the acid collides with an onium salt having an unreacted weak acid anion. In this process, since a strong acid is exchanged with a weak acid having a lower catalytic ability, the acid is deactivated in appearance, and thus, the acid diffusion can be controlled.

As the onium salt which is a weak acid relative to the acid generator, compounds represented by General Formulae (dl-1) to (dl-3) are preferable.

(d1-1)

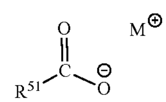

(d1-2)

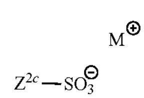

-continued (d1-3)

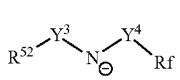

$R^{51}$ is a hydrocarbon group which may have a substituent (in which the hydrocarbon group is preferably an aryl group and the substituent is preferably a hydroxyl group). $Z^{2c}$ is a hydrocarbon group having 1 to 30 carbon atoms, may have a substituent (provided that carbon adjacent to S does not have a fluorine atom and/or a fluoroalkyl group as a substituent). $R^{52}$ is an organic group (an alkyl group and the like), $Y^3$ is —$SO_2$—, a linear, branched, or cyclic alkylene group, or an arylene group, $Y^4$ is —CO— or —$SO_2$—, and $R_f$ is a hydrocarbon group having a fluorine atom (a fluoroalkyl group and the like). M's are each independently an ammonium cation, a sulfonium cation, or an iodonium cation.

Preferred examples of the sulfonium cation or iodonium cation represented by $M^+$ include the sulfonium cation exemplified for General Formula (ZaI) and the iodonium cation exemplified for General Formula (ZaII).

The compound (DC) may be a compound having a cationic site and an anionic site in the same molecule, in which the cationic site and the anionic site are linked through a covalent bond (hereinafter also referred to as a "compound (DCA)").

As the compound (DCA), a compound represented by any of General Formulae (C-1) to (C-3) is preferable.

(C-1)

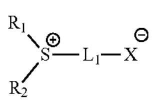

(C-2)

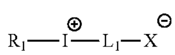

(C-3)

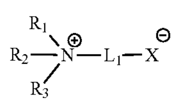

In General Formulae (C-1) to (C-3), $R_1$, $R_2$, and $R_3$ each independently represent a substituent having 1 or more carbon atoms.

$L_1$ represents a divalent linking group that links a cationic site with an anionic site, or a single bond.

—$X^-$ represents an anionic site selected from the group consisting of —$COO^-$, —$SO_3^-$, —$SO_2^-$, and —$N^-$—$R_4$. $R_4$ represents a monovalent substituent having at least one of a carbonyl group (—CO—), a sulfonyl group (—$SO_2$—), or a sulfinyl group (—SO—) at a site for linking to an adjacent N atom.

$R_1$, $R_2$, $R_3$, $R_4$, and $L_1$ may be bonded to each other to form a ring structure. In addition, in General Formula (C-3), two of $R_1$ to $R_3$ are combined with each other to represent one divalent substituent, and may be bonded to an N atom through a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, an alkyl group, a cycloalkyl group, or an aryl group is preferable.

Examples of $L_1$ as a divalent linking group include a linear or branched alkylene group, a cycloalkylene group, an arylene group, a carbonyl group, an ether bond, an ester bond, an amide bond, a urethane bond, a urea bond, and a group formed by combination of two or more kinds of these groups. Among those, $L_1$ is preferably the alkylene group, the arylene group, the ether bond, the ester bond, and the group formed by combination of two or more kinds of these groups.

(Compound (DD))

The low-molecular-weight compound (DD) having a nitrogen atom and having a group that leaves by the action of an acid (hereinafter also referred to as a "compound (DD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (DD) is preferably 100 to 1,000, more preferably 100 to 700, and still more preferably 100 to 500.

The compound (DD) may have a carbamate group having a protective group on the nitrogen atom. The protective group constituting the carbamate group can be represented by General Formula (d-1).

(d-1)

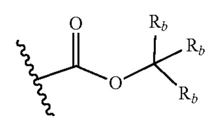

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be each independently substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

As $R_b$, a linear or branched alkyl group, a cycloalkyl group, or an aryl group is preferable, and the linear or branched alkyl group, or the cycloalkyl group is more preferable.

Examples of the ring formed by the mutual linkage of two $R_b$'s include an alicyclic hydrocarbon ring, an aromatic hydrocarbon ring, a heterocyclic hydrocarbon ring, and derivatives thereof.

Examples of the specific structure of the group represented by General Formula (d-1) include, but are not limited to, the structures disclosed in paragraph [0466] of US2012/0135348A1.

The compound (DD) is preferably a compound represented by General Formula (6).

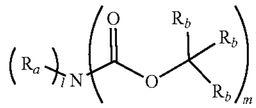

(6)

In General Formula (6), l represents an integer of 0 to 2, m represents an integer of 1 to 3, and these satisfy l+m=3. $R_a$ represents a hydrogen atom, an alkyl group, a cycloalkyl group, an aryl group, or an aralkyl group. In a case where l is 2, two $R_a$'s may be the same as or different from each other, and the two $R_a$'s may be linked to each other to form a heterocyclic ring with the nitrogen atom in the formula. This heterocyclic ring may include a heteroatom other than the nitrogen atom in the formula.

$R_b$ has the same definition as $R_b$ in General Formula (d-1), and preferred examples are also the same.

In General Formula (6), the alkyl group, the cycloalkyl group, the aryl group, and the aralkyl group as $R_a$ may be each independently substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (these groups may be substituted with the groups) of $R_a$ include the same groups as the specific examples described above with respect to $R_b$.

Examples of specific structures of the particularly preferred compound (DD) in the present invention include the compounds disclosed in paragraph [0475] of US2012/0135348A1.

(Compound (DE))

The onium salt compound (DE) having a nitrogen atom in a cation (hereinafter also referred to as a "compound (DE)") is preferably a compound having a basic site including a nitrogen atom in the cation. The basic site is preferably an amino group, and more preferably an aliphatic amino group. All of the atoms adjacent to the nitrogen atom in the basic site are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom. Preferred examples of specific compounds of the compound (DE) include the compounds disclosed in paragraph [0203] of US2015/0309408A1.

Preferred examples of the acid diffusion control agent are shown below.

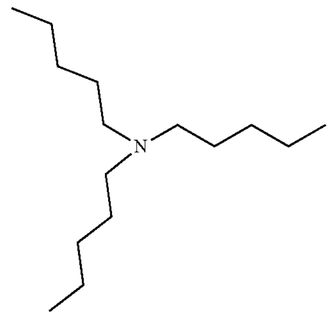

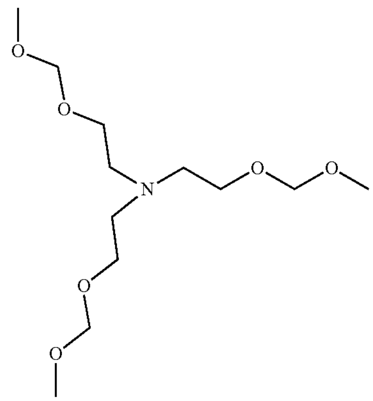

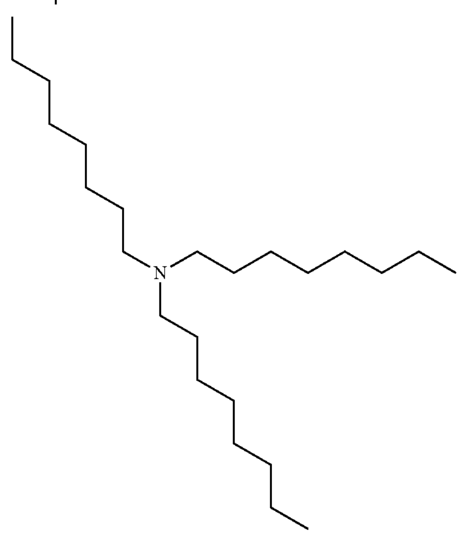

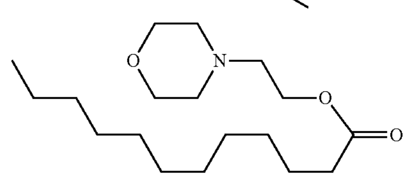

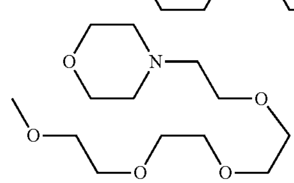

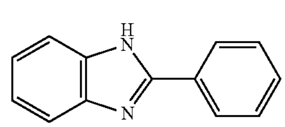

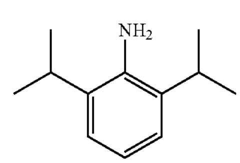

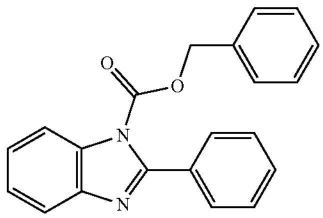
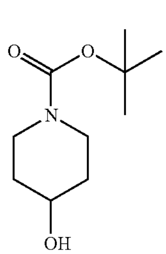
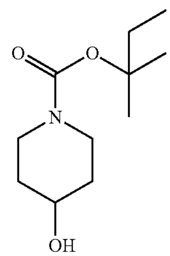
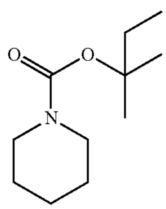
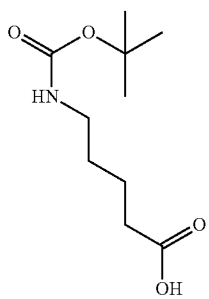
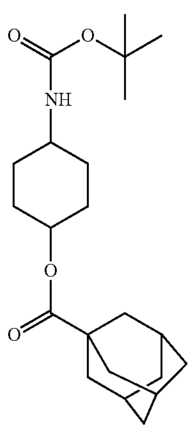
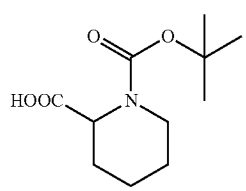
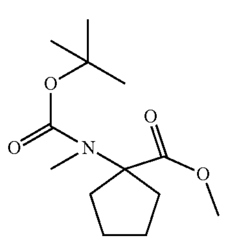
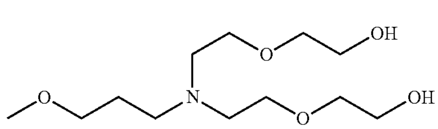
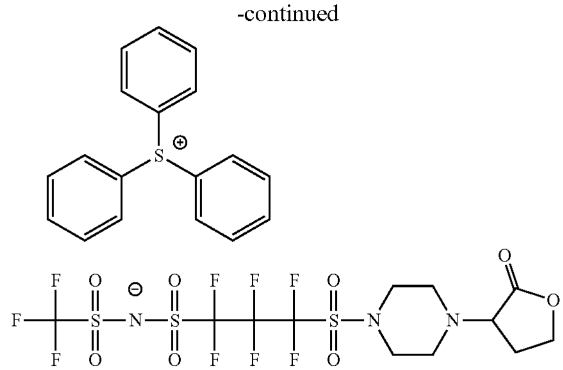
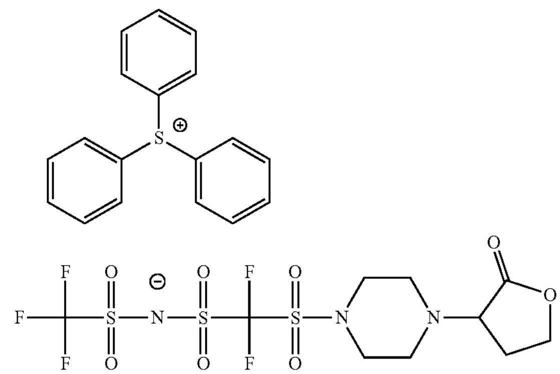
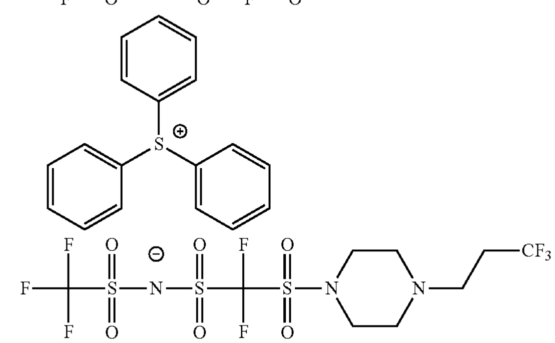
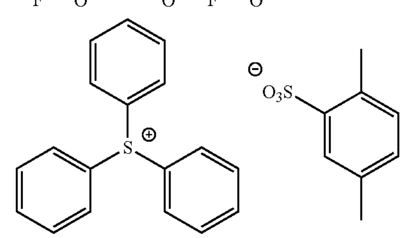
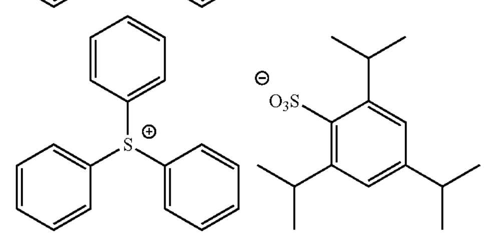
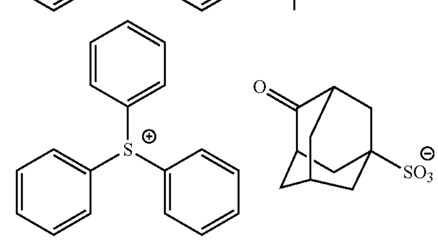

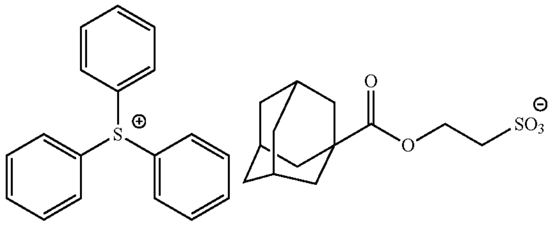
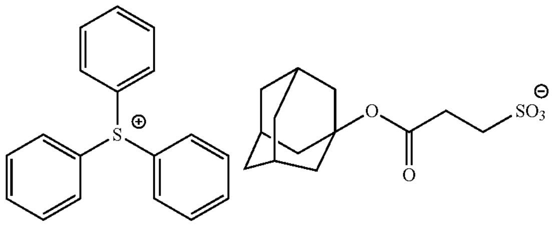
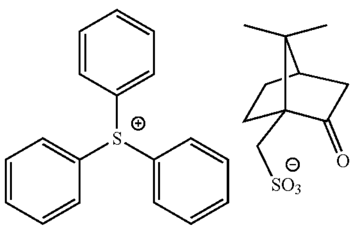
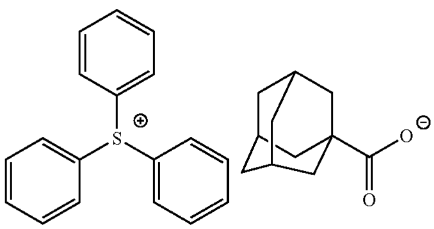
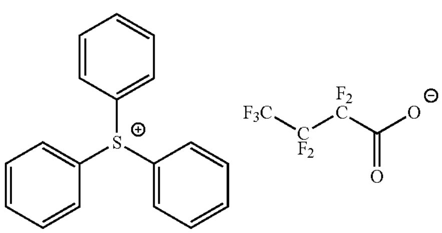
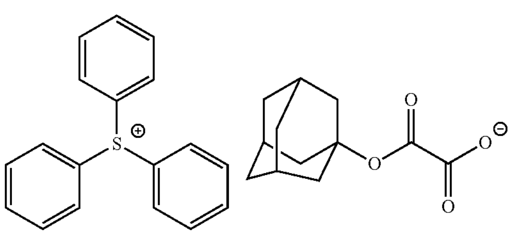
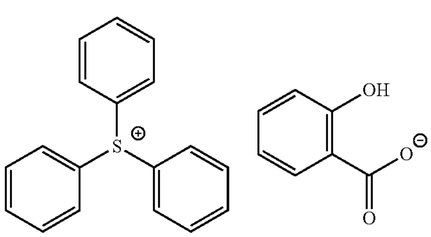
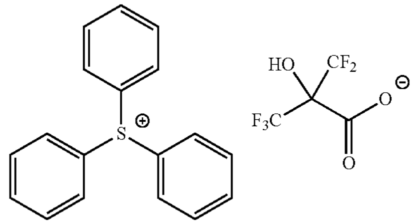
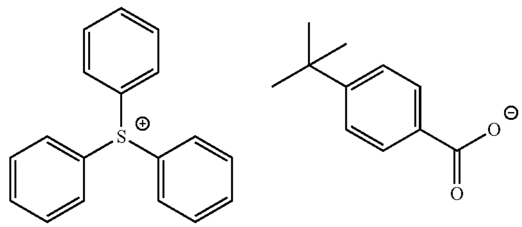
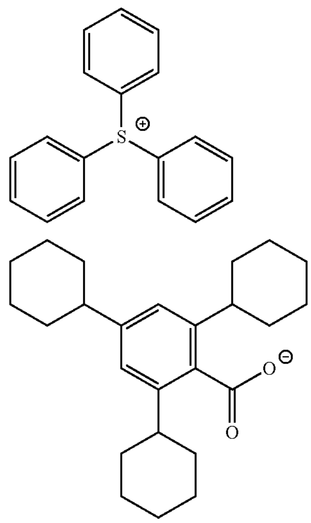
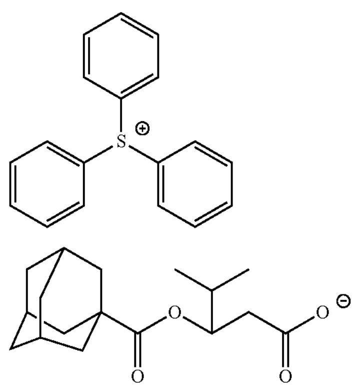
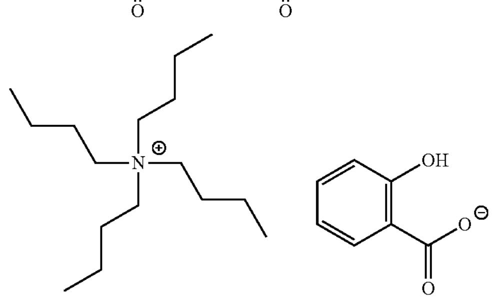

-continued

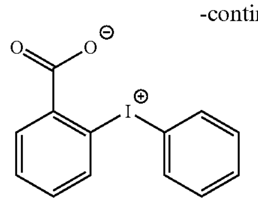

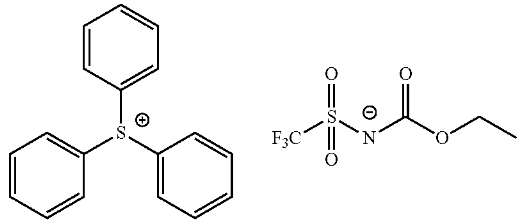

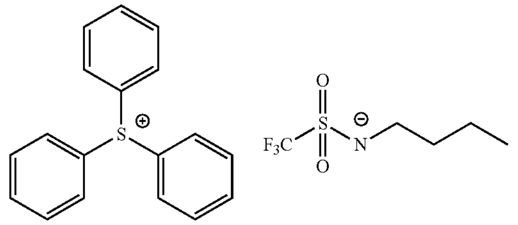

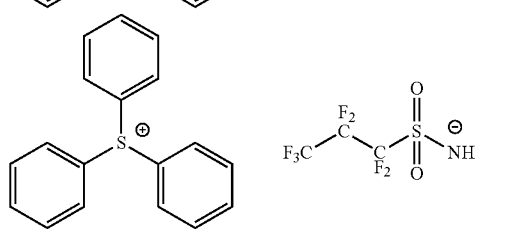

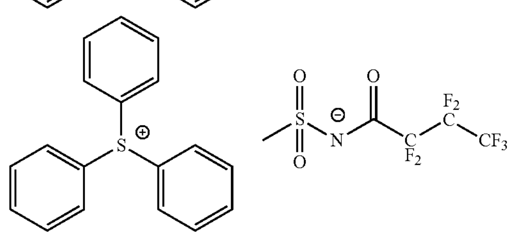

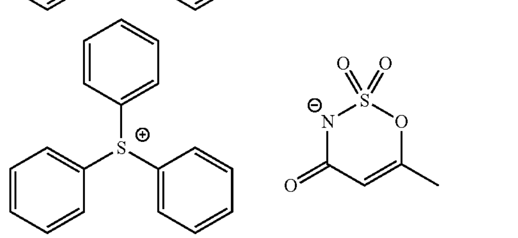

In a case where the composition includes an acid diffusion control agent, the content of the acid diffusion control agent is preferably 0.1% to 15% by mass, more preferably 0.2% to 12% by mass, and still more preferably 0.3% to 10% by mass with respect to the total solid content of the composition.

<Hydrophobic Resin>

The composition of the embodiment of the present invention may include a hydrophobic resin. Furthermore, the hydrophobic resin is preferably a resin different from the resin A.

In a case where the composition of the embodiment of the present invention includes the hydrophobic resin, it is easy to control the static and/or dynamic contact angle on the surface of a resist film (actinic ray-sensitive or radiation-sensitive film). As a result, it is possible to improve development characteristics, suppress generation of out gas, improve immersion liquid followability upon liquid immersion exposure, and reduce liquid immersion defects, for example.

It is preferable that the hydrophobic resin is designed to be unevenly distributed on a surface of a resist film, but unlike the surfactant, the hydrophobic resin does not necessarily have a hydrophilic group in a molecule thereof and may not necessarily contribute to homogeneous mixing of polar materials and non-polar materials.

The hydrophobic resin is preferably a resin having a repeating unit having at least one selected from the group consisting of a "fluorine atom", a "silicon atom", or a "$CH_3$ partial structure which is included in a side chain portion of a resin" from the viewpoint of uneven distribution on a film surface layer.

In a case where the hydrophobic resin includes a fluorine atom and/or a silicon atom, the fluorine atom and/or the silicon atom described above in the hydrophobic resin may be included in the main chain of a resin or may be included in a side chain.

In a case where the hydrophobic resin includes a fluorine atom, it is preferably a resin which has an alkyl group having a fluorine atom, a cycloalkyl group having a fluorine atom, or an aryl group having a fluorine atom as a partial structure having a fluorine atom.

The hydrophobic resin preferably has at least one group selected from the following (x) to (z) groups:

(x) an acid group, and (y) a group having a solubility in an alkali developer that increases through decomposition by the action of the alkali developer (hereinafter also referred to as a polarity conversion group).

(z) a group that decomposes by the action of an acid.

Examples of the acid group (x) include a phenolic hydroxyl group, a carboxy group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

As the acid group, the fluorinated alcohol group (preferably hexafluoroisopropanol group), the sulfonimide group, or the bis(alkylcarbonyl)methylene group is preferable.

Examples of the group (y) having a solubility in an alkali developer that increases through decomposition by the action of the alkali developer include a lactone group, a carboxyester group (—COO—), an acid anhydride group (—CO—O—CO—), an acid imide group (—NHCONH—), a carboxythioester group (—COS—), a carbonic acid ester group (—O—CO—O—), a sulfuric ester group (—$OSO_2O$—), and a sulfonic ester group (—$SO_2O$—), and the lactone group or the carboxyester group (—COO—) is preferable.

The repeating unit including such the group is, for example, a repeating unit in which the group is directly bonded to the main chain of a resin, and examples thereof include a repeating unit with an acrylic acid ester or a methacrylic acid ester. In this repeating unit, such the group may be bonded to the main chain of the resin through a linking group. Alternatively, this repeating unit may also be introduced into a terminal of the resin by using a polymerization initiator or a chain transfer agent having such the group during polymerization.

Examples of the repeating unit having a lactone group include the same repeating units as the repeating unit having a lactone structure described earlier in the section of the resin A.

In a case where the hydrophobic resin has a repeating unit having the group (y) having a solubility in an alkali developer that increases through decomposition by the action of the alkali developer, the content of the repeating unit is preferably 1% to 100% by mole, more preferably 3% to 98% by mole, and still more preferably 5% to 95% by mole with respect to all the repeating units in the hydrophobic resin.

Examples of the repeating unit having the group (z) that decomposes by the action of an acid in the hydrophobic resin include the same repeating units as the repeating units having an acid-decomposable group exemplified in the resin A. The repeating unit having a group (z) that decomposes by the action of an acid may have at least any one of a fluorine atom or a silicon atom. In a case where the hydrophobic resin has the repeating unit having a group (z) that decomposes by the action of an acid, the content of the repeating unit is preferably 1% to 80% by mole, more preferably 10% to 80% by mole, and still more preferably 15% to 60% by mole with respect to all the repeating units in the hydrophobic resin.

The hydrophobic resin may further have a repeating unit which is different from the above-mentioned repeating units.

In a case where the hydrophobic resin has a repeating unit including a fluorine atom, the content of the repeating unit is preferably 10% to 100% by mole, and more preferably 30% to 100% by mole with respect to all the repeating units in the hydrophobic resin. In addition, in a case where the hydrophobic resin has a repeating units including a silicon atom, the content of the repeating unit is preferably 10% to 100% by mole, and more preferably 20% to 100% by mole with respect to all the repeating units in the hydrophobic resin.

On the other hand, in a case where the hydrophobic resin includes a $CH_3$ partial structure in the side chain portion thereof, a form in which the hydrophobic resin does not substantially include a fluorine atom and a silicon atom is preferable. Further, it is preferable that the hydrophobic resin is constituted with substantially only repeating units which are constituted with only atoms selected from a carbon atom, an oxygen atom, a hydrogen atom, a nitrogen atom, and a sulfur atom.

The weight-average molecular weight of the hydrophobic resin expressed in terms of standard polystyrene is preferably 1,000 to 100,000, and more preferably 1,000 to 50,000.

A total content of the residual monomers and/or oligomer components included in the hydrophobic resin is preferably 0.01% to 5% by mass, and more preferably 0.01% to 3% by mass. In addition, the dispersity (Mw/Mn) is preferably 1.0 to 5.00, and more preferably 1.0 to 3.00.

As the hydrophobic resin, known resins can be appropriately selected and used alone or as a mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin. In addition, the repeating units disclosed in paragraphs [0177] to [0258] of the specification of US2016/0237190A1 are also preferable as the repeating units constituting the hydrophobic resin.

Preferred examples of a monomer corresponding to the repeating unit constituting the hydrophobic resin are shown below.

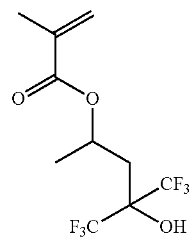
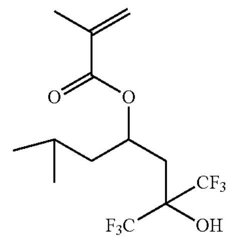
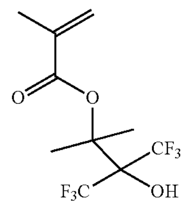
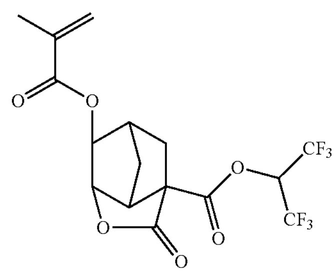
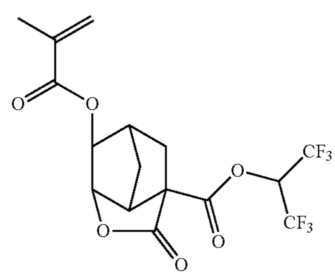
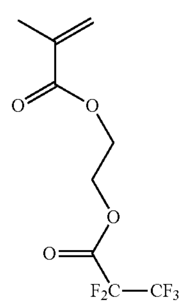
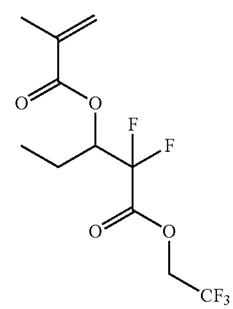
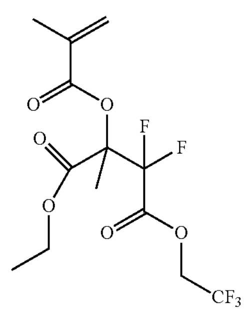
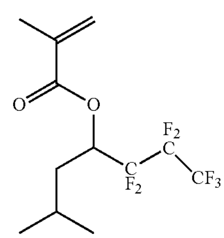

-continued

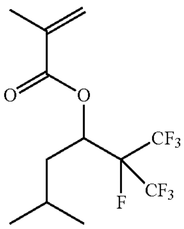
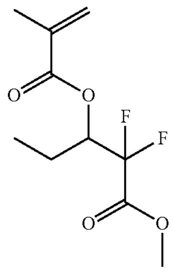
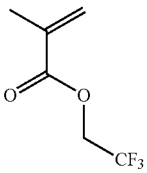
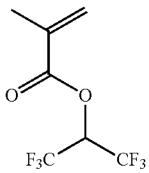
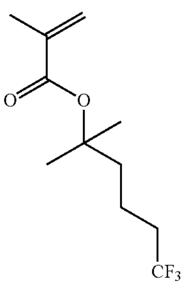
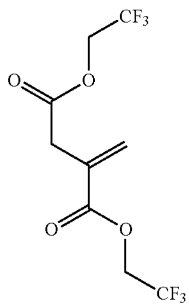
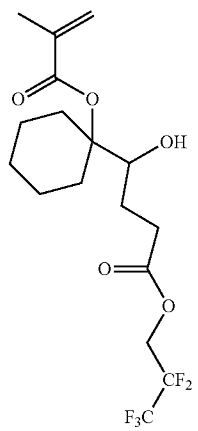
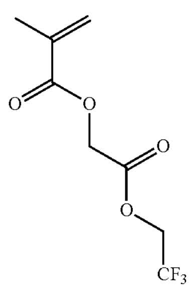
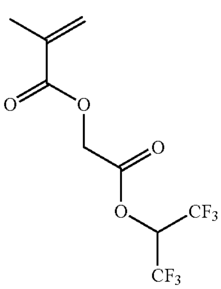
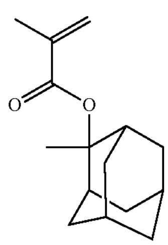
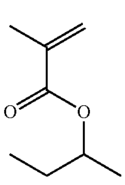
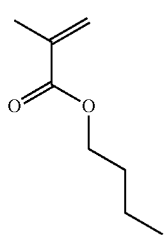
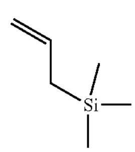

-continued

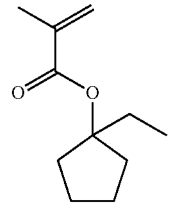
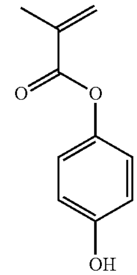
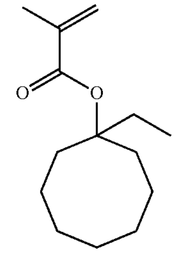
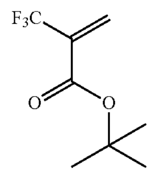
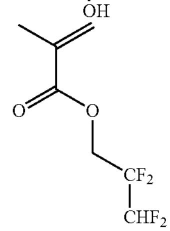
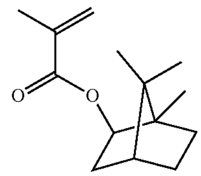
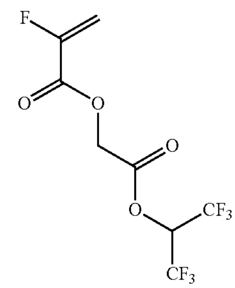
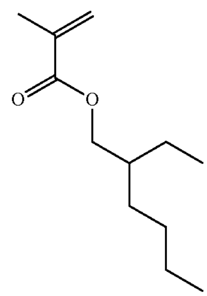
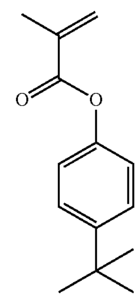
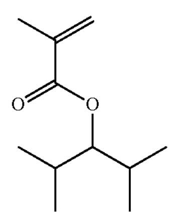
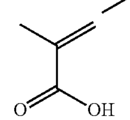
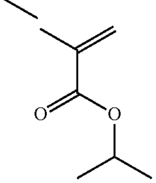
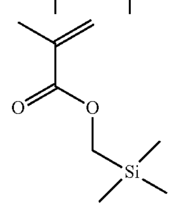

The hydrophobic resins may be used alone or in combination of two or more kinds thereof.

It is also preferable to use a mixture of two or more kinds of hydrophobic resins having different levels of surface energy from the viewpoint of satisfying both the immersion liquid followability and the development characteristics upon liquid immersion exposure.

The content of the hydrophobic resin in the composition is preferably 0.01% to 10% by mass, more preferably 0.03% to 8.0% by mass, and still more preferably 0.10% to 1.0% by mass with respect to the total solid content of the composition of the embodiment of the present invention. In a case where two or more kinds of hydrophobic resins are used, the total content thereof is preferably within the suitable content range.

<Solvent>

The composition of the embodiment of the present invention may include a solvent.

In the composition of the embodiment of the present invention, a known resist solvent can be appropriately used. For example, the known solvents disclosed in paragraphs [0665] to [0670] of US2016/0070167A1, paragraphs [0210] to [0235] of US2015/0004544A1, paragraphs [0424] to [0426] of US2016/0237190A1, and paragraphs [0357] to [0366] of US2016/0274458A1 can be suitably used.

Examples of the solvent which can be used in preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxyl group in the structure and a solvent having no hydroxyl group may be used.

As the solvent having a hydroxyl group and the solvent having no hydroxyl group, the above-exemplified compounds can be appropriately selected, but as the solvent having a hydroxyl group, alkylene glycol monoalkyl ether or alkyl lactate is preferable, and propylene glycol monomethyl ether (PGME), propylene glycol monoethyl ether (PGEE), methyl 2-hydroxyisobutyrate, or ethyl lactate is more preferable. Further, as the solvent having no hydroxyl group, alkylene glycol monoalkyl ether acetate, alkyl alkoxypropionate, a monoketone compound which may have a ring, a cyclic lactone, alkyl acetate, or the like is preferable, and among these, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone is still more preferable. As a solvent having no hydroxyl group, propylene carbonate is also preferable.

A mixing ratio (mass ratio) of the solvent having a hydroxyl group to the solvent having no hydroxyl group is preferably 1/99 to 99/1, more preferably 10/90 to 90/10, and still more preferably 20/80 to 60/40. A mixed solvent including 50% by mass or more of the solvent having no hydroxyl group is preferable from the viewpoint of coating uniformity.

It is preferable that the solvent includes propylene glycol monomethyl ether acetate. In this case, the solvent may be a single solvent of propylene glycol monomethyl ether acetate or a mixed solvent of two or more kinds including propylene glycol monomethyl ether acetate.

The concentration of solid contents in the composition of the embodiment of the present invention is preferably 0.5% to 30% by mass, more preferably 1.0% to 20% by mass, and still more preferably 1.5% to 10% by mass. That is, in a case where the composition includes a solvent, the content of the solvent in the composition is preferably adjusted so as to satisfy the suitable range of the concentration of solid contents. Furthermore, the concentration of solid contents is a mass percentage of other resist components excluding the solvent with respect to the total mass of the composition.

By setting the concentration of solid contents in the composition to an appropriate range to attain an appropriate viscosity and improving the coating property or the film-forming property, it is possible to adjust the film thickness of a resist film (actinic ray-sensitive or radiation-sensitive film) consisting of the composition of the embodiment of the present invention.

<Surfactant>

The composition of the embodiment of the present invention may include a surfactant.

The surfactant is preferably a fluorine-based and/or silicon-based surfactant (specifically a fluorine-based surfactant, a silicon-based surfactant, or a surfactant having both a fluorine atom and a silicon atom).

In a case where the composition of the embodiment of the present invention includes the surfactant, it is easy to obtain a pattern with good sensitivity and resolution and less adhesiveness and development defects in a case where an exposure light source of 250 nm or less, in particular, 220 nm or less is used.

Examples of the fluorine-based and/or silicon-based surfactants include the surfactants described in paragraph [0276] of the specification of US2008/0248425A.

In addition, another surfactant other than the fluorine-based and/or silicon-based surfactants described in paragraph [0280] of the specification of US2008/0248425A may also be used.

The surfactants may be used alone or in combination of two or more kinds thereof.

In a case where the composition of the embodiment of the present invention contains a surfactant, the content of the surfactant is preferably 0.0001% to 2% by mass, and more preferably 0.0005% to 1% by mass with respect to the total solid content of the composition.

The surfactants may be used alone or in combination of two or more kinds thereof. In a case where two or more kinds of the surfactants are used, the total content thereof is preferably within the suitable content range.

On the other hand, in a case where the content of the surfactant is 10 ppm by mass or more with respect to the total solid content of the composition, the uneven distribution of the hydrophobic resin on the surface is enhanced. As a result, the surface of the resist film can be made more hydrophobic, and the water followability during liquid immersion exposure is improved.

<Other Additives>

The composition of the embodiment of the present invention may further include a resin other than those described above, a crosslinking agent, an acid proliferation agent, a dye, a plasticizer, a photosensitizer, a light absorber, an alkali-soluble resin, a dissolution inhibitor, a dissolution accelerator, or the like.

<Preparation Method>

The composition of the embodiment of the present invention is preferably used by dissolving the components in a predetermined organic solvent (preferably the mixed solvent), and filtering the solution through a filter and applying it onto a predetermined support (substrate).

The pore size of a filter for use in filtration through the filter is preferably pore size of 0.1 μm or less, more preferably 0.05 μm or less, and still more preferably 0.03 μm or less. In addition, in a case where the concentration of solid contents of the composition is high (for example, 25% by mass or more), the pore size of a filter used for filter filtration is preferably 3 μm or less, more preferably 0.5 μm or less, and still more preferably 0.3 μm or less. As the filter, a polytetrafluoroethylene-made, polyethylene-made, or nylon-made filter is preferable. In the filtration using a filter, for example, as disclosed in JP2002-62667A, circulation-filtration may be performed or the filtration may be performed by connection of a plurality of kinds of filters in series or in parallel. In addition, the composition may be filtered in plural times. Furthermore, the composition may be subjected to a deaeration treatment or the like before or after filter filtration.

<Uses>

The composition of the embodiment of the present invention relates to an actinic ray-sensitive or radiation-sensitive resin composition having properties which change by undergoing a reaction upon irradiation with actinic rays or radiation. More specifically, the composition of the embodiment of the present invention relates to an actinic ray-sensitive or radiation-sensitive resin composition which is used in a step of manufacturing a semiconductor such as an integrated circuit (IC), for the manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, microelectromechanical systems (MEMS), or the like.

In addition, the present invention also relates to the following compound.

A compound represented by General Formula (IA), in which a carbon anion group represented by Formula (A) is a group represented by any of General Formulae (a-1), (a-2), and (a-5) to (a-9).

(IA)

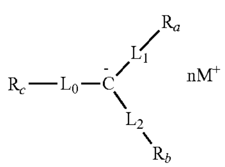

In General Formula (IA), $R_a$ and $R_b$ each independently represent a hydrogen atom or a substituent.

It should be noted that $R_a$ and $R_b$ satisfy the following requirement (1) or (2).

(1) At least one of $R_a$ or $R_b$ represents a secondary alkyl group, a tertiary alkyl group, a cycloalkyl group, or a perfluoroalkyl group, and $R_a$ and $R_b$ may be bonded to each other to form a ring.

(2) $R_a$ and $R_b$ are bonded to each other to form a ring.

$R_c$ represents a substituent.

$L_0$ represents a single bond or a divalent linking group.

$L_1$ represents a single bond or a divalent linking group.

$L_2$ represents a single bond or a divalent linking group.

$nM^+$ represents an organic cationic moiety. n represents an integer of 1 or more.

(A)

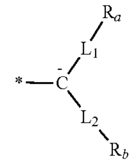

In Formula (A),

* represents a bonding position.

(a-1)

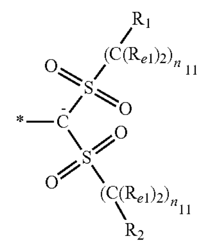

(a-2)

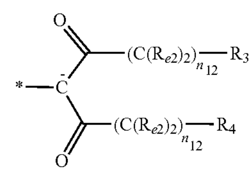

(a-5)

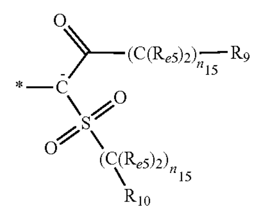

(a-6)

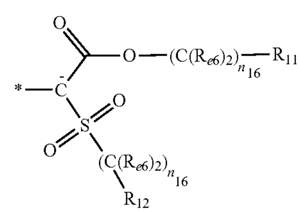

(a-7)

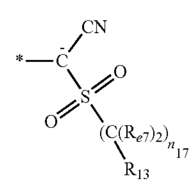

(a-8)

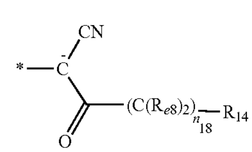

(a-9)

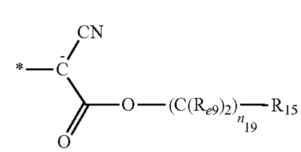

In General Formula (a-1), $R_1$ and $R_2$ each independently represent a hydrogen atom or a substituent.

It should be noted that $R_1$ and $R_2$ satisfy the following requirement (1A) or (1B).

(1A) At least one of $R_1$ or $R_2$ represents a secondary alkyl group, a tertiary alkyl group, a cycloalkyl group, or a perfluoroalkyl group, and $R_1$ and $R_2$ may be bonded to each other to form a ring.

(1B) $R_1$ and $R_2$ are bonded to each other to form a ring.

$R_{e1}$'s each independently represent a hydrogen atom, a fluorine atom, or an alkyl fluoride group.

$n_{11}$'s each independently represent 0, 1, or 2.

In General Formula (a-2), $R_3$ and $R_4$ each independently represent a hydrogen atom or a substituent.

It should be noted that $R_3$ and $R_4$ satisfy the following requirement (2A) or (2B).

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring.

(2B) $R_3$ and $R_4$ are bonded to each other to form a ring.

$R_{e2}$'s each independently represent a hydrogen atom, a fluorine atom, or an alkyl fluoride group.

$n_{12}$'s each independently represent 0, 1, or 2.

In General Formula (a-5), $R_9$ and $R_{10}$ each independently represent a hydrogen atom or a substituent.

It should be noted that $R_9$ and $R_{10}$ satisfy the following requirement (5A) or (5B).

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring.

(5B) $R_9$ and $R_{10}$ are bonded to each other to form a ring.

$R_{e5}$'s each independently represent a hydrogen atom, a fluorine atom, or an alkyl fluoride group.

$n_{15}$'s each independently represent 0, 1, or 2.

In General Formula (a-6), $R_{11}$ and $R_{12}$ each independently represent a hydrogen atom or a substituent.

It should be noted that $R_{11}$ and $R_{12}$ satisfy the following requirement (6A) or (6B).

(6A) At least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring.

(6B) $R_{11}$ and $R_{12}$ are bonded to each other to form a ring.

$R_{e6}$'s each independently represent a hydrogen atom, a fluorine atom, or an alkyl fluoride group.

$n_{16}$'s each independently represent 0, 1, or 2.

In General Formula (a-7), $R_{13}$ represents a secondary alkyl group, a tertiary alkyl group, a cycloalkyl group, or a perfluoroalkyl group.

$R_{e7}$ 's each independently represent a hydrogen atom, a fluorine atom, or an alkyl fluoride group.

$n_{17}$ represents 0, 1, or 2.

In General Formula (a-8), $R_{14}$ represents a secondary alkyl group, a tertiary alkyl group, a cycloalkyl group, or a perfluoroalkyl group.

$R_{e8}$'s each independently represent a hydrogen atom, a fluorine atom, or an alkyl fluoride group.

$n_{18}$ represents 0, 1, or 2.

In General Formula (a-9), $R_{15}$ represents a secondary alkyl group, a tertiary alkyl group, a cycloalkyl group, or a perfluoroalkyl group.

$R_{e9}$'s each independently represent a hydrogen atom, a fluorine atom, or an alkyl fluoride group.

$n_{19}$ represents 0, 1, or 2.

In General Formulae (a-1) to (a-9),

* represents a bonding position.

In General Formula (IA), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively, in the composition of the embodiment of the present invention.

The fact that $R_a$ and $R_b$ in General Formula (IA) have the same definitions as $R_a$ and $R_b$ in General Formula (I), respectively, in the composition of the embodiment of the present invention means that the proviso requirements in General Formula (I) are also satisfied.

In General Formula (a-1), $R_1$, $R_2$, $Re_1$, and $n_{11}$ have the same definitions as $R_1$, $R_2$, $Re_1$, and $n_{11}$ in General Formula (a-1), respectively, in the composition of the embodiment of the present invention.

The fact that $R_1$ and $R_2$ in General Formula (a-1) have the same definitions as $R_1$ and $R_2$ in General Formula (a-1), respectively, in the composition of the embodiment of the present invention means that the proviso requirements in General Formula (a-1) are also satisfied.

In General Formula (a-2), $R_3$, $R_4$, $Re_2$, and $n_{12}$ have the same definitions as $R_3$, $R_4$, $Re_2$, and $n_{12}$ in General Formula (a-2), respectively, in the composition of the embodiment of the present invention.

The fact that $R_3$ and $R_4$ in General Formula (a-2) have the same definitions as $R_3$ and $R_4$ in General Formula (a-2), respectively, in the composition of the embodiment of the present invention means that the proviso requirements in General Formula (a-2) are also satisfied.

In General Formula (a-5), $R_9$, $R_{10}$, $Re_4$, and $n_{15}$ have the same definitions as $R_9$, $R_{10}$, $Re_5$, and $n_{15}$ in General Formula (a-5), respectively, in the composition of the embodiment of the present invention.

The fact that $R_9$ and $R_{10}$ in General Formula (a-5) have the same definitions as $R_9$ and $R_{10}$ in General Formula (a-5), respectively, in the composition of the embodiment of the present invention means that the proviso requirements in General Formula (a-5) are also satisfied.

In General Formula (a-6), $R_{11}$, $R_{12}$, $R_{e6}$, and $n_{16}$ have the same definitions as $R_{11}$, $R_{12}$, $R_{e6}$, and $n_{16}$ in General Formula (a-6), respectively, in the composition of the embodiment of the present invention.

The fact that $R_{11}$ and $R_{12}$ in General Formula (a-6) have the same definitions as $R_{11}$ and $R_{12}$ in General Formula (a-6), respectively, in the composition of the embodiment of the present invention means that the proviso requirements in General Formula (a-6) are also satisfied.

In General Formula (a-7), $R_{13}$, $Re_7$, and $n_{17}$ have the same definitions as $R_{13}$, $Re_7$, and $n_{17}$ in General Formula (a-7), respectively, in the composition of the embodiment of the present invention.

In General Formula (a-8), $R_{14}$, $R_{e8}$, and $n_{18}$ have the same definitions as $R_{10}$, $R_{e8}$, and $n_{18}$ in General Formula (a-8), respectively, in the composition of the embodiment of the present invention.

In General Formula (a-9), $R_{15}$, $R_{e9}$, and $n_{19}$ have the same definitions as $R_{15}$, $R_{e9}$, and $n_{19}$ in General Formula (a-9), respectively, in the composition of the embodiment of the present invention.

The compound is also preferably a compound represented by General Formula (IA-1).

(IA-1)

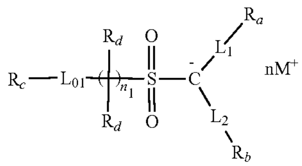

In General Formula (IA-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (IA), respectively.

$R_d$'s each independently represent a hydrogen atom, a fluorine atom, or an alkyl fluoride group.

$n_1$ represents an integer of 1 to 5.

$L_{01}$ represents a single bond or a divalent linking group.

In General Formula (IA-1), Rd, $n_1$, and $L_{01}$ have the same definitions as Rd, $n_1$, and $L_{01}$ in General Formula (I-1), respectively, in the composition of the embodiment of the present invention.

The compound is also preferably a compound represented by General Formula (IA-1-1).

It should be noted that in a case where the carbon anion group represented by Formula (A) in a compound represented by General Formula (IA), General Formula (IA-1), or General Formula (IA-1-1) is a group represented by General Formula (B), a case where $L_0$ represents —$SO_2$— and $R_c$ represents a perfluoroalkyl group in General Formula (IA) is excluded. In General Formula (IA-1) or General Formula (IA-1-1), a case where $L_{01}$ or Lot is a single bond, and $R_c$ represents a perfluoroalkyl group or a fluorine atom is excluded.

(IA-1-1)

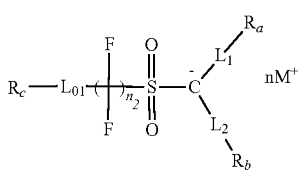

In General Formula (IA-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (IA), respectively.

$n_2$ represents an integer of 1 to 5.

$L_{02}$ represents a single bond or a divalent linking group.

(B)

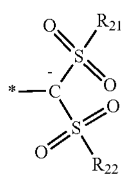

In General Formula (B), $R_{21}$ and $R_{22}$ each independently represent a perfluoroalkyl group.

In General Formula (IA-1-1), $n_2$ and $L_{02}$ have the same definitions as $n_2$ and $L_{02}$ in General Formula (IA-1-1), respectively, in the composition of the embodiment of the present invention.

General Formula (IA) and General Formula (IA-1) are as described above.

In General Formula (B), $R_{21}$ and $R_{22}$ have the same definition as $R_{21}$ and $R_{22}$ in General Formula (B), respectively, in the composition of the embodiment of the present invention.

It is preferable that in which $R_c$ in the compound represents an anion group, and the anion group is a group represented by any of General Formulae (b-1) to (b-9). It should be noted that in a case where the carbon anion group represented by Formula (A) in the compound represented by General Formula (IA-1-1) is a group represented by General Formula (B), the anionic group of $R_c$ is not a group represented by General Formula (a-x).

(b-1)

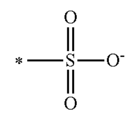

(b-2)

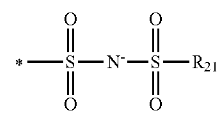

(b-3)

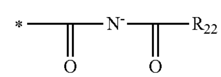

(b-4)

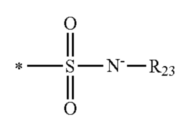

(b-5)

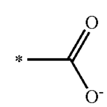

(b-6)

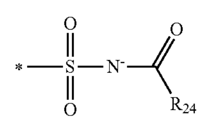

(b-7)

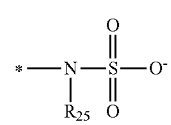

(b-8)

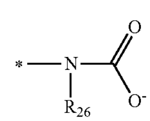

(b-9)

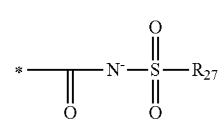

In General Formula (b-2), $R_{21}$ represents a substituent.

In General Formula (b-3), $R_{22}$ represents a substituent.

In General Formula (b-4), $R_{23}$ represents a substituent.

In General Formula (b-6), $R_{24}$ represents a substituent.

In General Formula (b-7), $R_{25}$ represents a substituent.

In General Formula (b-8), $R_{26}$ represents a substituent.

In General Formula (b-9), $R_{27}$ represents a substituent.

In General Formulae (b-1) to (b-9),

* represents a bonding position.

(IA-1-1)

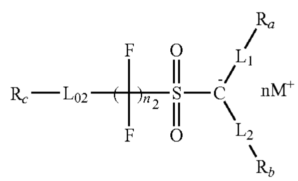

In General Formula (IA-1-1), $R_a$, $R_b$, $R_c$, $L_1$, $L_2$, and $nM^+$ have the same definitions as $R_a$, $R_b$, $R_c$, $L_1$, $L_2$, and $nM^+$ in General Formula (I), respectively.

$n_2$ represents an integer of 1 to 5.

$L_{02}$ represents a single bond or a divalent linking group.

(A)

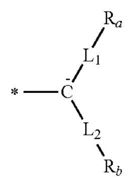

In Formula (A),

* represents a bonding position.

(B)

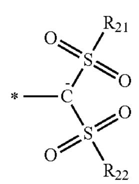

In General Formula (B), $R_{21}$ and $R_{22}$ each independently represent a perfluoroalkyl group.

* represents a bonding position.

(a-x)

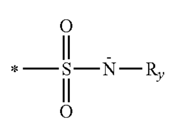

In General Formula (a-x), $R_y$ represents an alkyl group.

* represents a bonding position.

In General Formula (b-2), $R_{21}$ has the same definition as $R_{21}$ in General Formula (b-2) in the composition of the embodiment of the present invention.

In General Formula (b-3), $R_{22}$ has the same definition as $R_{22}$ in General Formula (b-3) in the composition of the embodiment of the present invention.

In General Formula (b-4), $R_{23}$ has the same definition as $R_{23}$ in General Formula (b-4) in the composition of the embodiment of the present invention.

In General Formula (b-6), $R_{24}$ has the same definition as $R_{24}$ in General Formula (b-6) in the composition of the embodiment of the present invention.

In General Formula (b-7), $R_{25}$ has the same definition as $R_{25}$ in General Formula (b-7) in the composition of the embodiment of the present invention.

In General Formula (b-8), $R_{26}$ has the same definition as $R_{26}$ in General Formula (b-8) in the composition of the embodiment of the present invention.

In General Formula (b-9), $R_{27}$ has the same definition as $R_{27}$ in General Formula (b-9) in the composition of the embodiment of the present invention.

General Formula (IA-1-1) is as described above.

In General Formula (B), $R_{21}$ and $R_{22}$ have the same definition as $R_{21}$ and $R_{22}$ in General Formula (B), respectively, in the composition of the embodiment of the present invention.

In General Formula (a-x), $R_y$ has the same definition as $R_y$ in General Formula (a-x) in the composition of the embodiment of the present invention.

It is preferable that $R_c$ in the compound represents an alkyl group, a cycloalkyl group, an aryl group, or a fluorine atom.

Examples of the alkyl group, the cycloalkyl group, and the aryl group as $R_c$ include the same ones as the groups described as the alkyl group, the cycloalkyl group, and the aryl group in $R_c$ of General Formula (I) in the composition of the embodiment of the present invention, respectively.

[Pattern Forming Method and Actinic Ray-Sensitive or Radiation-Sensitive Film]

The present invention also relates to a pattern forming method using the actinic ray-sensitive or radiation-sensitive resin composition. Hereinafter, the pattern forming method of the embodiment of the present invention will be described. In addition, along with the description of the pattern forming method, the actinic ray-sensitive or radiation-sensitive film (typically a resist film) of the embodiment of the present invention formed using the actinic ray-sensitive or radiation-sensitive resin composition of the embodiment of the present invention will also be described.

The pattern forming method of an embodiment of the present invention has:

(i) a step of forming an actinic ray-sensitive or radiation-sensitive film (typically a resist film) on a support using the above-mentioned actinic ray-sensitive or radiation-sensitive resin composition (actinic ray-sensitive or radiation-sensitive film forming step (film forming step)), (ii) a step of exposing the actinic ray-sensitive or radiation-sensitive film (irradiating the film with actinic rays or radiation) (exposing step), and (iii) a step of developing the exposed actinic ray-sensitive or radiation-sensitive film using a developer (developing step).

The pattern forming method of the embodiment of the present invention is not particularly limited as long as the method includes the steps (i) to (iii), and may further has the following steps.

In the pattern forming method of the embodiment of the present invention, the exposing method in the exposing step (ii) may be liquid immersion exposure.

The pattern forming method of the embodiment of the present invention preferably includes a prebaking (PB) step (iv) before the exposing step (ii).

The pattern forming method of the embodiment of the present invention preferably includes a post-exposure baking (PEB) step (v) after the exposing step (ii) and before the developing step (iii).

The pattern forming method of the embodiment of the present invention may include the exposing step (ii) a plurality of times.

The pattern forming method of the embodiment of the present invention may include the prebaking step (iv) a plurality of times.

The pattern forming method of the embodiment of the present invention may include the post-exposure baking step (v) a plurality of times.

In the pattern forming method of the embodiment of the present invention, the above-described resist film forming step (film forming step) (i), exposing step (ii), and developing step (iii) can be performed by a generally known method.

From the viewpoint of improving the resolving power, the film thickness of the actinic ray-sensitive or radiation-sensitive film is preferably 110 nm or less, and more preferably 95 nm or less.

In addition, a resist underlayer film (for example, spin on glass (SOG), spin on carbon (SOC), and an antireflection film) may be formed between the actinic ray-sensitive or radiation-sensitive film and the support, as desired. As a material constituting the resist underlayer film, known organic or inorganic materials can be appropriately used.

A protective film (topcoat) may be formed on the actinic ray-sensitive or radiation-sensitive film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-described acid diffusion control agent.

The protective film may be formed on the actinic ray-sensitive or radiation-sensitive film including the above-mentioned hydrophobic resin.

The support is not particularly limited, and a substrate which is generally used in a step of manufacturing a semiconductor such as an IC, and a step of manufacturing a circuit board for a liquid crystal, a thermal head, or the like, and other lithographic steps of photofabrication can be used. Specific examples of the support include an inorganic substrate such as silicon, $SiO_2$, and SiN.

For any of the prebaking step (iv) and the post-exposure baking step (v), the baking temperature is preferably 70° C. to 130° C., and more preferably 80° C. to 120° C.

For any of the prebaking step (iv) and the post-exposure baking step (v), the baking time is preferably 30 to 300 seconds, more preferably 30 to 180 seconds, and still more preferably 30 to 90 seconds.

The baking may be performed using a unit included in an exposing device and a developing device, and may also be performed using a hot plate or the like.

A light source wavelength used in the exposing step is not limited, and examples thereof include infrared light, visible light, ultraviolet light, far ultraviolet light, extreme ultraviolet rays (EUV), X-rays, and electron beams. Among those, far ultraviolet rays are preferable, and a wavelength thereof is preferably 250 nm or less, more preferably 220 nm or less, and still more preferably 1 to 200 nm. Specifically, a KrF excimer laser (248 nm), an ArF excimer laser (193 nm), an $F_2$ excimer laser (157 nm), X-rays, EUV (13 nm), or electron beams are preferable, and the KrF excimer laser, the ArF excimer laser, EUV, or the electron beams are more preferable.

In the developing step (iii), the developer may be either an alkali developer or a developer including an organic solvent (hereinafter also referred to as an organic developer).

As the alkali developer, a quaternary ammonium salt typified by tetramethylammonium hydroxide is usually used, but in addition to this, an aqueous alkali solution such as an inorganic alkali, primary to tertiary amines, an alcoholamine, and a cyclic amine can also be used.

Furthermore, the alkali developer may include an appropriate amount of alcohols and/or a surfactant. The alkali concentration of the alkali developer is usually 0.1% to 20% by mass. The pH of the alkali developer is usually 10 to 15.

A time period for performing development the using the alkali developer is usually 10 to 300 seconds.

The alkali concentration, the pH, and the development time using the alkali developer can be appropriately adjusted depending on a pattern formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably, the moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass with respect to the total amount of the developer.

The developer may include an appropriate amount of a known surfactant, as desired.

The content of the surfactant is usually 0.001% to 5% by mass, preferably 0.005% to 2% by mass, and more preferably 0.01% to 0.5% by mass with respect to the total amount of the developer.

The organic developer may include the acid diffusion control agent.

Examples of the developing method include a method in which a substrate is immersed in a tank filled with a developer for a certain period of time (a dip method), a method in which a developer is heaped up onto the surface of a substrate by surface tension, and then left to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

A combination of a step of performing development using an aqueous alkali solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. Moreover, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent, or the like can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as the solvents described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol.

The monohydric alcohol preferably has 5 or more carbon atoms, and examples thereof include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

A moisture content in the rinsing liquid used in the rinsing step after the developing step using the developer including the organic solvent is preferably 10% by mass or less, more preferably 5% by mass or less, and still more preferably 3% by mass or less. In a case where the moisture content is 10% by mass or less, good development characteristics are obtained.

The rinsing liquid after the developing step using the developer including the organic solvent may include an appropriate amount of the surfactant.

In the rinsing step, the developed substrate is subjected to a washing treatment using a rinsing liquid. A method for the cleaning treatment is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), a method in which a rinsing liquid is heaped up onto the surface of a substrate by surface tension, and then left to stand for a certain period of time (a puddle method), and a method in which a rinsing liquid is sprayed on a substrate surface (a spray method). In addition, it is also preferable that the substrate is rotated at a rotation speed of 2,000 to 4,000 rpm after cleaning to remove the rinsing liquid from the substrate. Furthermore, it is also preferable that the method includes a baking step after the rinsing step (post bake). The developer and the rinsing liquid remaining between and inside the patterns are removed by the baking step. In the baking step after the rinsing step, the baking temperature is usually 40° C. to 160° C., and preferably 70° C. to 95° C., and the baking time is usually 10 seconds to 3 minutes, and preferably 30 to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention do not include impurities such as metal components, isomers, and residual monomers. The content of the impurities included in these materials is preferably 1 ppm by mass or less, more preferably 100 ppt by mass or less, and still more preferably 10 ppt by mass or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filter filtration, a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities using an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing material include the materials disclosed in the specification of JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation under conditions suppressing contamination as much as possible by performing a lining with TEFLON (registered trademark), or the like in the inside of a device is performed. It is also preferable to carry out a glass lining treatment in all steps in a manufacturing facility for synthesizing various materials (a binder, PAG, and the like) of the resist component in order to reduce metals to a ppt order. Preferred conditions for the filtration using a filter performed on the raw materials constituting various materials are the same ones as the above-mentioned conditions.

In order to prevent impurities from being incorporated, it is preferable that various materials are stored in the container described in US2015/0227049A, JP2015-123351A, JP2017-13804A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc. of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

In addition, the present invention further relates to a method for manufacturing an electronic device, including the above-described pattern forming method. The electronic device manufactured by the method for manufacturing an electronic device of an embodiment of the present invention is suitably mounted on electric and electronic equipment (for example, home appliances, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

Furthermore, the weight-average molecular weight (Mw) and the dispersity (Mw/Mn) of the resin included in the composition were measured by means of gel permeation chromatography (carrier: tetrahydrofuran) (an amount expressed in terms of polystyrene). In addition, the compositional ratio (ratio based on % by mole) of the resin included in the composition was measured by means of $^{13}$C-nuclear magnetic resonance (NMR).

[Components of Composition]

Components included in an actinic ray-sensitive or radiation-sensitive resin composition (hereinafter also referred to as a "composition") used in each of Examples or Comparative Examples are shown below.

<Specific Compound and Comparative Compound>

As the specific compound, compounds B-1 to B-34 shown below were used in the preparation of the composition.

Furthermore, the compounds B-101 to B-104 are comparative compounds that do not correspond to the specific compound.

B-1

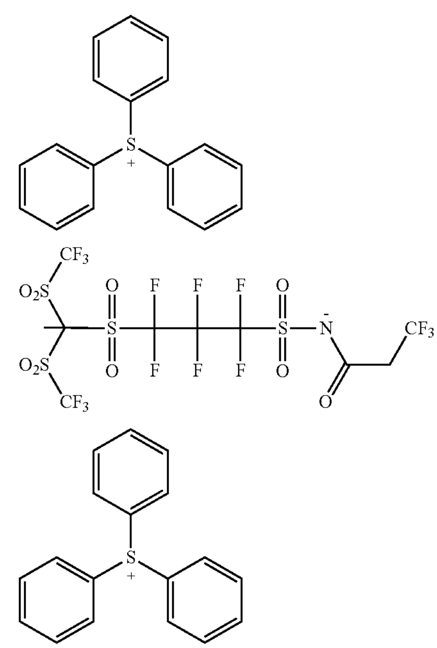

B-2

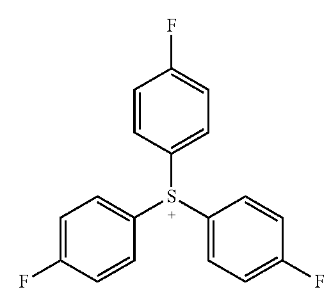

-continued
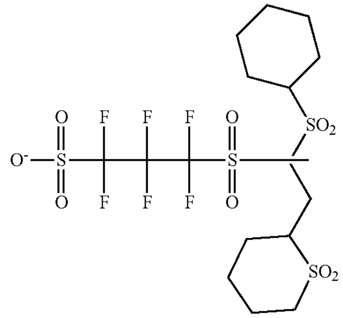
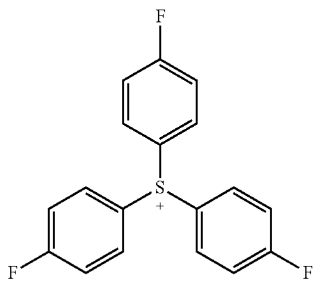
B-3
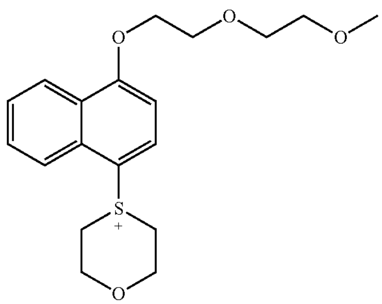
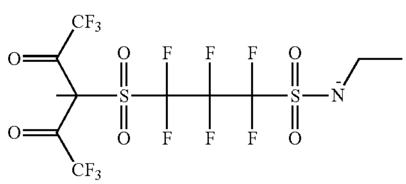
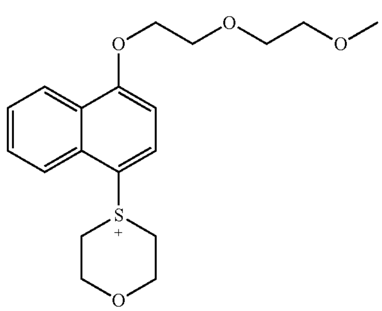
B-4
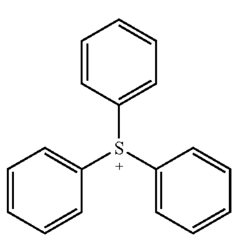
-continued
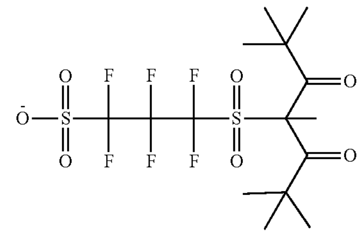
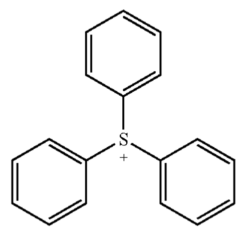
B-5
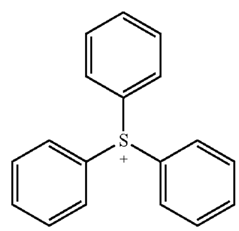
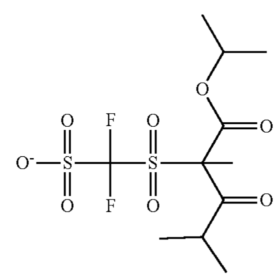
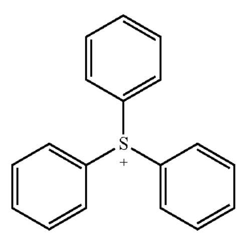
B-6
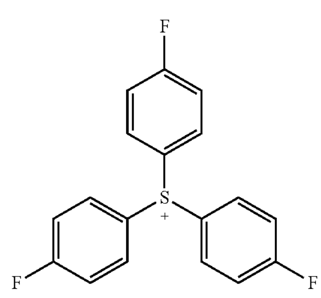

-continued
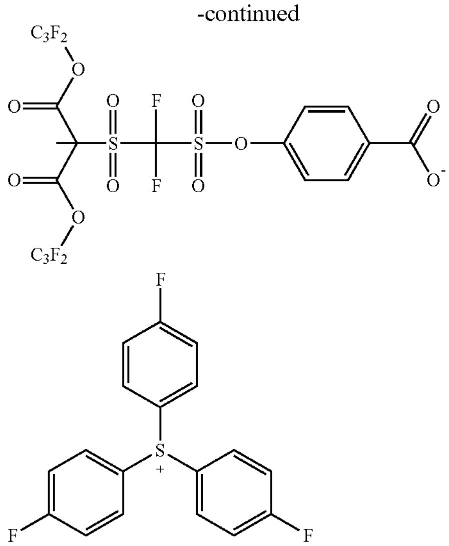
B-7
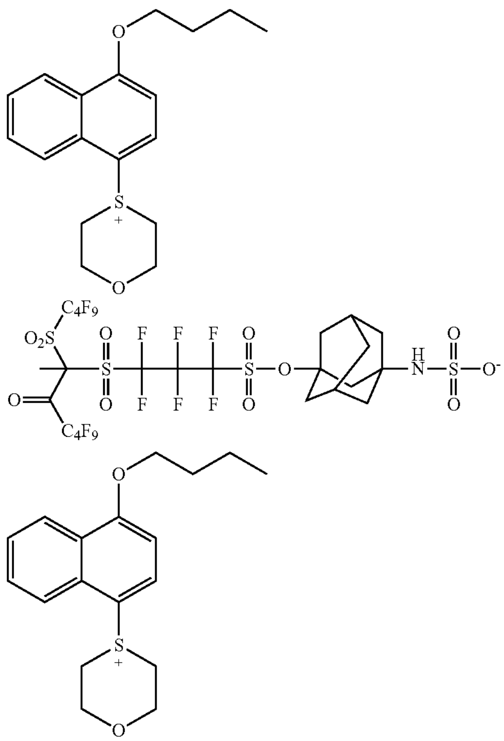
B-8
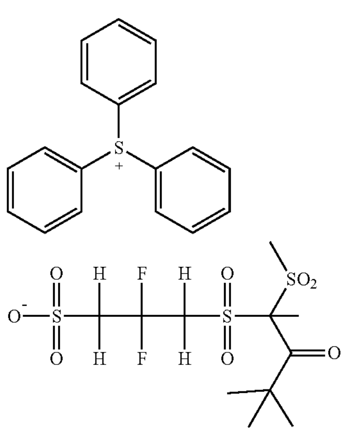
-continued
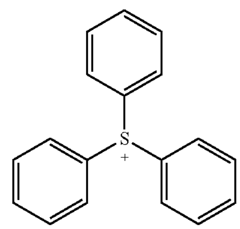
B-9
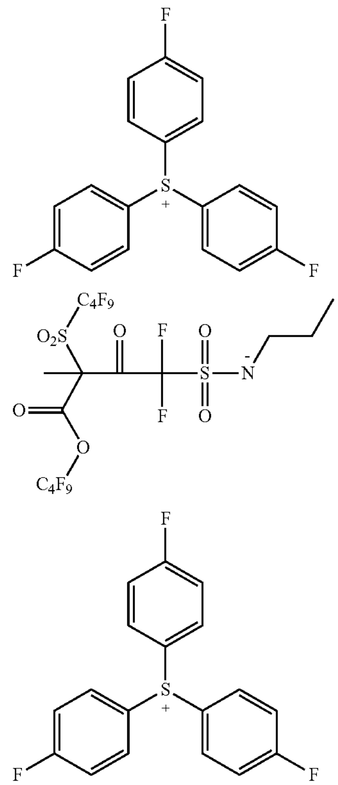
B-10
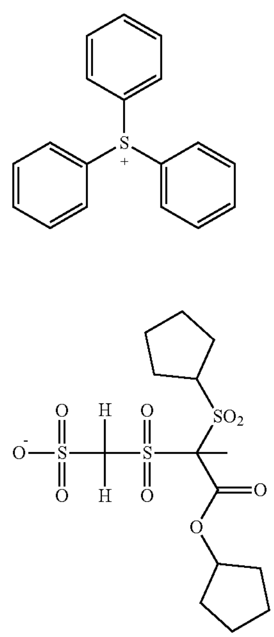

-continued
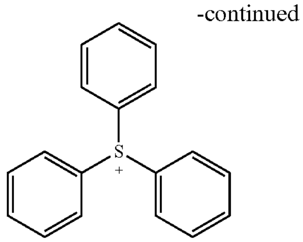
B-11
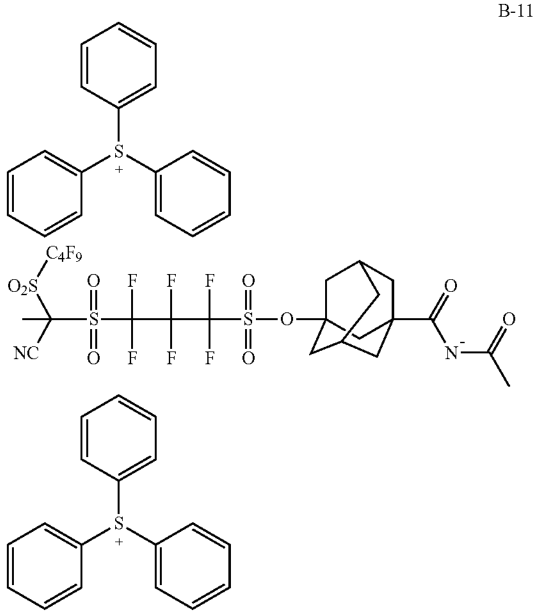
B-12
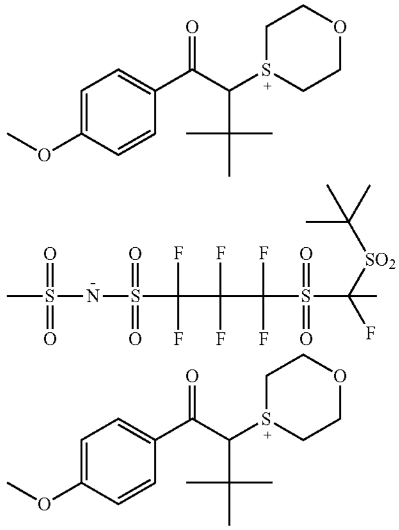
B-13
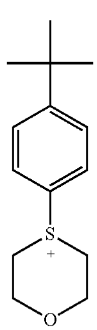
-continued
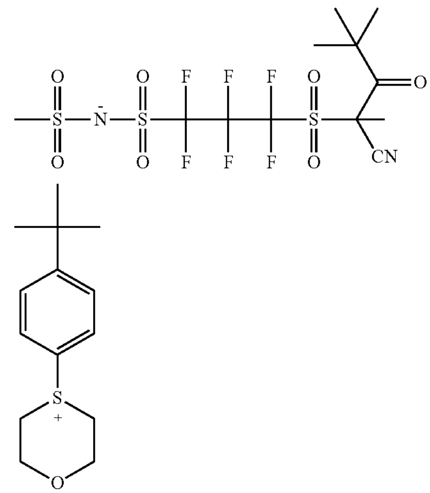
B-14
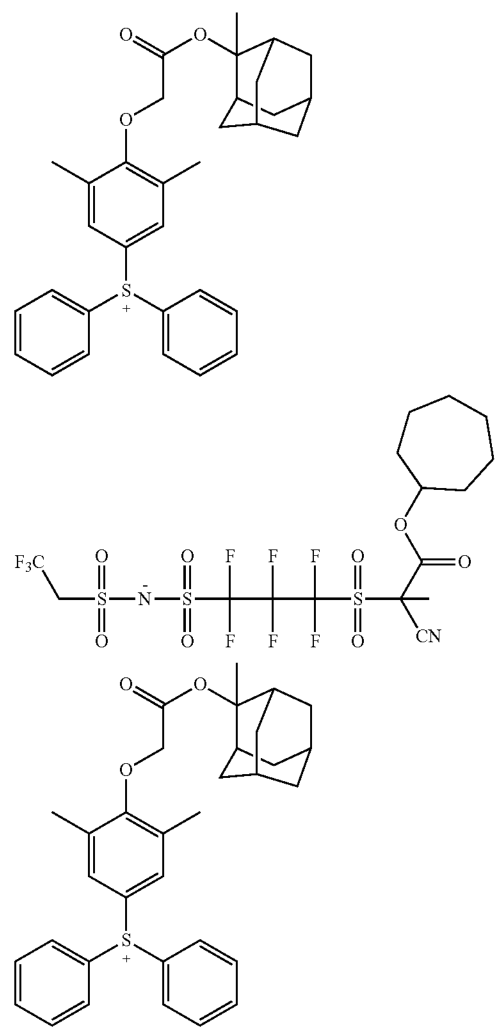
B-15
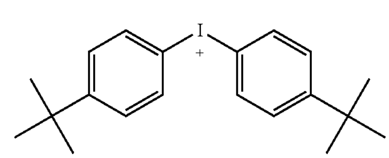

-continued
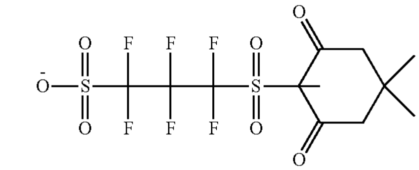
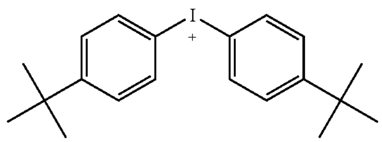
B-16
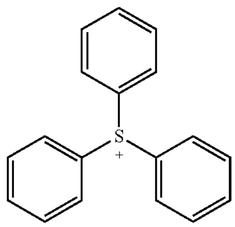
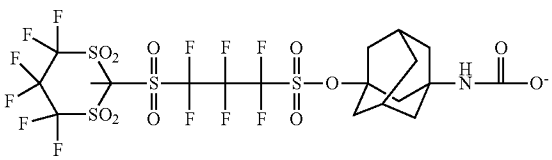
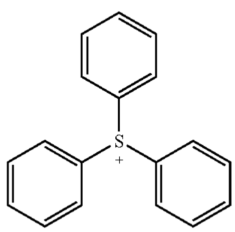
B-17
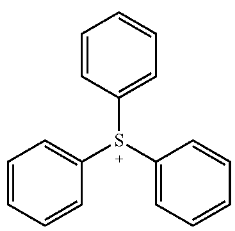
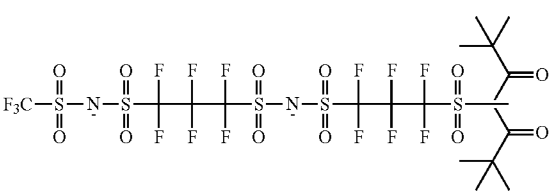
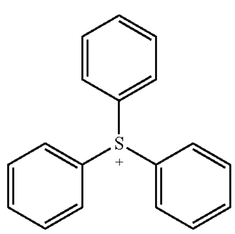
-continued
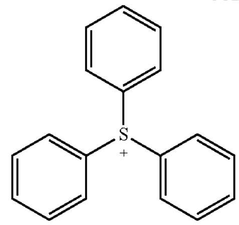
B-18
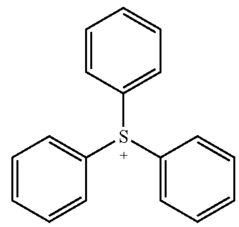
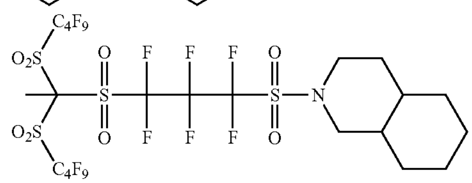
B-19
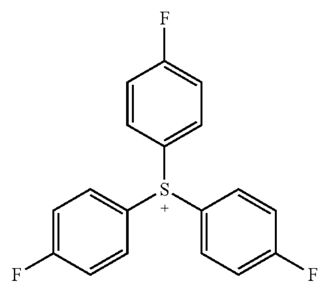
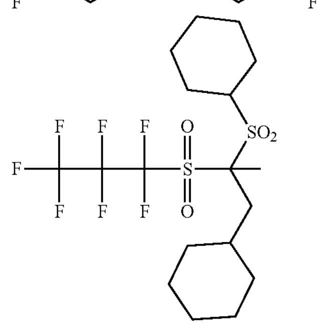
B-20
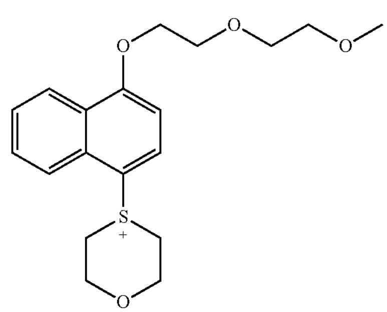
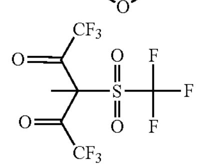

-continued
B-21
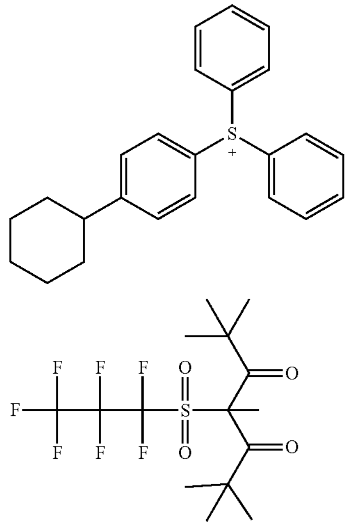
B-22
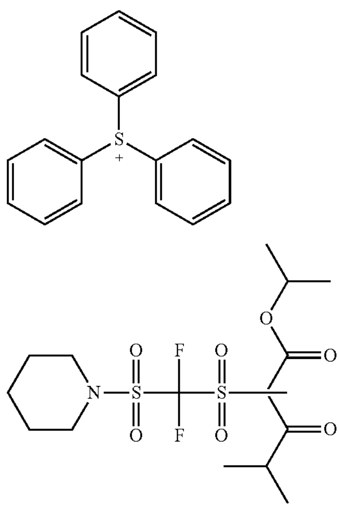
B-23
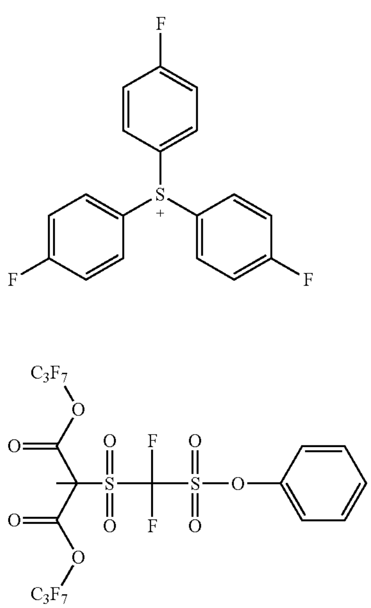
-continued
B-24
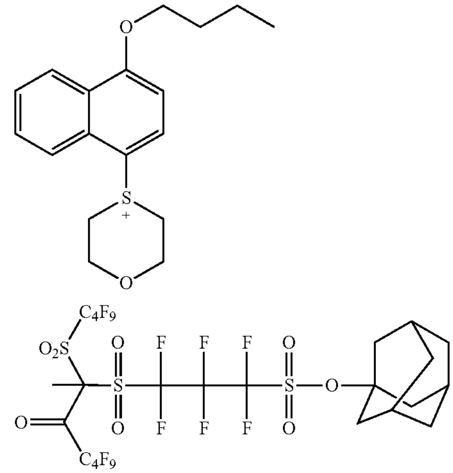
B-25
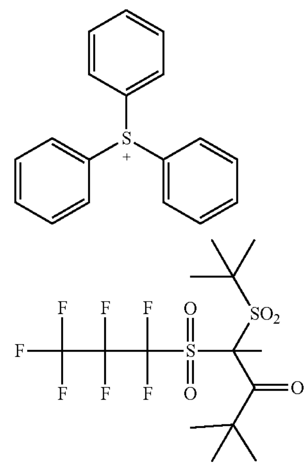
B-26
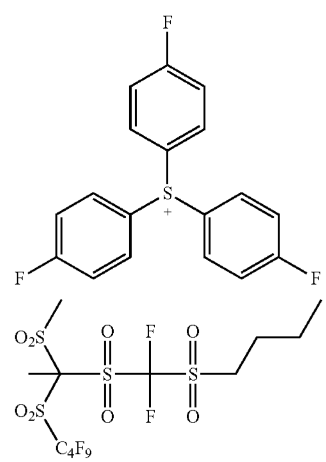
B-27
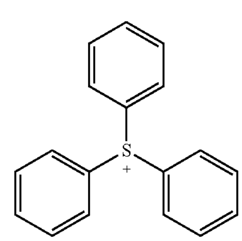

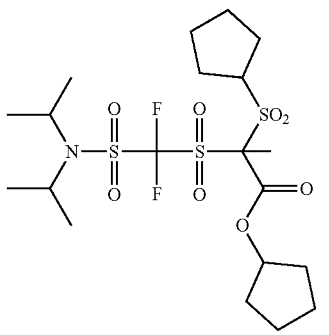
B-28
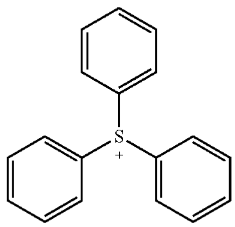
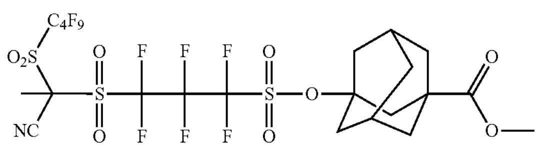
B-29
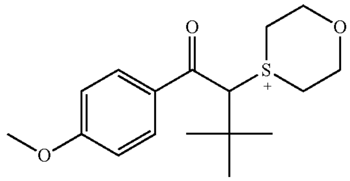
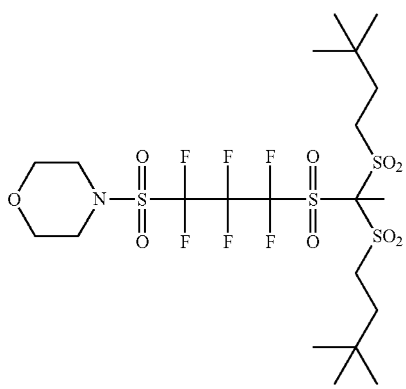
B-30
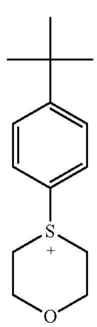
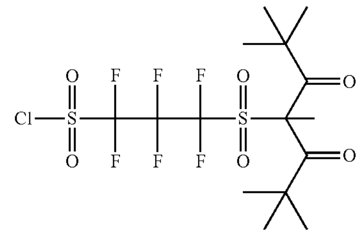
B-31
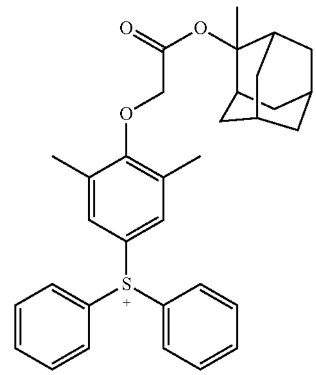
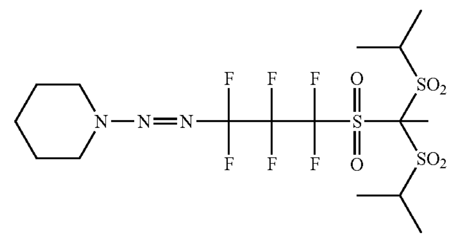
B-32
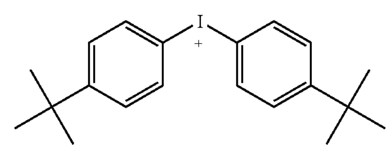
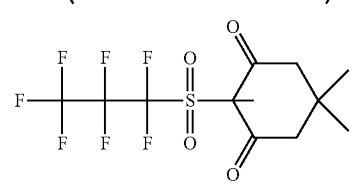
B-33
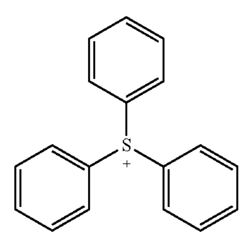
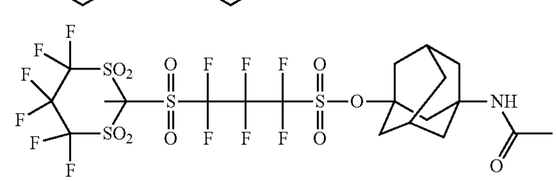

-continued

B-34

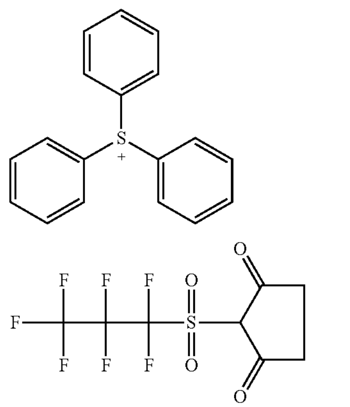

B-101

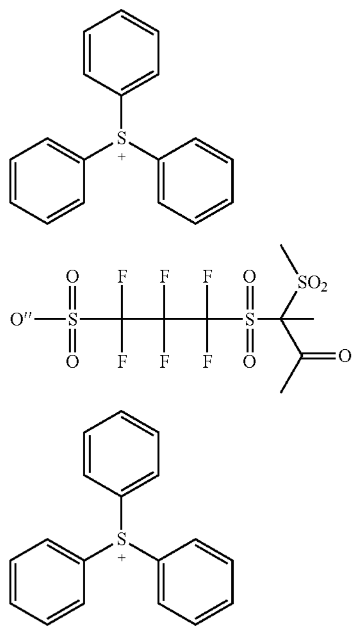

B-102

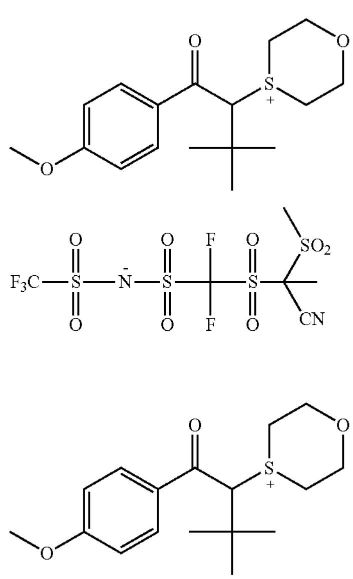

-continued

B-103

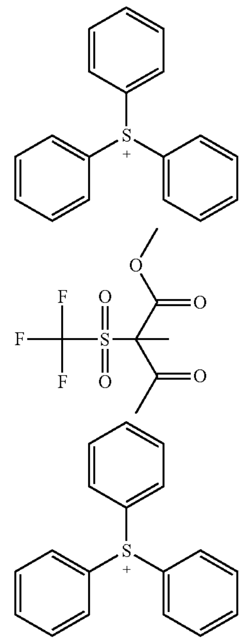

B-104

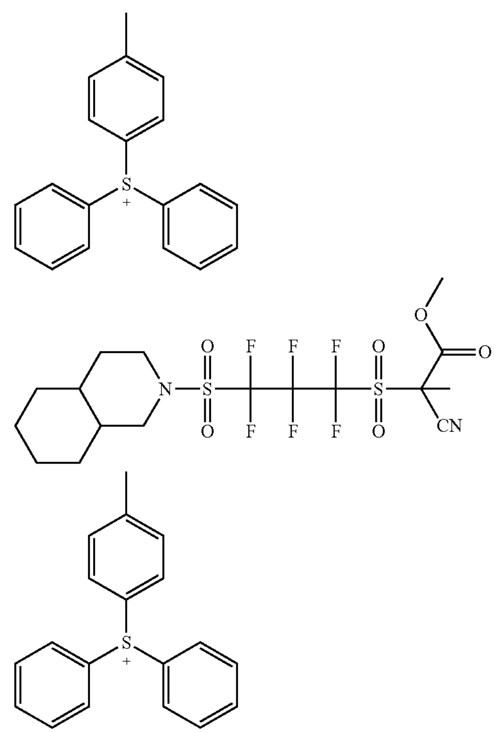

The compound B-4 was synthesized by the following method.

A solution obtained by adding 10 g of (x-2) and 400 g of tetrahydrofuran into a 1,000 ml three-necked flask was cooled to 0° C., and 4.6 g of 60% sodium hydride was added thereto in 3 portions. The obtained mixed liquid was stirred at room temperature (23° C.) for 1 hour, 34.3 g of (x-1) was added thereto, and the mixed solution was further stirred at room temperature for 10 hours. The obtained mixed solution was added dropwise to 0.1 N hydrochloric acid water, and the reaction was stopped. The mixture was extracted with ethyl acetate and concentrated to obtain (x-3). (X-3) was reacted at 60° C. for 5 hours in a solution of THF (28 mL), water (25 mL), and sodium hydrogen carbonate (3.5 g) to obtain (x-4). 7.1 g of (x-5) and 50 g of methylene chloride were added to a solution including (x-4), the mixture was stirred at room temperature for 1 hour, and then the organic layer was separated, concentrated, and purified to obtain a compound (B-4) (total yield: 35%).

Furthermore, the $^{1}H$-NMR spectrum (400 MHz, $CDCl_3$) of the compound (B-4) was as follows: 7.6-7.8 (m, 30H) and 1.2 (s, 18H).

The $^{19}F$-NMR spectrum (400 MHz, $CDCl_3$) of the compound (B-4) was as follows: −108.6, −113.2, and −118.1.

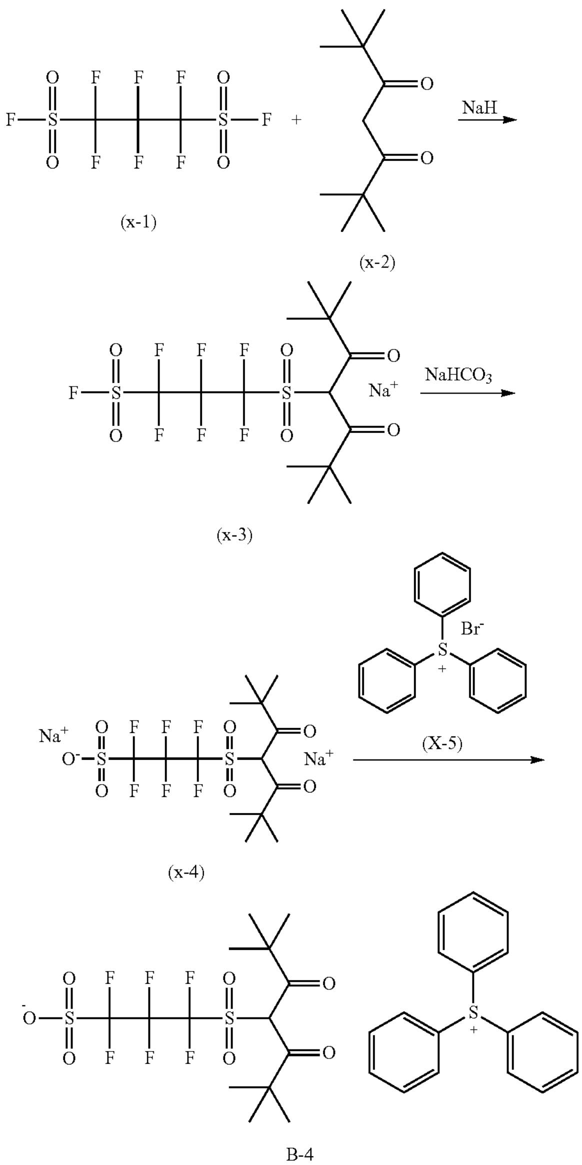

In addition, the compounds B-1 to B-3, and B-5 to B-34, and the comparative compounds B-101 to B-104 were synthesized with reference to the synthesis method.

<Acid-Decomposable Resin (Resin A)>

Resins A-1 to A-15 shown below were used as the acid-decomposable resin (resin A) in the preparation of the composition.

A-1

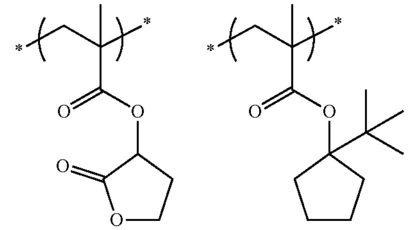

A-2

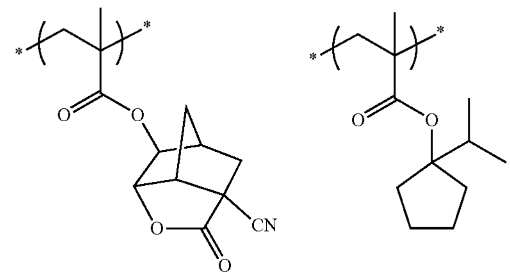

A-3

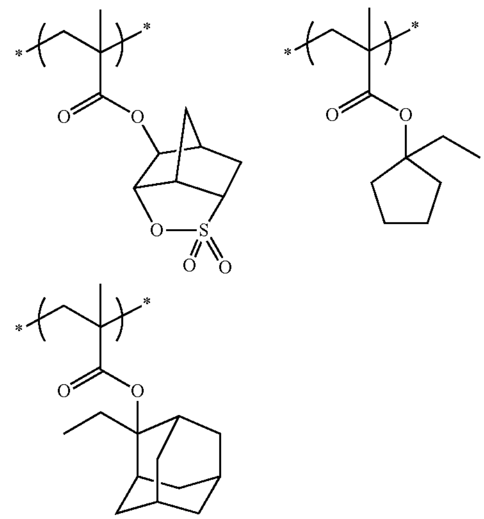

A-4

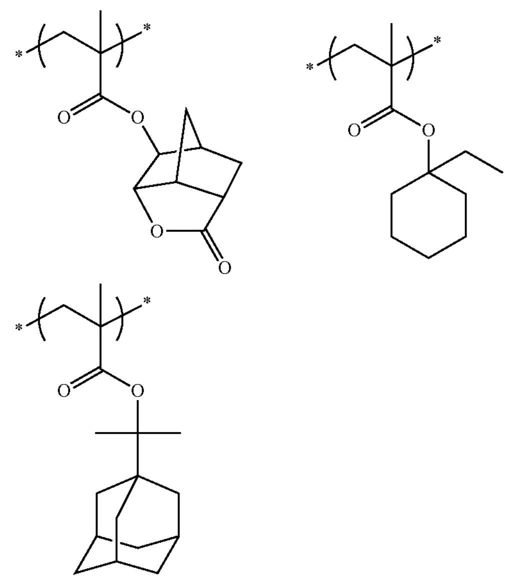

-continued
A-5
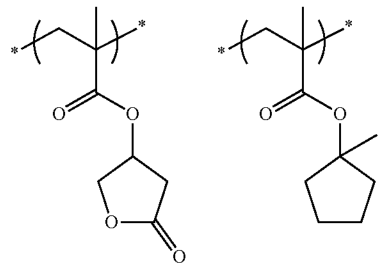
A-6
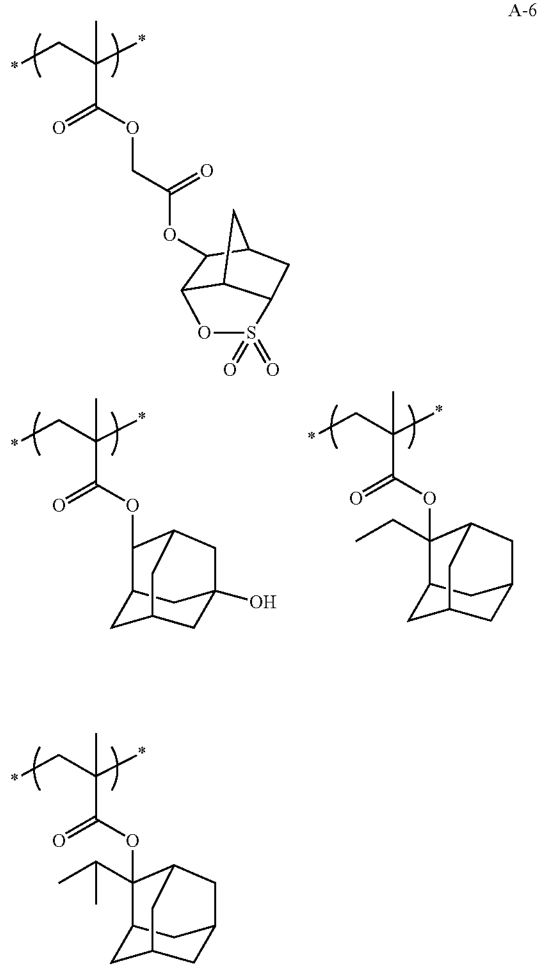
A-7
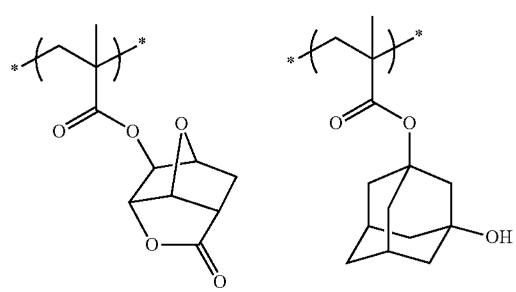
-continued
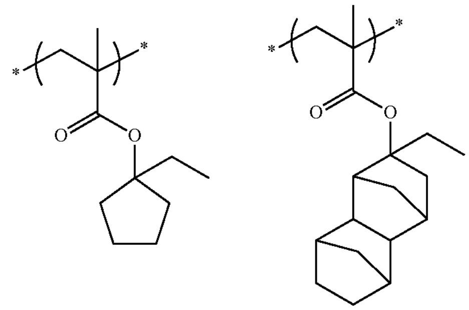
A-8
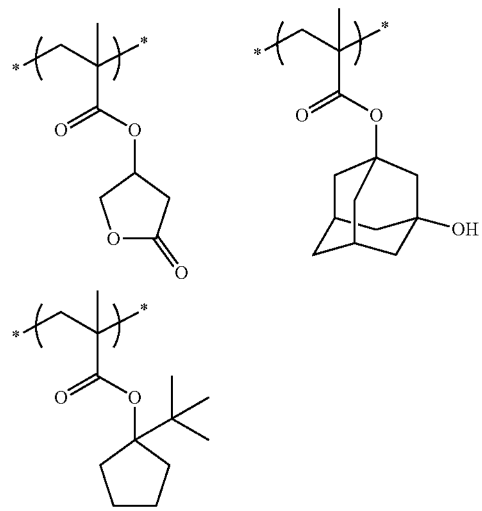
A-9
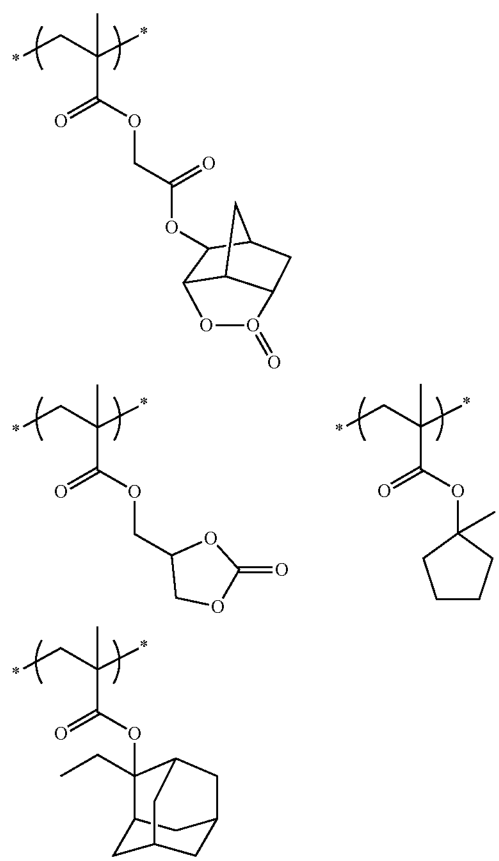

-continued
A-10
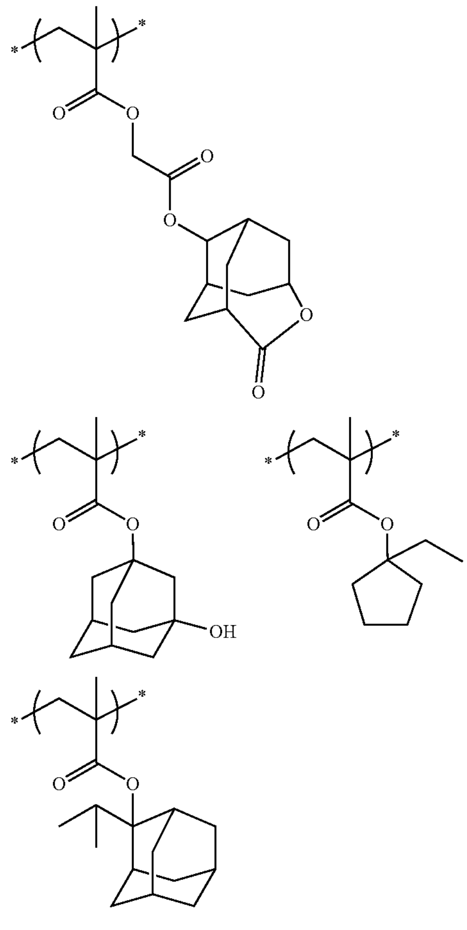
A-11
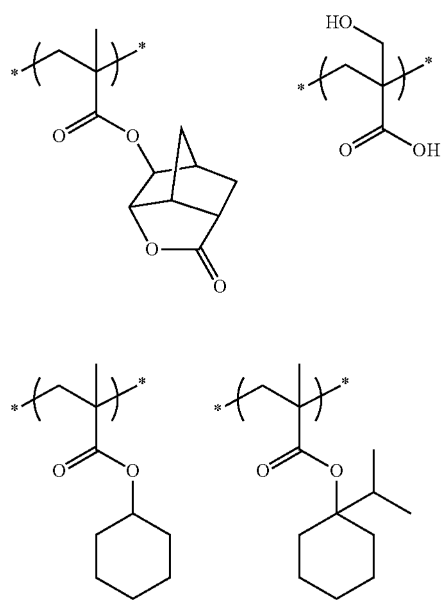
-continued
A-12
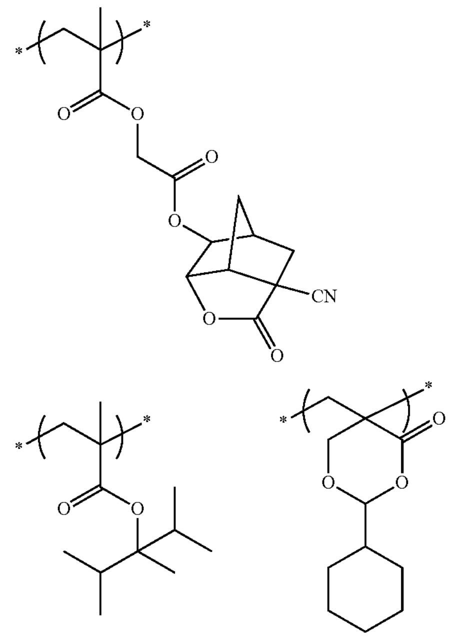
A-13
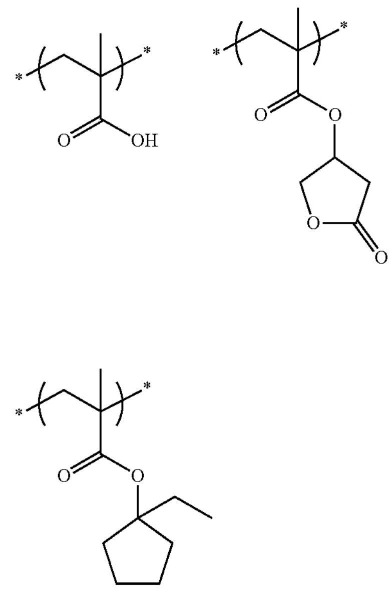
A-14
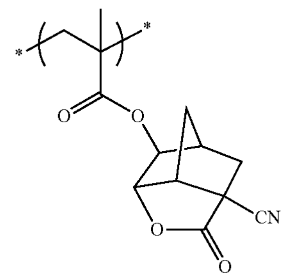

-continued

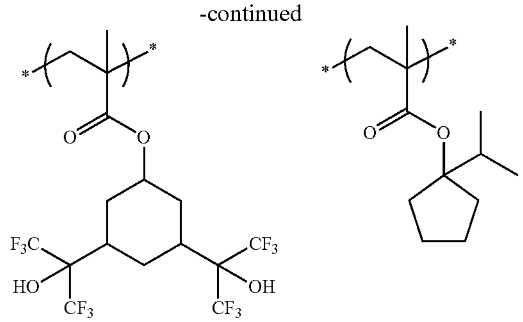

A-15

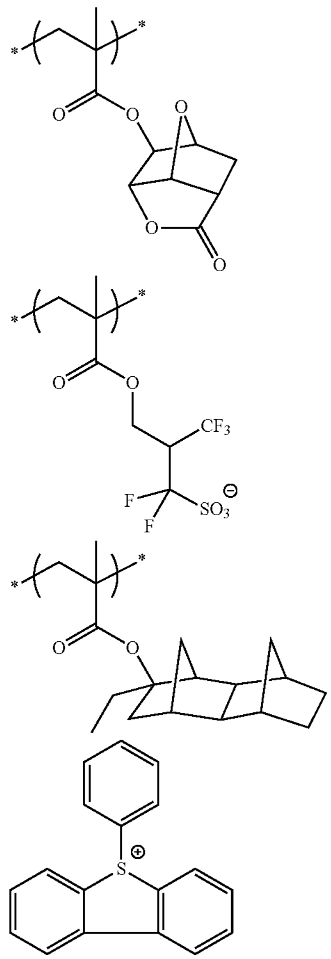

The molar ratios of the repeating units constituting each resin shown above (corresponding in order from the left), and the weight-average molecular weight (Mw) and the dispersity (Mw/Mn) of each resin are shown in Table 1.

TABLE 1

| Resin | Molar ratio of repeating unit | | | | Mw | Mw/Mn |
|---|---|---|---|---|---|---|
| A-1 | 50 | 50 | — | — | 6,500 | 1.52 |
| A-2 | 45 | 55 | — | — | 8,300 | 1.65 |
| A-3 | 40 | 30 | 30 | — | 7,800 | 1.55 |
| A-4 | 40 | 50 | 10 | — | 12,000 | 1.68 |
| A-5 | 50 | 50 | — | — | 5,500 | 1.49 |
| A-6 | 25 | 30 | 30 | 15 | 8,600 | 1.63 |
| A-7 | 40 | 10 | 30 | 20 | 9,600 | 1.72 |
| A-8 | 40 | 5 | 55 | — | 10,200 | 1.64 |
| A-9 | 30 | 20 | 40 | 10 | 7,500 | 1.54 |

TABLE 1-continued

| Resin | Molar ratio of repeating unit | | | | Mw | Mw/Mn |
|---|---|---|---|---|---|---|
| A-10 | 40 | 10 | 40 | 10 | 7,000 | 1.61 |
| A-11 | 40 | 10 | 10 | 40 | 6,500 | 1.63 |
| A-12 | 40 | 30 | 30 | — | 5,900 | 1.59 |
| A-13 | 10 | 30 | 60 | — | 5,200 | 1.53 |
| A-14 | 20 | 20 | 60 | — | 5,700 | 1.75 |
| A-15 | 20 | 20 | 60 | — | 5,700 | 1.75 |

The resin A-1 used in the preparation of the composition was synthesized according to the following scheme.

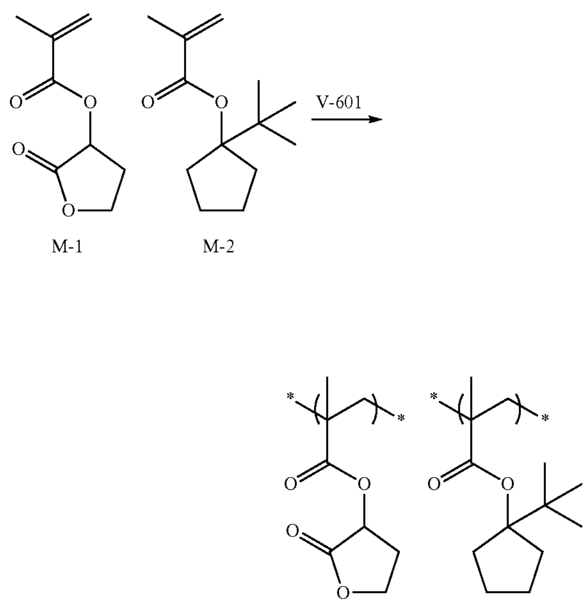

A-1

Cyclohexanone (113 g) was heated to 80° C. under a nitrogen stream. While stirring this liquid, a mixed solution of the monomer represented by Formula M-1 (25.5 g), the monomer represented by Formula M-2 (31.6 g), cyclohexanone (210 g), and dimethyl 2,2'-azobisisobutyrate [product name "V-601", manufactured by FUJIFILM Wako Pure Chemical Corporation] (6.21 g) was added dropwise thereto over 6 hours to obtain a reaction solution. After completion of the dropwise addition, the obtained reaction solution was heated to 80° C. and further stirred for 2 hours. After leaving the obtained reaction solution to be cooled, a large amount of a mixed liquid of methanol and water (methanol:water=9:1 (mass ratio)) was added to the reaction solution to reprecipitate the reaction product. The obtained mixed liquid was filtered, and the obtained solid was vacuum-dried to obtain a resin A-1 (52 g).

In addition, the resins A-2 to A-15 were synthesized with reference to the synthesis method and used in the preparation of the composition.

<Photoacid Generator>

As the photoacid generator not corresponding to the specific compound, compounds C-1 to C-25 shown below were used in the preparation of the composition.

C-1
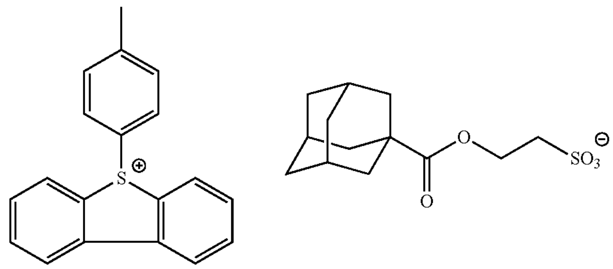
C-2
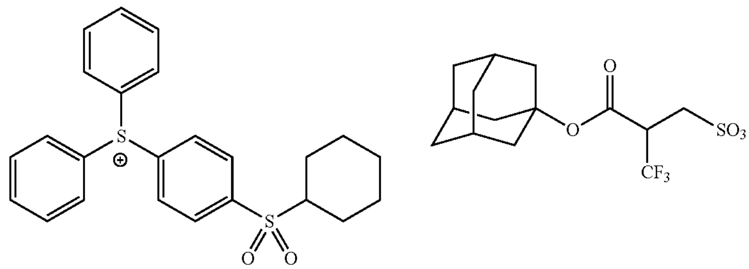
C-3
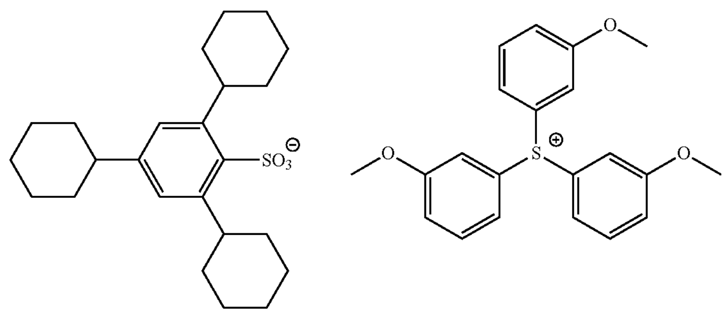
C-4
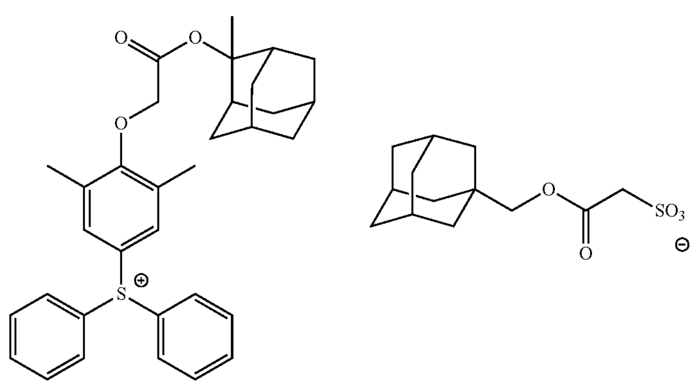
C-5
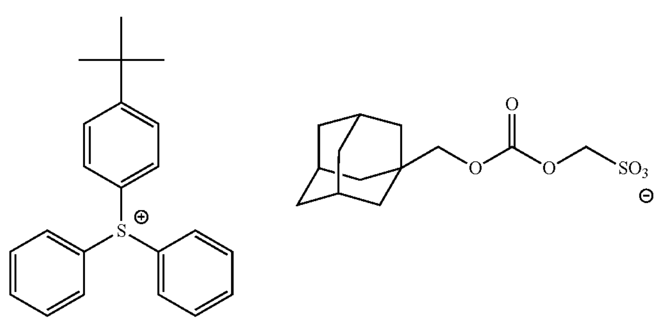

-continued
C-6
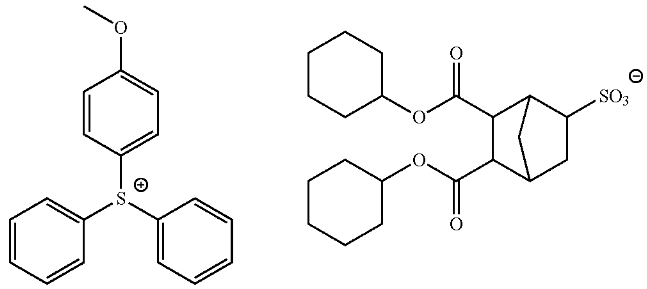
C-7
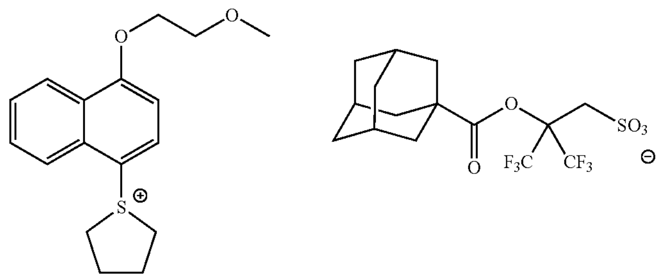
C-8
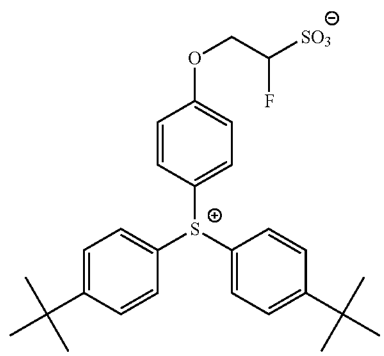
C-9
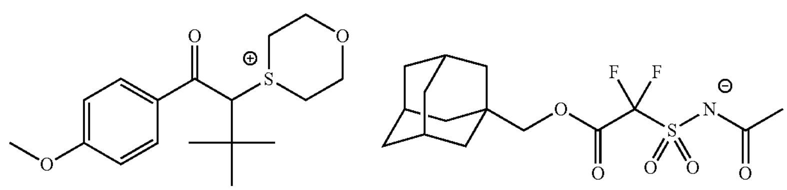
C-10
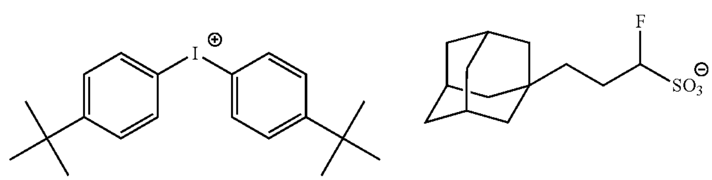
C-11
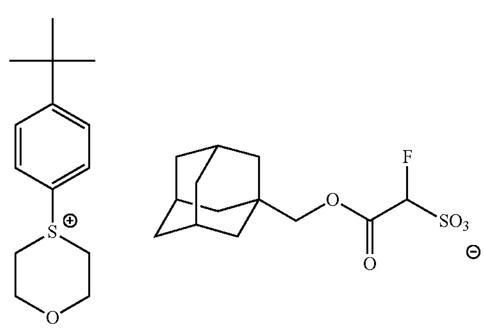

-continued
C-12
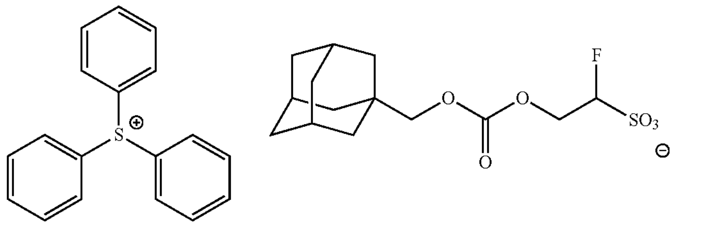
C-13
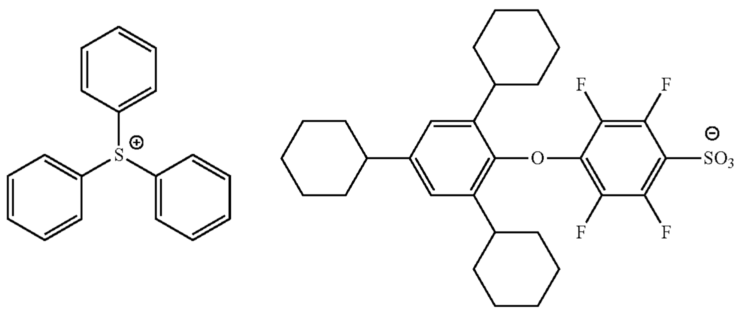
C-14
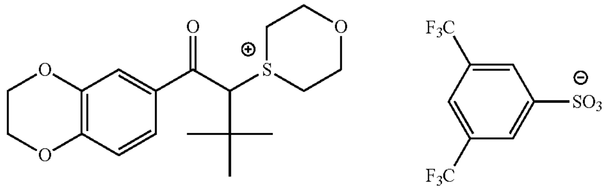
C-15
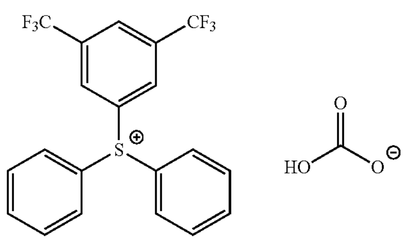
C-16
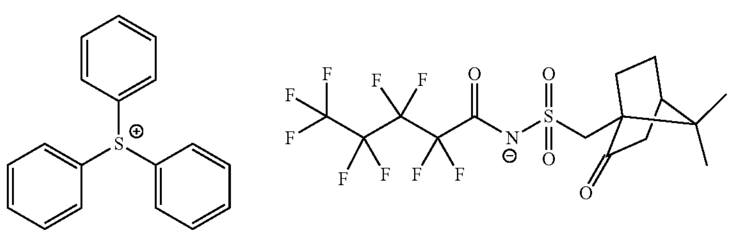
C-17
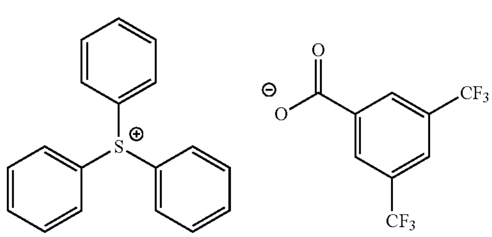

-continued
C-18
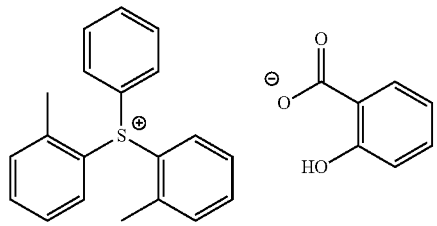
C-19
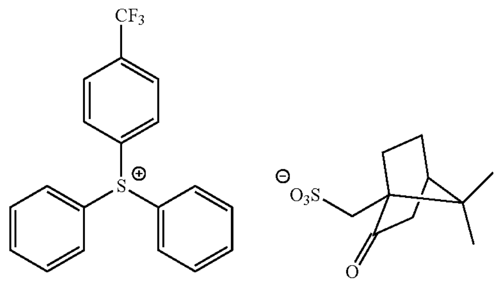
C-20
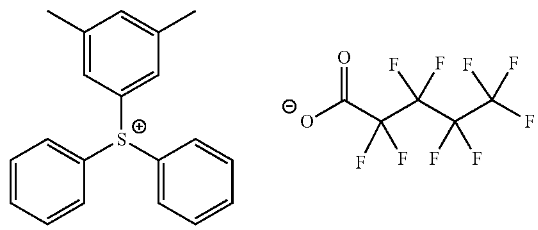
C-21
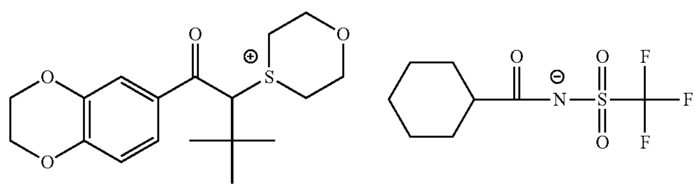
C-22
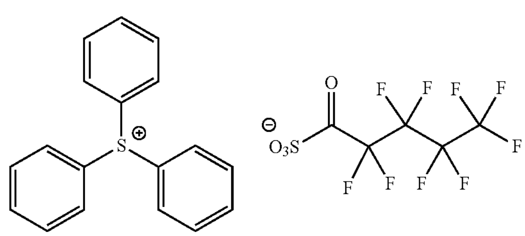
C-23
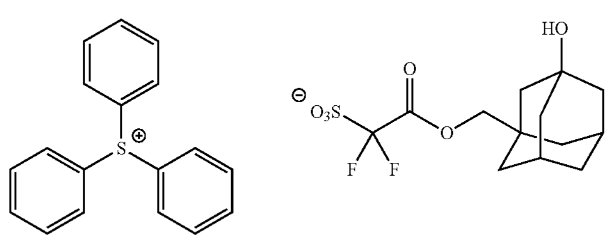

-continued

C-24

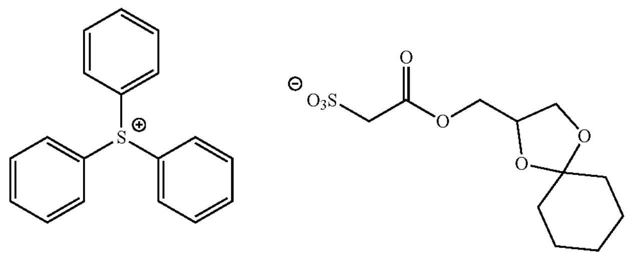

C-25

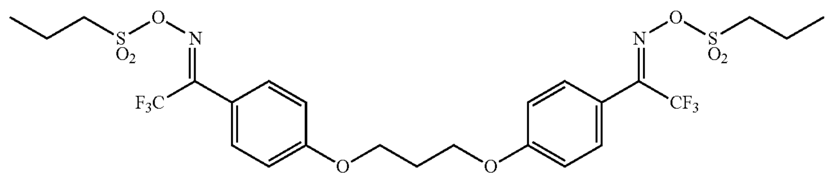

<Acid Diffusion Control Agent>

As the acid diffusion control agent not corresponding the specific compound, compounds D-1 to D-4 shown below were used in the preparation of the composition.

D-1

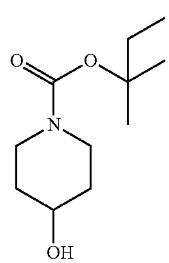

D-2

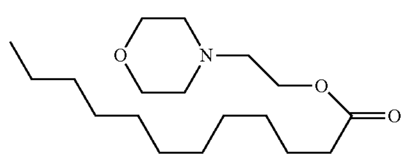

D-3

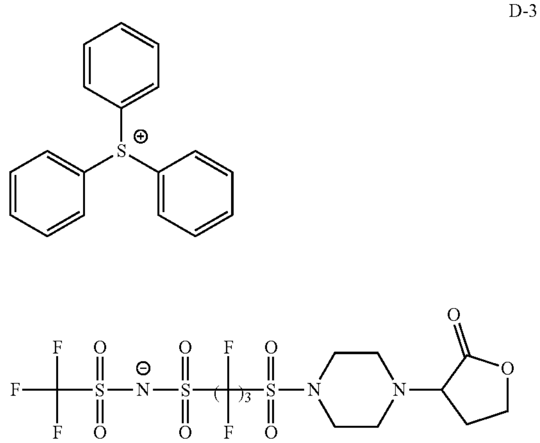

-continued

D-4

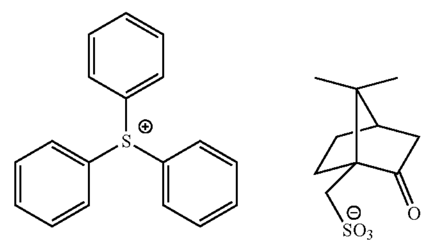

<Hydrophobic Resin and Resin for Topcoat>

Resins E-1 to E-11 having repeating units based on the following monomers were used as the hydrophobic resin in the preparation of the composition.

Resins PT-1 to PT-3 having repeating units based on the following monomers were used as the resin for the topcoat for the preparation of the topcoat composition.

ME-1

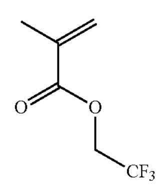

ME-2

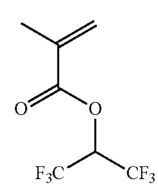

ME-3

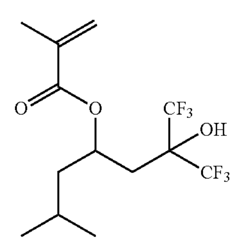

-continued
ME-4
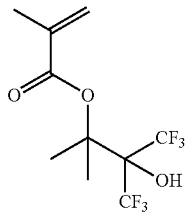
ME-5
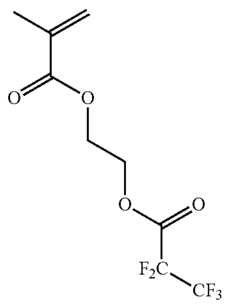
ME-6
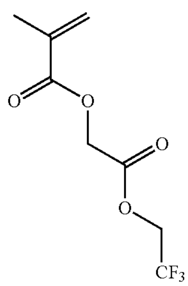
ME-7
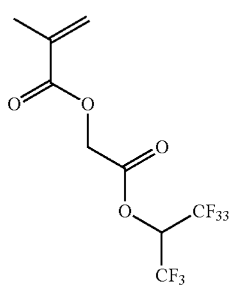
ME-8
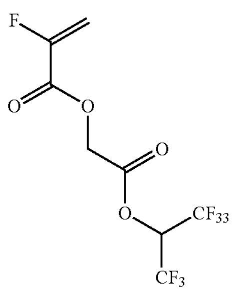
-continued
ME-9
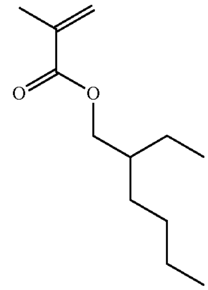
ME-10
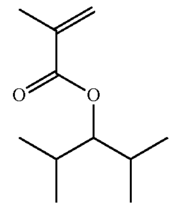
ME-11
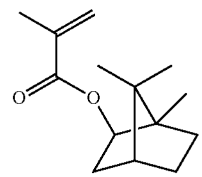
ME-12
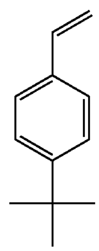
ME-13
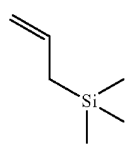
ME-14
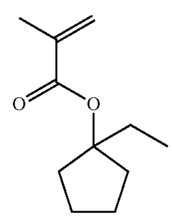
ME-15
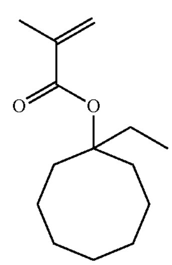

-continued

ME-16

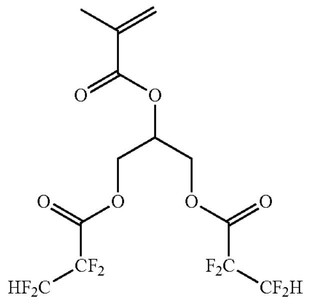

ME-17

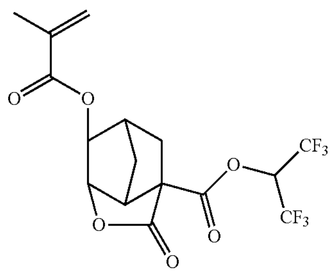

ME-18

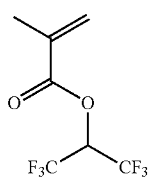

ME-19

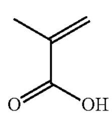

The molar ratios of the repeating units based on the respective monomers, and the weight-average molecular weight (Mw) and the dispersity (Mw/Mn) of each resin in the resins E-1 to E-11 and the resins PT-1 to PT-3 are shown in Table 2.

TABLE 2

| Resin | Molar ratio of repeating unit 1 | | Molar ratio of repeating unit 2 | | Molar ratio of repeating unit 3 | | Molar ratio of repeating unit 4 | | Mw | Mw/Mn |
|---|---|---|---|---|---|---|---|---|---|---|
| E-1 | ME-3 | 60 | ME-4 | 40 | | | | | 10,000 | 1.4 |
| E-2 | ME-14 | 50 | ME-1 | 50 | | | | | 12,000 | 1.5 |
| E-3 | ME-2 | 40 | ME-12 | 50 | ME-9 | 5 | ME-19 | 5 | 6,000 | 1.3 |
| E-4 | ME-18 | 50 | ME-13 | 50 | | | | | 9,000 | 1.5 |
| E-5 | ME-10 | 50 | ME-2 | 50 | | | | | 15,000 | 1.5 |
| E-6 | ME-16 | 50 | ME-14 | 50 | | | | | 10,000 | 1.5 |
| E-7 | ME-7 | 100 | | | | | | | 23,000 | 1.7 |
| E-8 | ME-5 | 100 | | | | | | | 13,000 | 1.5 |
| E-9 | ME-6 | 50 | ME-15 | 50 | | | | | 10,000 | 1.7 |
| E-10 | ME-12 | 10 | ME-17 | 85 | ME-9 | 5 | | | 11,000 | 1.4 |
| E-11 | ME-8 | 80 | ME-11 | 20 | | | | | 13,000 | 1.4 |
| PT-1 | ME-2 | 40 | ME-11 | 30 | ME-9 | 30 | | | 8,000 | 1.6 |
| PT-2 | ME-2 | 50 | ME-8 | 40 | ME-3 | 10 | | | 5,000 | 1.5 |
| PT-3 | ME-3 | 30 | ME-4 | 65 | ME-12 | 5 | | | 8,500 | 1.7 |

<Surfactant>

The surfactants used in the preparation of the composition are shown below.

H-1: MEGAFACE F176 (manufactured by DIC Corporation, fluorine-based surfactant)

H-2: MEGAFACE R08 (manufactured by DIC Corporation, fluorine- and silicon-based surfactant)

H-3: PF656 (manufactured by OMNOVA Solutions Inc., fluorine-based surfactant)

<Solvent>

The solvents used in the preparation of the composition are shown below.

F-1: Propylene glycol monomethyl ether acetate (PGMEA)

F-2: Propylene glycol monomethyl ether (PGME)

F-3: Propylene glycol monoethyl ether (PGEE)

F-4: Cyclohexanone

F-5: Cyclopentanone

F-6: 2-Heptanone

F-7: Ethyl lactate

F-8: y-Butyrolactone

F-9: Propylene carbonate

[Preparation of Composition]

The respective components shown in Table 3 below were mixed so that the concentration of solid contents was 3.8% by mass. Then, an actinic ray-sensitive or radiation-sensitive resin composition was prepared by filtering the obtained mixed solution through a polyethylene filter having a pore size of 0.1 pin.

Furthermore, in the composition, the solid content means all the components excluding the solvent. The obtained composition was used in Examples and Comparative Examples.

Furthermore, in Table 3 below, the content (% by mass) of each component means a content with respect to the total solid content.

The mixing ratio of the solvents is a mass ratio.

The formulation of each composition is shown below.

Compositions 1 to 34 are the compositions used in Examples, and compositions 35 to 38 are the compositions used in Comparative Examples.

TABLE 3

| | Resin A | | Specific compound | | Photoacid generator C | | Acid diffusion control agent D | |
|---|---|---|---|---|---|---|---|---|
| | Type | % by mass | Type | % by mass | Type | % by mass | Type | % by mass |
| Composition 1 | A-1 | 87 | B-1 | 12.7 | — | — | — | — |
| Composition 2 | A-2 | 86.3 | B-2 | 11.7 | — | — | — | — |
| Composition 3 | A-3 | 87.5 | B-3 | 10 | — | — | — | — |
| Composition 4 | A-4 | 85.7 | B-4 | 11.7 | — | — | D-3 | 1 |
| Composition 5 | A-5 | 86.8 | B-5 | 13 | — | — | — | — |
| Composition 6 | A-6 | 88.9 | B-6 | 11 | — | — | — | — |
| Composition 7 | A-7 | 87.6 | B-7 | 12.4 | — | — | — | — |
| Composition 8 | A-8 | 86.6 | B-8 | 12.4 | — | — | — | — |
| Composition 9 | A-9 | 87.8 | B-9 | 10.6 | — | — | D-1 | 0.1 |
| Composition 10 | A-10 | 86.5 | B-10 | 10.3 | — | — | — | — |
| Composition 11 | A-11 | 87.9 | B-11 | 11.2 | — | — | — | — |
| Composition 12 | A-12 | 83.6 | B-12 | 9.2 | C-1 | 2.5 | D-2 | 0.5 |
| Composition 13 | A-13 | 88.2 | B-13 | 9.4 | C-2 | 1 | — | — |
| Composition 14 | A-1/A-5 | 50/34.5 | B-14 | 12 | C-4 | 0.2 | — | |
| Composition 15 | A-9 | 87.9 | B-15 | 9.5 | C-11 | 1.1 | — | — |
| Composition 16 | A-1 | 89.5 | B-16 | 9 | C-12/C-23 | 0.4/0.1 | — | — |
| Composition 17 | A-3 | 85.6 | B-17 | 8.5 | C-1/C-12/C-13 | 4/0.5/0.5 | — | — |
| Composition 18 | A-9 | 88.6 | B-18 | 7.9 | — | — | D-1 | 2.5 |
| Composition 19 | A-10 | 86.2 | B-19 | 4.2 | C-1/C-3 | 4.2/4.2 | — | — |
| Composition 20 | A-1 | 87 | B-20 | 8.4 | | | D-2 | 4.3 |
| Composition 21 | A-2 | 86.3 | B-21 | 3.9 | C-2 | 7.8 | — | — |
| Composition 22 | A-14 | 87.5 | B-22 | 3.5 | C-4 | 6.5 | — | — |
| Composition 23 | A-4 | 85.7 | B-23 | 8.4 | | | D-4 | 4.3 |
| Composition 24 | A-5 | 86.8 | B-24 | 9.1 | C-14/C-15 | 1/1 | D-3 | 1.9 |
| Composition 25 | A-6 | 88.9 | B-25 | 3.6 | C-7 | 7.4 | — | — |

| | Hydrophobic resin | | Surfactant | | Solvent | |
|---|---|---|---|---|---|---|
| | Type | % by mass | Type | % by mass | Type | Mixing ratio |
| Composition 1 | E-3 | 0.3 | — | — | F-1/F-2 | 70/30 |
| Composition 2 | E-1/E-2 | 1/1 | — | — | F-1/F-8 | 85/15 |
| Composition 3 | E-4 | 2.5 | — | — | F-1/F-2/F-8 | 70/25/5 |
| Composition 4 | E-8 | 1.6 | — | — | F-4 | 100 |
| Composition 5 | — | — | H-1/H-2 | 0.1/0.1 | F-1/F-7 | 80/20 |
| Composition 6 | — | — | H-3 | 0.1 | F-1/F-3 | 70/30 |
| Composition 7 | — | — | — | — | F-1/F-5 | 50/50 |
| Composition 8 | E-5 | 1 | — | — | F-1/F-9 | 90/10 |
| Composition 9 | E-9 | 1.5 | — | — | F-1/F-6 | 40/60 |
| Composition 10 | E-10 | 3.2 | — | — | F-1/F-8 | 90/10 |
| Composition 11 | E-11 | 0.8 | — | — | F-1/F-2 | 80/20 |
| Composition 12 | E-8 | 4.2 | — | — | F-1 | 100 |
| Composition 13 | E-7 | 1.4 | — | — | F-7 | 100 |
| Composition 14 | E-1 | 3.3 | — | — | F-1/F-2 | 70/30 |
| Composition 15 | E-2 | 1.5 | — | — | F-1/F-8 | 85/15 |
| Composition 16 | E-5 | 1 | — | — | F-1/F-2/F-8 | 70/25/5 |
| Composition 17 | E-3 | 0.9 | — | — | F-1/F-8 | 85/15 |
| Composition 18 | E-1 | 1 | — | — | F-1/F-2 | 70/30 |
| Composition 19 | E-6 | 1.2 | — | — | F-1/F-8 | 85/15 |
| Composition 20 | E-3 | 0.3 | — | — | F-1/F-2 | 70/30 |
| Composition 21 | E-1/E-2 | 1/1 | — | — | F-1/F-8 | 85/15 |
| Composition 22 | E-4 | 2.5 | — | — | F-1/F-2/F-8 | 70/25/5 |
| Composition 23 | E-8 | 1.6 | — | — | F-4 | 100.0 |
| Composition 24 | — | — | H-1/H-2 | 0.1/0.1 | F-1/F-7 | 80/20 |
| Composition 25 | — | — | H-3 | 0.1 | F-1/F-3 | 70/30 |

TABLE 4

| Table 3-2 | Resin A Type | Resin A % by mass | Specific compound Type | Specific compound % by mass | Photoacid generator C Type | Photoacid generator C % by mass | Acid diffusion control agent D Type | Acid diffusion control agent D % by mass |
|---|---|---|---|---|---|---|---|---|
| Composition 26 | A-7 | 87.6 | B-26 | 8 | C-10/C-17 | 0.5/0.2 | D-1 | 3.7 |
| Composition 27 | A-12 | 83.6 | B-27 | 3.1 | C-16 | 7.9 | D-1 | 1.2 |
| Composition 28 | A-13 | 88.2 | B-28 | 7 | C-25/C- 5 | 0.2/0.1 | D-2 | 3.1 |
| Composition 29 | A-1/A-5 | 50/34.5 | B-29 | 3.7 | C-18 | 8.5 | — | — |
| Composition 30 | A-1 | 87 | B-30 | 4.4 | C-19/C-6 | 7.3/1 | — | — |
| Composition 31 | A-2 | 86.3 | B-31 | 4.6 | C-8 | 7.1 | — | — |
| Composition 32 | A-15 | 87.5 | B-32 | 3.8 | C-20/C-21 | 1/5.2 | — | — |
| Composition 33 | A-4 | 85.7 | B-33 | 7.9 | C-22/C-9 | 0.5/0.5 | D-3 | 3.8 |
| Composition 34 | A-5 | 86.8 | B-34 | 3.9 | C-24 | 9.1 | — | — |
| Composition 35 | A-1 | 87 | B-101 | 8.5 | C-1 | 4.2 | — | — |
| Composition 36 | A-2 | 86.3 | B-102 | 11.7 | — | — | — | — |
| Composition 37 | A-1 | 87 | B-103 | 8.5 | C-1 | 4.2 | — | — |
| Composition 38 | A-2 | 86.3 | B-104 | 11.7 | — | — | — | — |

| Table 3-2 | Hydrophobic resin Type | Hydrophobic resin % by mass | Surfactant Type | Surfactant % by mass | Solvent Type | Solvent Mixing ratio |
|---|---|---|---|---|---|---|
| Composition 26 | — | — | — | — | F-1/F-5 | 50/50 |
| Composition 27 | E-8 | 4.2 | — | — | F-1 | 100.0 |
| Composition 28 | E-7 | 1.4 | — | — | F-7 | 100.0 |
| Composition 29 | E-1 | 3.3 | — | — | F-1/F-2 | 70/30 |
| Composition 30 | E-3 | 0.3 | — | — | F-1/F-2 | 70/30 |
| Composition 31 | E-1/E-2 | 1/1 | — | — | F-1/F-8 | 85/15 |
| Composition 32 | E-4 | 2.5 | — | — | F-1/F-2/F-8 | 70/25/5 |
| Composition 33 | E-8 | 1.6 | — | — | F-4 | 100.0 |
| Composition 34 | — | — | H-1/H-2 | 0.1/0.1 | F-1/F-7 | 80/20 |
| Composition 35 | E-3 | 0.3 | — | — | F-1/F-2 | 70/30 |
| Composition 36 | E-1/E-2 | 1/1 | — | — | F-1/F-8 | 85/15 |
| Composition 37 | E-3 | 0.3 | — | — | F-1/F-2 | 70/30 |
| Composition 38 | E-1/E-2 | 1/1 | — | — | F-1/F-8 | 85/15 |

[Topcoat Composition]

Various components included in the topcoat composition shown in Table 4 are shown below.

<Resin>

As the resin shown in Table 4, resins PT-1 to PT-3 shown in Table 2 were used.

<Additive>

The structures of additives DT-1 to DT-5 shown in Table 4 are shown below.

DT-1

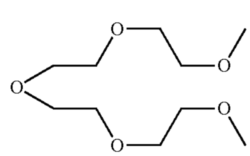

DT-2

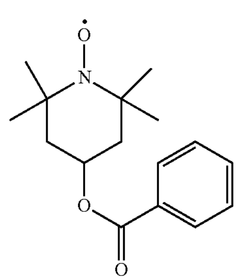

-continued

DT-3

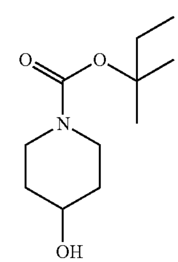

DT-4

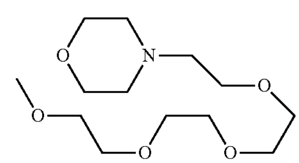

DT-5

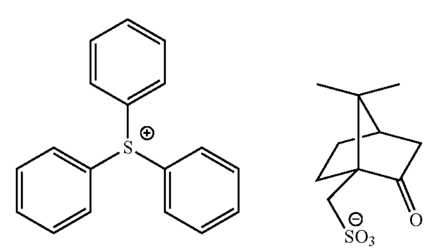

<Surfactant>

As the surfactant shown in Table 4, the surfactant H-3 was used.

<Solvent>

The solvents shown in Table 4 are shown below.

FT-1: 4-Methyl-2-pentanol (MIBC)

FT-2: n-Decane

FT-3: Diisoamyl ether

[Preparation of Topcoat Composition]

The respective components shown in Table 4 were mixed so that the concentration of solid contents was 3% by mass, and then the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to prepare a topcoat composition. Furthermore, the concentration of solid contents means all the components excluding the solvent. The obtained topcoat composition was used in Examples 4, 13, 19, 24, 38, 47, 53, and 58.

The obtained 1:1 line-and-space pattern having a line width of 45 nm was observed from above the pattern, using a length-measuring scanning electron microscope (SEM (Hitachi, Ltd., S-9380II)). The line width of the pattern was observed at any points (100 points), and a measurement deviation thereof was evaluated with 3б (nm) and taken as an LWR.

Next, instead of the composition immediately after the preparation thereof, which had been used above, a composition after being left in an environment of 4° C. for 3 months after the preparation was used, a negative tone pattern was obtained according to the same procedure as above and the LWR was measured according to the same procedure as described above.

Then, the LWR fluctuation rate (%) in a case where the composition after being left in an environment of 4° C. for 3 months by Expression (IA) was used was determined, and evaluated based on the following evaluation standard.

TABLE 5

| Topcoat | Resin | | Additive | | Surfactant | | Solvent | |
|---|---|---|---|---|---|---|---|---|
| composition | Type | Mass [g] | Type | Mass [g] | Type | Mass [g] | Type | Mixing ratio (mass) |
| TC-1 | PT-1 | 10 | DT-1/DT-2 | 1.3/0.06 | | | FT-1/FT-2 | 70/30 |
| TC-2 | PT-2 | 10 | DT-3/DT-4 | 0.04/0.06 | H-3 | 0.005 | FT-1/FT-3 | 75/25 |
| TC-3 | PT-3 | 10 | DT-5 | 0.05 | | | FT-1/FT-3 | 10/90 |

LWR fluctuation rate (%)={|(LWR (nm) of a pattern using a composition after being left in an environment of 4° C. for 3 months−LWR (nm) of a pattern using a composition immediately after production)|/LWR (nm) of the pattern using the composition immediately after production}×100 Expression (IA):

(Evaluation Standard)

S: The LWR fluctuation rate is less than 1%

A: The LWR fluctuation rate is 1% or more and less than 1.5%

B: The LWR fluctuation rate is 1.5% or more and less than 2%

C: The LWR fluctuation rate is 2% or more and less than 2.5%

D: The LWR fluctuation rate is 2.5% or more and less than 3%

E: The LWR fluctuation rate is 3% or more and less than 4%

F: The LWR fluctuation rate is 4% or more

The obtained results are shown in Table 5.

[Evaluation Test]

Using the composition and the topcoat composition prepared as described above, the line width roughness (LWR) as roughness performance after a lapse of time of a pattern developed under each of the following conditions was evaluated.

Examples 1 to 34 and Comparative Examples 1 to 4

<ArF Immersion Exposure and Organic Solvent Development>

(Pattern Formation)

A composition for forming an organic antireflection film, ARC29SR (manufactured by Brewer Science, Inc.), was applied onto a silicon wafer and baked at 205° C. for 60 seconds to form an antireflection film having a film thickness of 98 nm. According to Table 6, the composition immediately after the preparation thereof, shown in Table 3, was applied thereon and baked at 100° C. for 60 seconds to form a resist film (actinic ray-sensitive or radiation-sensitive film) having a film thickness of 90 nm.

Furthermore, in Examples 4, Example 13, Example 19, and Example 24, a topcoat film was formed on the upper layer of the resist film (the types of topcoat compositions used are shown in Table 4). The film thickness of the topcoat film was 100 nm in any case.

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.850, Y deflection). Ultrapure water was used as the immersion liquid.

The resist film after the exposure was baked at 90° C. for 60 seconds, developed with n-butyl acetate for 30 seconds, and then rinsed with 4-methyl-2-pentanol for 30 seconds. Then, the film was spin-dried to obtain a negative tone pattern.

TABLE 6

| Table 5 | Compound No. | Topcoat composition | LWR fluctuation rate |
|---|---|---|---|
| Example 1 | Composition 1 | — | S |
| Example 2 | Composition 2 | — | S |
| Example 3 | Composition 3 | — | S |
| Example 4 | Composition 4 | TC-1 | S |
| Example 5 | Composition 5 | — | B |
| Example 6 | Composition 6 | — | C |
| Example 7 | Composition 7 | — | A |
| Example 8 | Composition 8 | — | D |
| Example 9 | Composition 9 | — | E |
| Example 10 | Composition 10 | — | D |
| Example 11 | Composition 11 | — | B |
| Example 12 | Composition 12 | — | C |
| Example 13 | Composition 13 | TC-2 | B |

TABLE 6-continued

| Table 5 | Compound No. | Topcoat composition | LWR fluctuation rate |
|---|---|---|---|
| Example 14 | Composition 14 | — | B |
| Example 15 | Composition 15 | — | S |
| Example 16 | Composition 16 | — | S |
| Example 17 | Composition 17 | — | S |
| Example 18 | Composition 18 | — | S |
| Example 19 | Composition 19 | TC-3 | S |
| Example 20 | Composition 20 | — | S |
| Example 21 | Composition 21 | — | S |
| Example 22 | Composition 22 | — | C |
| Example 23 | Composition 23 | — | C |
| Example 24 | Composition 24 | TC-1 | A |
| Example 25 | Composition 25 | — | A |
| Example 26 | Composition 26 | — | A |
| Example 27 | Composition 27 | — | A |
| Example 28 | Composition 28 | — | B |
| Example 29 | Composition 29 | — | D |
| Example 30 | Composition 30 | — | A |
| Example 31 | Composition 31 | — | A |
| Example 32 | Composition 32 | — | S |
| Example 33 | Composition 33 | — | S |
| Example 34 | Composition 34 | — | S |
| Comparative Example 1 | Composition 35 | — | F |
| Comparative Example 2 | Composition 36 | — | F |
| Comparative Example 3 | Composition 37 | — | F |
| Comparative Example 4 | Composition 38 | — | F |

From the results shown in Table 5, it was confirmed that the pattern obtained by the composition of the embodiment of the present invention had excellent roughness performance after a lapse of time.

Examples 35 to 68 and Comparative Examples 5 to 8

<ArF Immersion Exposure and Alkali Development>
(Pattern Formation)

A composition for forming an organic antireflection film, ARC29SR (manufactured by Brewer Science, Inc.), was applied onto a silicon wafer and baked at 205° C. for 60 seconds to form an antireflection film having a film thickness of 98 nm. According to Table 7, the composition immediately after the preparation thereof, shown in Table 3, was applied thereon and baked at 100° C. for 60 seconds to form a resist film having a film thickness of 90 nm. In Example 38, Example 47, Example 53, and Example 58, a topcoat film was formed on the upper layer of the resist film (the types of the topcoat compositions used are shown in Table 4). The film thickness of the topcoat film was 100 nm in any case.

The resist film was exposed through a 6% halftone mask having a 1:1 line-and-space pattern with a line width of 45 nm, using an ArF excimer laser liquid immersion scanner (XT1700i, manufactured by ASML, NA 1.20, Dipole, outer sigma: 0.950, inner sigma: 0.890, Y deflection). Ultrapure water was used as the immersion liquid.

The resist film after the exposure was baked at 90° C. for 60 seconds, developed with an aqueous tetramethylammonium hydroxide solution (2.38% by mass) for 30 seconds, and then rinsed with pure water for 30 seconds. Thereafter, the resist film was spin-dried to obtain a positive tone pattern.

The obtained 1:1 line-and-space pattern having a line width of 45 nm was observed from above the pattern, using a length-measuring scanning electron microscope (SEM (Hitachi, Ltd., S-9380II)). The line width of the pattern was observed at any points (100 points), and a measurement deviation thereof was evaluated with 36 (nm) and taken as an LWR.

Next, instead of the composition immediately after the preparation thereof used above, a composition after being left in an environment of 4° C. for 3 months after the preparation was used, a positive tone pattern was obtained according to the same procedure as above, and the LWR was measured according to the same procedure as described above.

Then, the LWR fluctuation rate (%) in a case where the composition after being left in an environment of 4° C. for 3 months by Expression (IA) in <ArF Immersion Exposure, Organic Solvent Development> above was used was determined, and evaluated based on the following evaluation standard.

The obtained results are shown in Table 6.

TABLE 7

| Table 6 | Compound No. | Topcoat composition | LWR fluctuation rate |
|---|---|---|---|
| Example 35 | Composition 1 | — | S |
| Example 36 | Composition 2 | — | S |
| Example 37 | Composition 3 | — | S |
| Example 38 | Composition 4 | TC-1 | S |
| Example 39 | Composition 5 | — | B |
| Example 40 | Composition 6 | — | C |
| Example 41 | Composition 7 | — | A |
| Example 42 | Composition 8 | — | D |
| Example 43 | Composition 9 | — | E |
| Example 44 | Composition 10 | — | D |
| Example 45 | Composition 11 | — | B |
| Example 46 | Composition 12 | — | C |
| Example 47 | Composition 13 | TC-2 | B |
| Example 48 | Composition 14 | — | B |
| Example 49 | Composition 15 | — | S |
| Example 50 | Composition 16 | — | S |
| Example 51 | Composition 17 | — | S |
| Example 52 | Composition 18 | — | S |
| Example 53 | Composition 19 | TC-3 | S |
| Example 54 | Composition 20 | — | S |
| Example 55 | Composition 21 | — | S |
| Example 56 | Composition 22 | — | C |
| Example 57 | Composition 23 | — | C |
| Example 58 | Composition 24 | TC-1 | A |
| Example 59 | Composition 25 | — | A |
| Example 60 | Composition 26 | — | A |
| Example 61 | Composition 27 | — | A |
| Example 62 | Composition 28 | — | B |
| Example 63 | Composition 29 | — | D |
| Example 64 | Composition 30 | — | A |
| Example 65 | Composition 31 | — | A |
| Example 66 | Composition 32 | — | S |
| Example 67 | Composition 33 | — | S |
| Example 68 | Composition 34 | — | S |
| Comparative Example 5 | Composition 35 | — | F |
| Comparative Example 6 | Composition 36 | — | F |
| Comparative Example 7 | Composition 37 | — | F |
| Comparative Example 8 | Composition 38 | — | F |

From the results shown in Table 6, it was confirmed that the pattern obtained by the composition of the embodiment of the present invention had excellent roughness performance after a lapse of time.

According to the present invention, it is possible to provide an actinic ray-sensitive or radiation-sensitive resin composition by which a pattern having excellent LWR performance after a lapse of time can be obtained.

In addition, according to the present invention, it is possible to provide an actinic ray-sensitive or radiation-sensitive film, a pattern forming method, a method for manufacturing an electronic device, and a compound, each relating to the actinic ray-sensitive or radiation-sensitive resin composition.

Although the present invention has been described in detail with reference to specific embodiments, it will be apparent to those skilled in the art that various changes and modifications can be made without departing from the spirit and the scope of the present invention.

What is claimed is:

1. A compound represented by General Formula (IA-1), wherein a carbon anion group represented by Formula (A) is a group represented by any of General Formulae (a-1), (a-2), and (a-5) to (a-9), (IA-1)

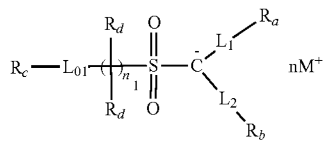

in General Formula (IA-1), $R_a$ and $R_b$ each independently represent a hydrogen atom or a substituent, provided that $R_a$ and $R_b$ satisfy the following requirement (1) or (2);

(1) at least one of $R_a$ or $R_b$ represents a secondary alkyl group, a tertiary alkyl group, a cycloalkyl group, or a perfluoroalkyl group, and $R_a$ and $R_b$ may be bonded to each other to form a ring, and (2) $R_a$ and $R_b$ are bonded to each other to form a ring, $R_c$ represents a substituent, $L_{01}$ represents a single bond or a divalent linking group, $L_1$ represents a single bond or a divalent linking group, $L_2$ represents a single bond or a divalent linking group, $nM^+$ represents an organic cationic moiety, n represents an integer of 1 or more, $R_d$'s each independently represent a hydrogen atom, a fluorine atom, or an alkyl fluoride group, and $n_1$ represents an integer of 1 to 5, (A)

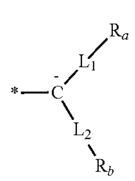

in Formula (A),

* represents a bonding position, (a-1)

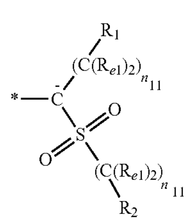

-continued (a-2)

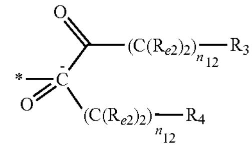

(a-5)

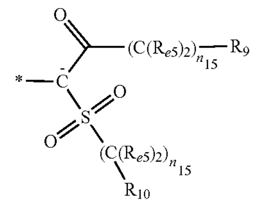

(a-6)

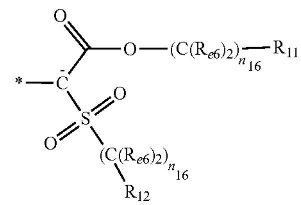

(a-7)

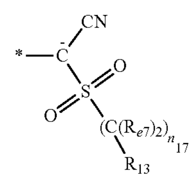

(a-8)

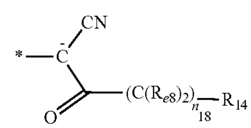

(a-9)

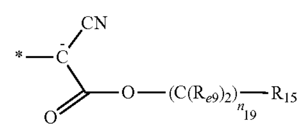

in General Formula (a-1), $R_1$ and $R_2$ each independently represent a hydrogen atom, a secondary alkyl group, a tertiary alkyl group, or a cycloalkyl group, provided that $R_1$ and $R_2$ satisfy the following requirement (1A) or (1B):

(1A) at least one of $R_1$ or $R_2$ represents a secondary alkyl group, a tertiary alkyl group, or a cycloalkyl group, and $R_1$ and $R_2$ may be bonded to each other to form a ring, and (1B) $R_1$ and $R_2$ are bonded to each other to form a ring, $R_{e1}$'s each independently represent a hydrogen atom, a fluorine atom, or an alkyl fluoride group, and $n_{11}$'s each independently represent 0, 1, or 2, in General Formula (a-2), $R_3$ and $R_4$ each independently represent a hydrogen atom or a substituent, provided that $R_3$ and $R_4$ satisfy the following requirement (2A) or (2B):

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring, and (2B) $R_3$ and $R_4$ are bonded to each other to form a ring, $R_{e2}$'s each independently represent a hydrogen atom, a fluorine atom, or an alkyl fluoride group, and $n_{12}$'s each independently represent 0, 1, or 2, in General Formula (a-5), $R_9$ and $R_{10}$ each independently represent a hydrogen atom or a substituent, provided that $R_9$ and $R_{10}$ satisfy the following requirement (5A) or (5B):

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring, and (5B) $R_9$ and $R_{10}$ are bonded to each other to form a ring, $R_{e5}$'s each independently represent a hydrogen atom, a fluorine atom, or an alkyl fluoride group, and $n_{15}$'s each independently represent 0, 1, or 2, in General Formula (a-6), $R_{11}$ and $R_{12}$ each independently represent a hydrogen atom or a substituent, provided that $R_{11}$ and $R_{12}$ satisfy the following requirement (6A) or (6B):

(6A) at least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring, and (6B) $R_{11}$ and $R_{12}$ are bonded to each other to form a ring, $R_{e6}$'s each independently represent a hydrogen atom, a fluorine atom, or an alkyl fluoride group, and $n_{16}$'s each independently represent 0, 1, or 2, in General Formula (a-7), $R_{13}$ represents a secondary alkyl group, a tertiary alkyl group, a cycloalkyl group, or a perfluoroalkyl group, $R_{e7}$'s each independently represent a hydrogen atom, a fluorine atom, or an alkyl fluoride group, and $n_{17}$ represents 0, 1, or 2, in General Formula (a-8), $R_{14}$ represents a secondary alkyl group, a tertiary alkyl group, a cycloalkyl group, or a perfluoroalkyl group, $R_{e8}$'s each independently represent a hydrogen atom, a fluorine atom, or an alkyl fluoride group, and $n_{18}$ represents 0, 1, or 2, in General Formula (a-9), $R_{15}$ represents a secondary alkyl group, a tertiary alkyl group, a cycloalkyl group, or a perfluoroalkyl group, $R_{e9}$'s each independently represent a hydrogen atom, a fluorine atom, or an alkyl fluoride group, and $n_{19}$ represents 0, 1, or 2, and in General Formulae (a-1), (a-2), and (a-5) to (a-9),

* represents a bonding position.

2. An actinic ray-sensitive or radiation-sensitive resin composition comprising the compound of claim 1 and an acid decomposable resin.

3. The actinic ray-sensitive or radiation-sensitive resin composition according to claim 1, wherein the compound represented by General Formula (IA-1) has at least one fluorine atom.

4. The actinic ray-sensitive or radiation-sensitive resin composition according to claim 2, wherein in General Formula (a-1), $n_{11}$'s each independently represent 0 or 1, in General Formula (a-2), $n_{12}$'s each independently represent 0 or 1, in General Formula (a-5), $n_{15}$'s each independently represent 0 or 1, in General Formula (a-6), $n_{16}$'s each independently represent 0 or 1, in General Formula (a-7), $n_{17}$'s each independently represent 0 or 1, in General Formula (a-8), $n_{18}$'s each independently represent 0 or 1, and in General Formula (a-9), $n_{19}$'s each independently represent 0 or 1.

5. The actinic ray-sensitive or radiation-sensitive resin composition according to claim 1, wherein in (1A) in General Formula (a-1), $R_1$ and $R_2$ each independently represent a secondary alkyl group, a tertiary alkyl group, or a cycloalkyl group, and $R_1$ and $R_2$ may be bonded to each other to form a ring, in (2A) in General Formula (a-2), $R_3$ and $R_4$ each independently represent a secondary alkyl group, a tertiary alkyl group, a cycloalkyl group, or a perfluoroalkyl group, and $R_3$ and $R_4$ may be bonded to each other to form a ring, in (5A) in General Formula (a-5), $R_9$ and $R_{10}$ each independently represent a secondary alkyl group, a tertiary alkyl group, a cycloalkyl group, or a perfluoroalkyl group, and $R_9$ and $R_{10}$ may be bonded to each other to form a ring, and in (6A) in General Formula (a-6), $R_{11}$ and $R_{12}$ each independently represent a secondary alkyl group, a tertiary alkyl group, a cycloalkyl group, or a perfluoroalkyl group, and $R_{11}$ and $R_{12}$ may be bonded to each other to form a ring.

6. The actinic ray-sensitive or radiation-sensitive resin composition according to claim 2, wherein the carbon anion group represented by Formula (A) in the compound represented by General Formula (IA-1) is the group represented by General Formula (a-1) or (a-2).

7. The actinic ray-sensitive or radiation-sensitive resin composition according to claim 2, wherein $R_c$ in the compound represented by General Formula (1-1-1) (IA-1) represents an alkyl group, a cycloalkyl group, an aryl group, or a fluorine atom.

8. An actinic ray-sensitive or radiation-sensitive film formed of the actinic ray-sensitive or radiation-sensitive resin composition according to claim 1.

9. A pattern forming method comprising:

forming an actinic ray-sensitive or radiation-sensitive film on a support, using the actinic ray-sensitive or radiation-sensitive resin composition according to claim 2;

exposing the actinic ray-sensitive or radiation-sensitive film; and developing the exposed actinic ray-sensitive or radiation-sensitive film, using a developer.

10. A method for manufacturing an electronic device, comprising the pattern forming method according to claim 9.

11. The compound according to claim 1, wherein $R_c$ in the compound represents an alkyl group, a cycloalkyl group, an aryl group, or a fluorine atom.

12. A compound represented by General Formula (IA), wherein a carbon anion group represented by Formula (A) is a group represented by any of General Formulae (a-1), (a-2), and (a-5) to (a-9), (IA)

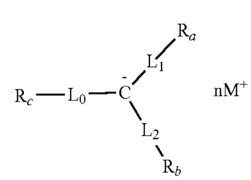

in General Formula (IA), $R_a$ and $R_b$ each independently represent a hydrogen atom or a substituent, provided that $R_a$ and $R_b$ satisfy the following requirement (1) or (2):

(1) at least one of $R_a$ or $R_b$ represents a secondary alkyl group, a tertiary alkyl group, a cycloalkyl group, or a perfluoroalkyl group, and $R_a$ and $R_b$ may be bonded to each other to form a ring, and (2) $R_a$ and Rp are bonded to each other to form a ring, $R_c$ represents an anion group, and the anion group is a group represented by any of General Formulae (b-1) to (b-9) below, $L_0$ represents a single bond or a divalent linking group, $L_1$ represents a single bond or a divalent linking group, $L_2$ represents a single bond or a divalent linking group, $nM^+$ represents an organic cationic moiety, and n represents an integer of 1 or more, (A)

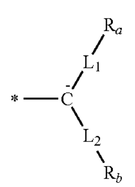

in Formula (A),

* represents a bonding position, (a-1)

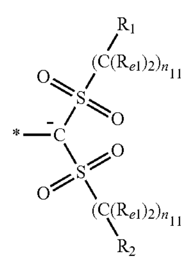

(a-2)

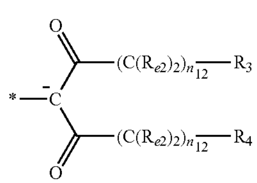

(a-5)

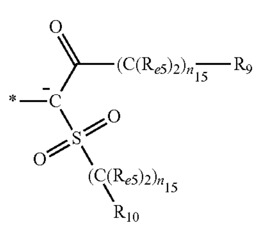

-continued (a-6)

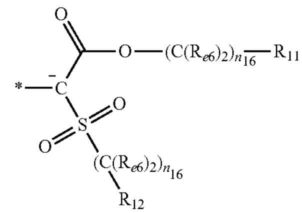

(a-7)

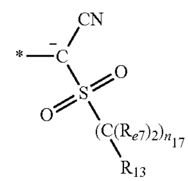

(a-8)

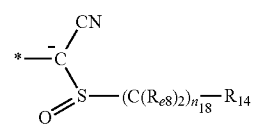

(a-9)

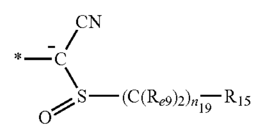

in General Formula (a-1), $R_1$ and $R_2$ each independently represent a hydrogen atom, a secondary alkyl group, a tertiary alkyl group, or a cycloalkyl group, provided that $R_1$ and $R_2$ satisfy the following requirement (1A) or (1B):

(1A) at least one of $R_1$ or $R_2$ represents a secondary alkyl group, a tertiary alkyl group, or a cycloalkyl group, and $R_1$ and $R_2$ may be bonded to each other to form a ring, and (1B) $R_1$ and $R_2$ are bonded to each other to form a ring, $R_{e1}$'s each independently represent a hydrogen atom, a fluorine atom, or an alkyl fluoride group, and $n_{11}$'s each independently represent 0, 1, or 2, in General Formula (a-2), $R_3$ and $R_4$ each independently represent a hydrogen atom or a substituent, provided that $R_3$ and $R_4$ satisfy the following requirement (2A) or (2B):

(2A) At least one of $R_3$ or $R_4$ represents a secondary alkyl group, a tertiary alkyl group, a cycloalkyl group, or a perfluoroalkyl group, and $R_3$ and $R_4$ may be bonded to each other to form a ring, and (2B) $R_3$ and $R_4$ are bonded to each other to form a ring, $R_{e2}$'s each independently represent a hydrogen atom, a fluorine atom, or an alkyl fluoride group, and $n_{12}$'s each independently represent 0, 1, or 2, in General Formula (a-5), $R_9$ and $R_{10}$ each independently represent a hydrogen atom or a substituent, provided that Ry and $R_{10}$ satisfy the following requirement (5A) or (5B):

(5A) At least one of $R_9$ or $R_{10}$ represents a secondary alkyl group, a tertiary alkyl group, a cycloalkyl group, or a perfluoroalkyl group, and $R_9$ and $R_{10}$ may be bonded to each other to form a ring, and (5B) $R_9$ and $R_{10}$ are bonded to each other to form a ring, $R_{e5}$'s each independently represent a hydrogen atom, a fluorine atom, or an alkyl fluoride group, and $n_{15}$'s each independently represent 0, 1, or 2, in General Formula (a-6), $R_{11}$ and $R_{12}$ each independently represent a hydrogen atom or a substituent, provided that $R_{11}$ and $R_{12}$ satisfy the following requirement (6A) or (6B):

(6A) at least one of $R_{11}$ or $R_{12}$ represents a secondary alkyl group, a tertiary alkyl group, a cycloalkyl group, or a perfluoroalkyl group, and $R_{11}$ and $R_{12}$ may be bonded to each other to form a ring, and (6B) $R_{11}$ and $R_{12}$ are bonded to each other to form a ring, $R_{e6}$'s each independently represent a hydrogen atom, a fluorine atom, or an alkyl fluoride group, and $n_{16}$'s each independently represent 0, 1, or 2, in General Formula (a-7), $R_{13}$ represents a secondary alkyl group, a tertiary alkyl group, a cycloalkyl group, or a perfluoroalkyl group, $R_{e7}$'s each independently represent a hydrogen atom, a fluorine atom, or an alkyl fluoride group, and $n_{17}$ represents 0, 1, or 2, in General Formula (a-8), $R_{14}$ represents a secondary alkyl group, a tertiary alkyl group, a cycloalkyl group, or a perfluoroalkyl group, $R_{e8}$'s each independently represent a hydrogen atom, a fluorine atom, or an alkyl fluoride group, and $n_{18}$ represents 0, 1, or 2, in General Formula (a-9), $R_{15}$ represents a secondary alkyl group, a tertiary alkyl group, a cycloalkyl group, or a perfluoroalkyl group, $R_{e9}$'s each independently represent a hydrogen atom, a fluorine atom, or an alkyl fluoride group, and $n_{19}$ represents 0, 1, or 2, and in General Formulae (a-1), (a-2) and (a-5) to (a-9),

* represents a bonding position (b-1)

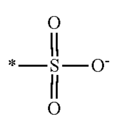

(b-2)

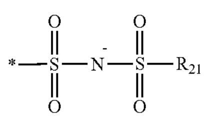

(b-3)

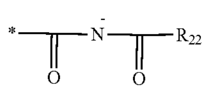

-continued (b-4)

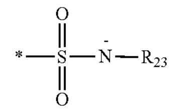

(b-5)

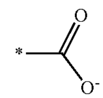

(b-6)

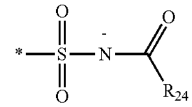

(b-7)

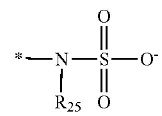

(b-8)

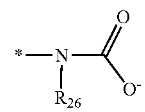

(b-9)

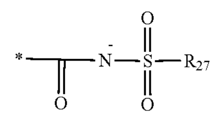

in General Formula (b-2), $R_{21}$ represents a substituent, in General Formula (b-3), $R_{22}$ represents a substituent, in General Formula (b-4), $R_{23}$ represents a substituent, in General Formula (b-6), $R_{24}$ represents a substituent, in General Formula (b-7), $R_{25}$ represents a substituent, in General Formula (b-8), $R_{26}$ represents a substituent, in General Formula (b-9), $R_{27}$ represents a substituent, and in General Formulae (b-1) to (b-9),

* represents a bonding position.

* * * * *